(12) United States Patent
Diekmann et al.

(10) Patent No.: US 8,328,375 B2
(45) Date of Patent: Dec. 11, 2012

(54) ORGANIC LIGHTING DEVICE AND LIGHTING EQUIPMENT

(75) Inventors: Karsten Diekmann, Rattenberg (DE); Karsten Heuser, Erlangen (DE); Markus Klein, Tegernheim (DE); Dieter Lang, Bruckmühl (DE); Georg Lechermann, Penzberg (DE); Michael Reithmeier, Eichenau (DE); Carsten Plumeyer, Martinsried (DE); Makarand Chipalkatti, Lexington, MA (US); Udo Custodis, Honk Kong (CN); Diane Seymour, Towanda, PA (US); Dmytro Poplavskyy, San Jose, CA (US)

(73) Assignees: Osram Opto Semiconductors GmbH, Regensburg (DE); Osram Sylvania Inc., Danvers, MA (US)

( * ) Notice: Subject to any disclaimer, the term of this patent is extended or adjusted under 35 U.S.C. 154(b) by 622 days.

(21) Appl. No.: 12/443,672

(22) PCT Filed: Sep. 26, 2007

(86) PCT No.: PCT/DE2007/001744
§ 371 (c)(1),
(2), (4) Date: Jan. 11, 2010

(87) PCT Pub. No.: WO2008/040323
PCT Pub. Date: Apr. 10, 2008

(65) Prior Publication Data
US 2010/0157585 A1    Jun. 24, 2010

(30) Foreign Application Priority Data

Sep. 29, 2006 (DE) .................. 10 2006 046 198
Sep. 29, 2006 (DE) .................. 10 2006 046 293
Nov. 20, 2006 (DE) .................. 10 2006 054 584
Dec. 21, 2006 (DE) .................. 10 2006 060 781

(51) Int. Cl.
*F21V 9/16* (2006.01)
(52) U.S. Cl. .................. 362/84; 362/253; 313/504
(58) Field of Classification Search .................. 313/504; 362/84, 228, 253, 97.3
See application file for complete search history.

(56) References Cited

U.S. PATENT DOCUMENTS

| 4,441,745 A | 4/1984 | Nicholas |
| 5,690,415 A | 11/1997 | Krehl |
| 5,856,030 A | 1/1999 | Burrows |

(Continued)

FOREIGN PATENT DOCUMENTS

AT    007 953    11/2005

(Continued)

OTHER PUBLICATIONS

Heise online, "auf dem We zur leuchtenden Tapete", Mar. 10, 2004, recherchiert am Jun. 14, 2007 Im Internet: http//www.heise.de/newsticker/melding/print/45391; ganzer Artikel (1 page).

(Continued)

*Primary Examiner* — Evan Dzierzynski
(74) *Attorney, Agent, or Firm* — Cozen O'Connor

(57) ABSTRACT

An organic luminous means and an illumination device comprising such a luminous means are described. An optical display apparatus, emergency lighting, motor vehicle interior lighting, an item of furniture, a construction material, a glazing and a display comprising such a luminous means and, respectively, comprising an illumination device having such a luminous means are also described.

15 Claims, 57 Drawing Sheets

U.S. PATENT DOCUMENTS

| | | | |
|---|---|---|---|
| 5,984,486 | A | 11/1999 | Munz et al. |
| 6,538,375 | B1 | 3/2003 | Duggal et al. |
| 6,554,443 | B2 | 4/2003 | Fan |
| 6,626,554 | B2 | 9/2003 | Rincover et al. |
| 2002/0063521 | A1* | 5/2002 | Salam ............... 313/512 |
| 2004/0031234 | A1 | 2/2004 | Emde |
| 2004/0160166 | A1 | 8/2004 | Cok |
| 2004/0207315 | A1 | 10/2004 | Robbie |
| 2005/0112403 | A1* | 5/2005 | Ju et al. ............. 428/690 |
| 2005/0141242 | A1* | 6/2005 | Takeuchi ........... 362/600 |
| 2005/0144715 | A1 | 7/2005 | Bassista |
| 2005/0156520 | A1 | 7/2005 | Tanaka et al. |
| 2005/0163992 | A1 | 7/2005 | Canos et al. |
| 2006/0022589 | A1* | 2/2006 | Cok ................... 313/506 |
| 2006/0077651 | A1* | 4/2006 | Yamazaki et al. ..... 362/84 |
| 2006/0138947 | A1* | 6/2006 | MacPherson ........ 313/506 |
| 2006/0152137 | A1 | 7/2006 | Beteille et al. |
| 2007/0109764 | A1 | 5/2007 | Bienick |
| 2007/0115221 | A1 | 5/2007 | Buchhauser et al. |
| 2007/0241668 | A1 | 10/2007 | Ottermann et al. |
| 2008/0203359 | A1 | 8/2008 | Corma Canos et al. |
| 2008/0303416 | A1 | 12/2008 | Fery et al. |

FOREIGN PATENT DOCUMENTS

| | | |
|---|---|---|
| CN | 1263429 | 8/2000 |
| CN | 1645977 | 7/2005 |
| DE | 89 09 067 | 11/1989 |
| DE | 42 35 485 | 4/1994 |
| DE | 298 11 962 | 10/1998 |
| DE | 200 06 275 | 9/2001 |
| DE | 100 37 960 | 2/2002 |
| DE | 101 17 105 | 6/2002 |
| DE | 101 17 203 | 7/2002 |
| DE | 202 14 661 | 1/2003 |
| DE | 102 36 855 | 2/2004 |
| DE | 102 34 560 | 3/2004 |
| DE | 20 2004 001 864 | 7/2004 |
| DE | 20 2004 005 172 | 8/2004 |
| DE | 103 38 490 | 3/2005 |
| DE | 103 53 036 | 6/2005 |
| DE | 10 2004 005 370 | 9/2005 |
| DE | 10 2004 020 245 | 12/2005 |
| DE | 10 2004 026 730 | 12/2005 |
| DE | 10 2004 041 224 | 3/2006 |
| DE | 20 2004 014 556 | 3/2006 |
| DE | 20 2006 002 689 | 5/2006 |
| DE | 20 2006 006 193 | 7/2006 |
| DE | 10 2005 005 422 | 8/2006 |
| DE | 10 2005 005 579 | 8/2006 |
| DE | 20 2006 007 482 | 8/2006 |
| DE | 20 2006 012 661 | 11/2006 |
| DE | 10 2006 046 196 | 4/2008 |
| EP | 1 469 450 | 4/2003 |
| EP | 1 367 677 | 5/2003 |
| EP | 1 367 677 | 12/2003 |
| EP | 1 491 835 | 6/2004 |
| EP | 1 507 114 | 7/2004 |
| FR | 2 879 025 | 12/2004 |
| GB | 2 405 193 | 2/2005 |
| JP | 2001-250420 | 9/2001 |
| JP | 2003-151337 | 5/2003 |
| TW | I247251 | 1/2006 |
| WO | WO 2004/002890 | 1/2004 |
| WO | WO 2004/034483 | 4/2004 |
| WO | WO 2004/048445 | 6/2004 |
| WO | WO 2006/045875 | 5/2006 |

OTHER PUBLICATIONS

OLED at online, "Intelligente Fenster leuchten im Dunkeln", 2005, recherchiert am Jun. 14, 2007 Im Internet: http//www.oled.at/archive/intellig ente-oled-technik,htm; ganzer Artikel (1 page).

Haslinger, M., "Neue Displays and Leuchtflächen auf Basis von OLEDs", Ertinderaktivitäten, 2003, DPMA, 2004, S 45-50; ganzer Artikel (8 pages).

Laquai, F., "Präparation organischer Leuchtdioden in der Schule", Jun. 1, 2998, (online), recherchiert am Apr. 18, 2007 Im Internet: http//www.kkgwhv.schule.kwe.de/kkg_chem./ag_allg/oled/ledfr ame.htm; Fig. 1 m.Beschr (7 pages).

Webelsiep, D., "OLED—Der Bildschirm der Zukunft?", Seminararbeit zum Seminar Allgemeine Informatik SS 2003, Stand 22. Apr. 2003, online, recherchiert am Jun. 14, 2007 Im Internet: http//www.webelsiep.de/downloads/stadium/Projekte/oled.pdf; Abb. 4,7,22,23,25,26 (26 pages).

Heise online, "auf dem Weg zur leuchtenden Tapete", Mar. 10, 2004, recherchiert am Jun. 14, 2007 Im Internet: http://www.heise.de/newsticker/melding/print/45391; ganzer Artikel (1 page).

OLED at online, "Intelligente Fenster leuchten im Dunkeln", 2005, recherchiert am Jun. 14, 2007 Im Internet: http://www.oled.at/archive/intelligente-oled-technik.htm; ganzer Artikel (1page).

Haslinger, M., "Neue Displays and Leuchtflächen auf Basis von OLEDs", Erfinderaktivitäten, 2003, DPMA, 2004, S 45-50; ganzer Artikel (8 pages).

Laquai, F., "Präparation organischer Leuchtdioden in der Schule", Jun. 1, 1998, (online), recherchiert am Apr. 18, 2007 Im Internet: http:/www.kkgwhv-schule.kwe.de/kkg_chem/ag_allg/oled/oled. htm; Fig. 1 m.Beschr (7 pages).

Webelsiep, D., "OLED—Der Bildschirm de Zukunft?", Seminararbeit zum Seminar Allgemeine Informatik SS 2003, Stand 22. Apr. 2003, online, recherchiert am Jun. 14, 2007 Im Internet: http://www.webelsiep.de/downloads/studium/Projekte/oled.pdf; Abb. 4,7,22,23,25,26, (26 pages).

Buchhauser, D. et al., "Characteration of White-Emitting Copolymers for PLED-Displays", Proc. of SPIE, vol. 5519, 2004 (12 pages).

* cited by examiner

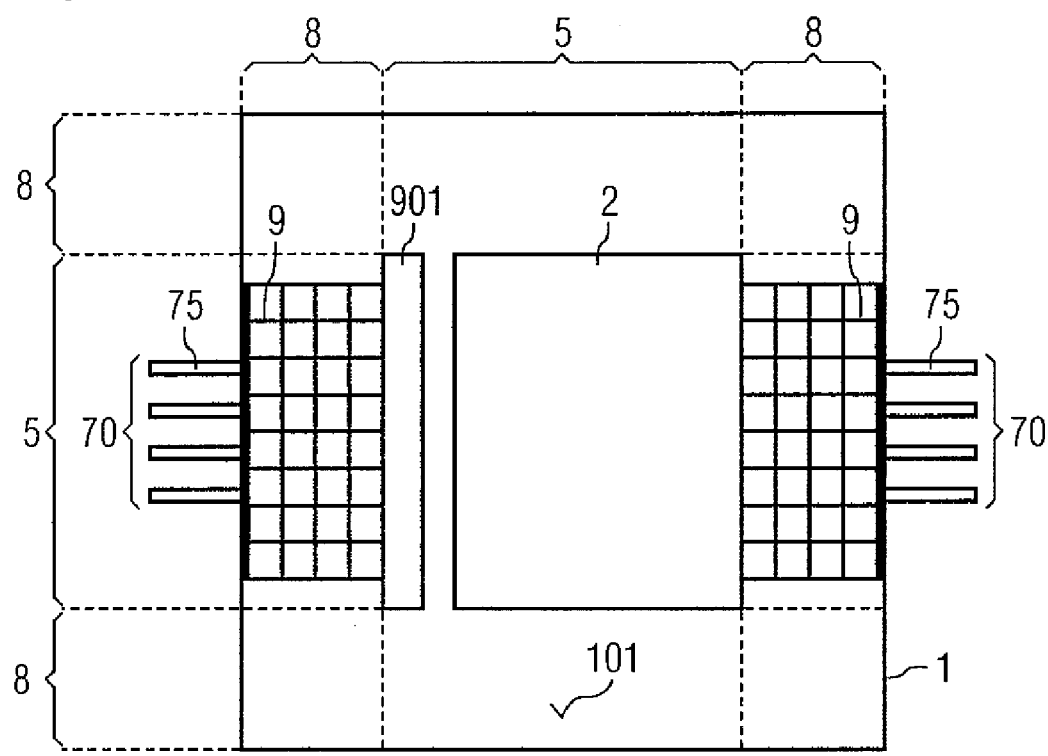

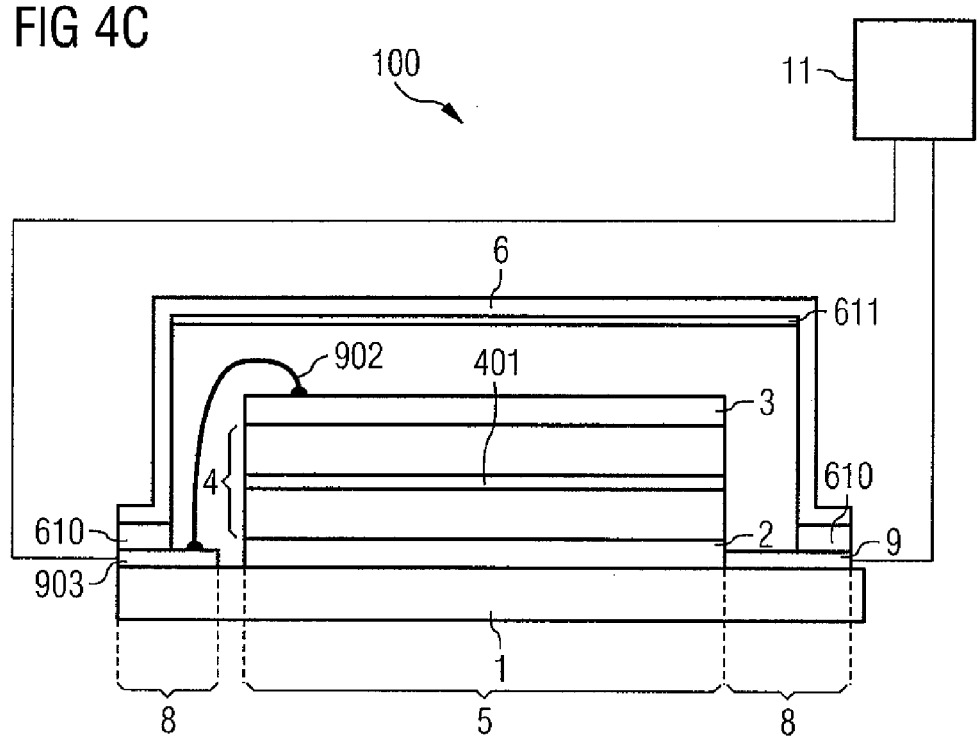

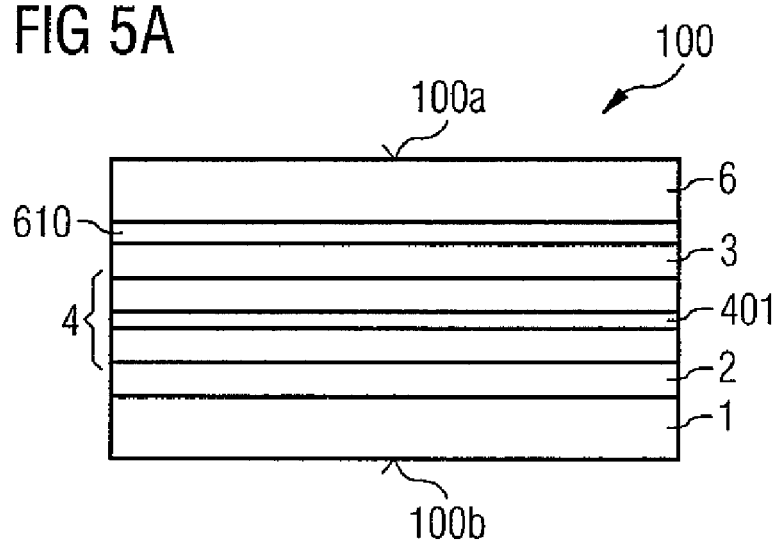
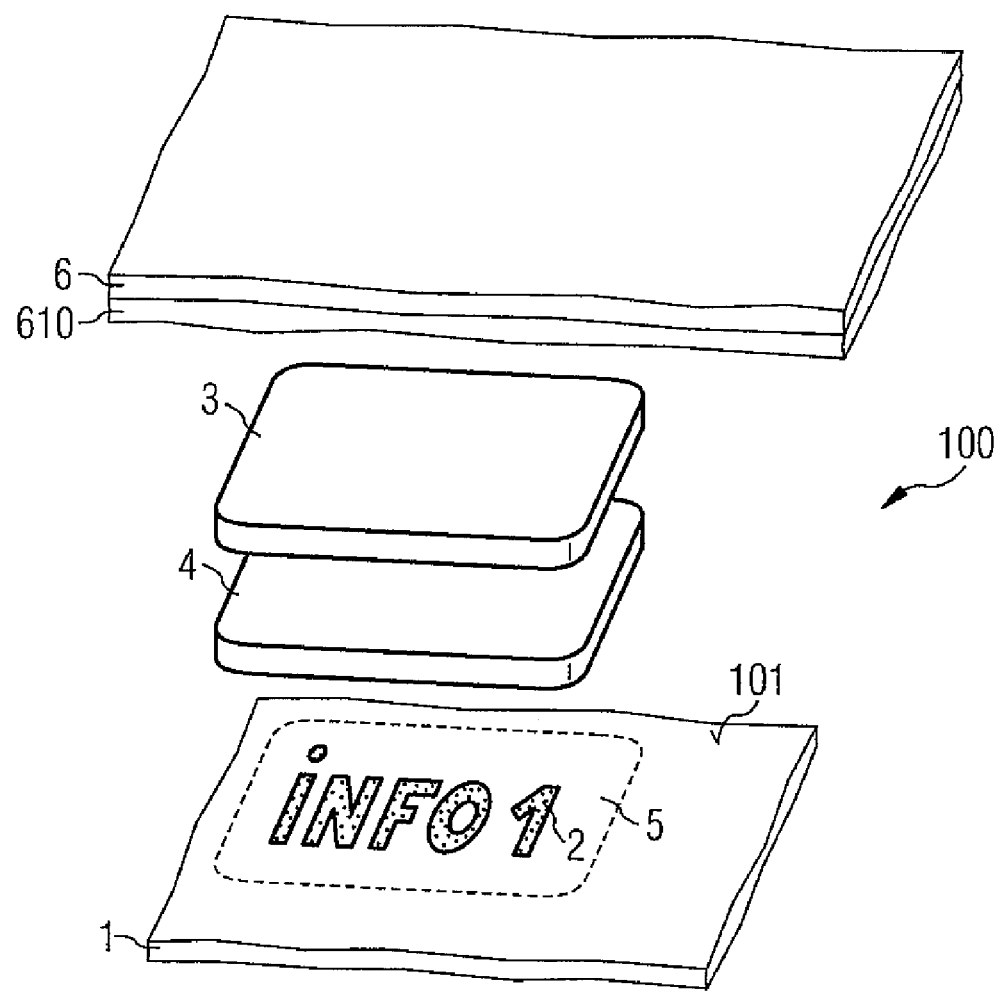

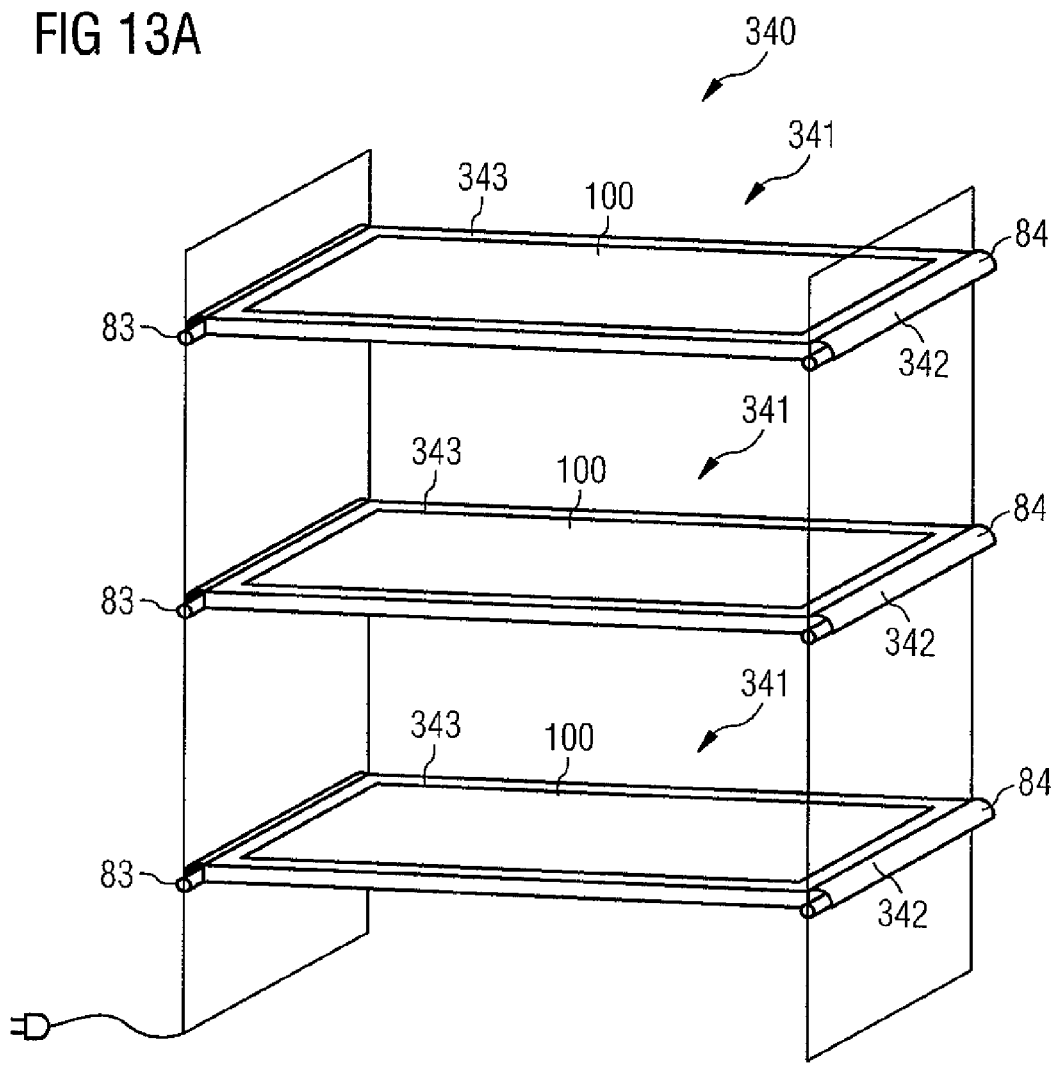

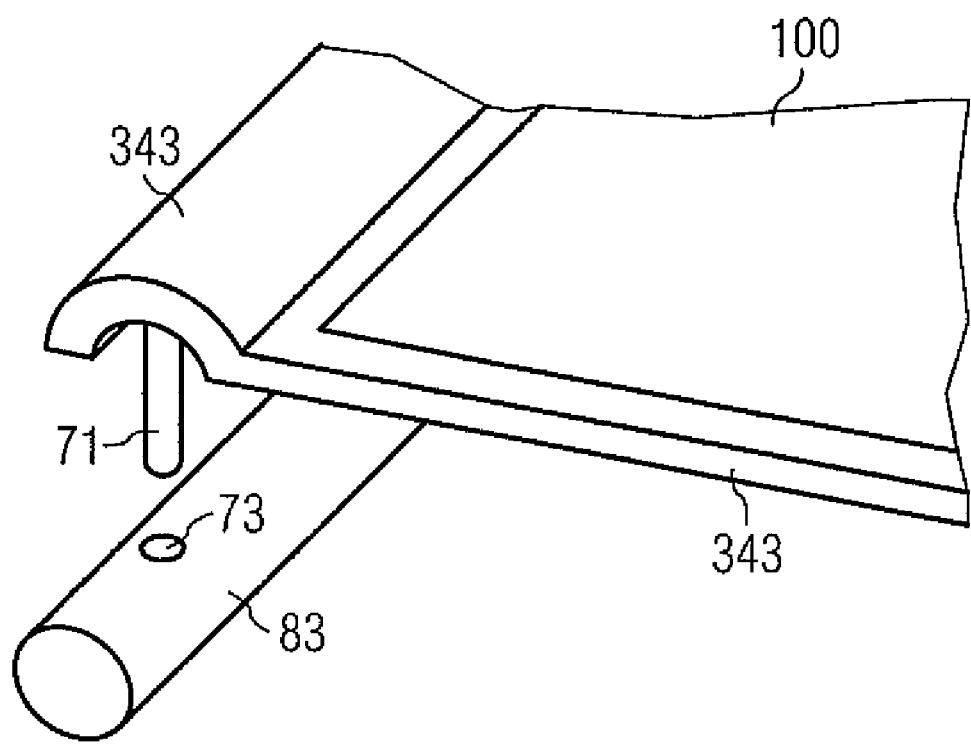

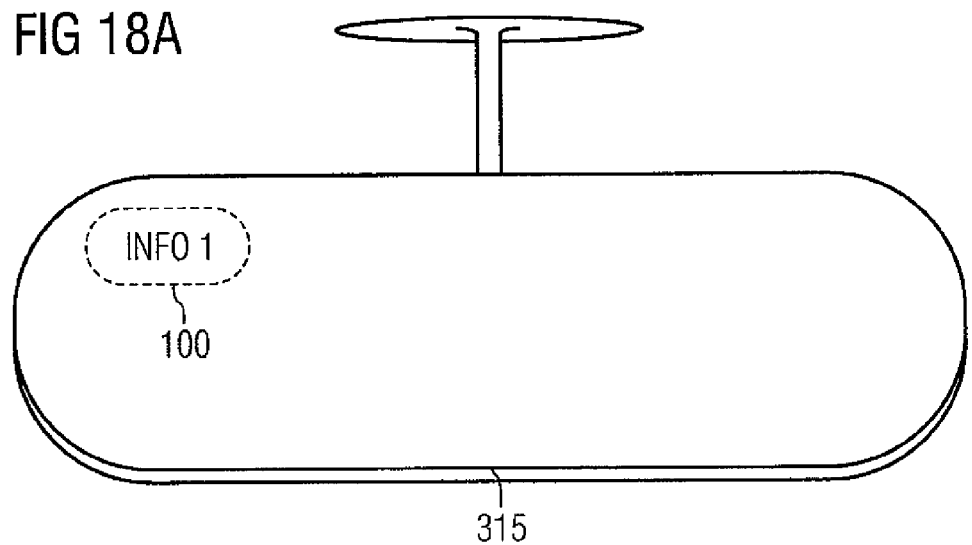
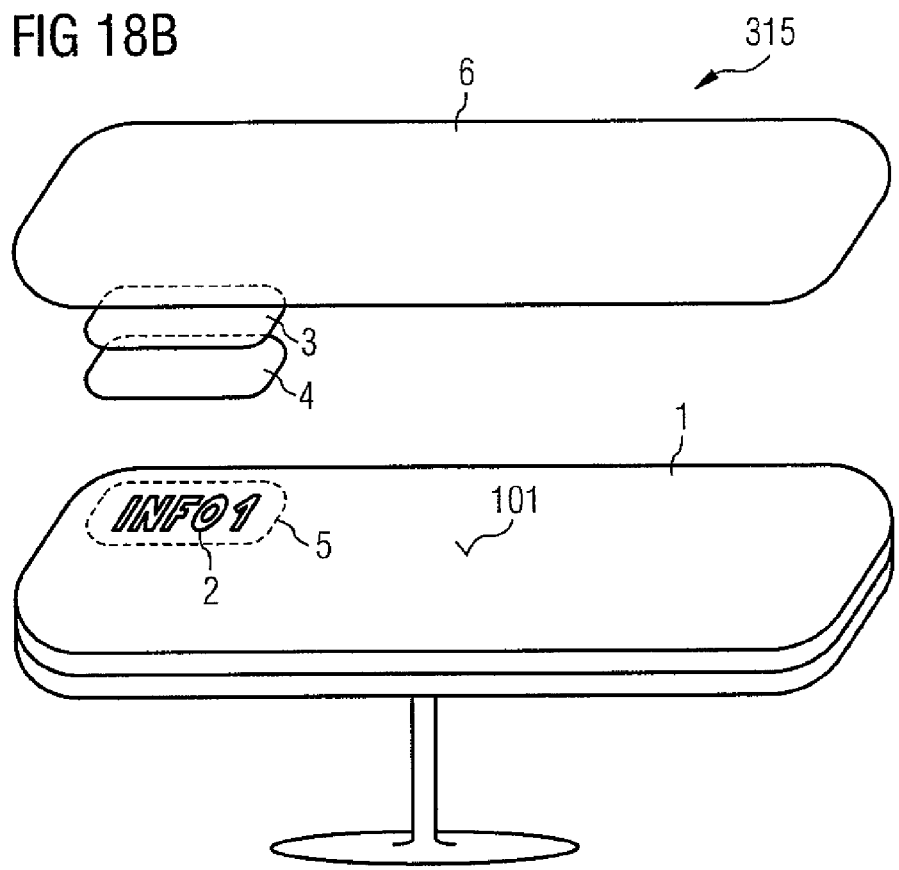

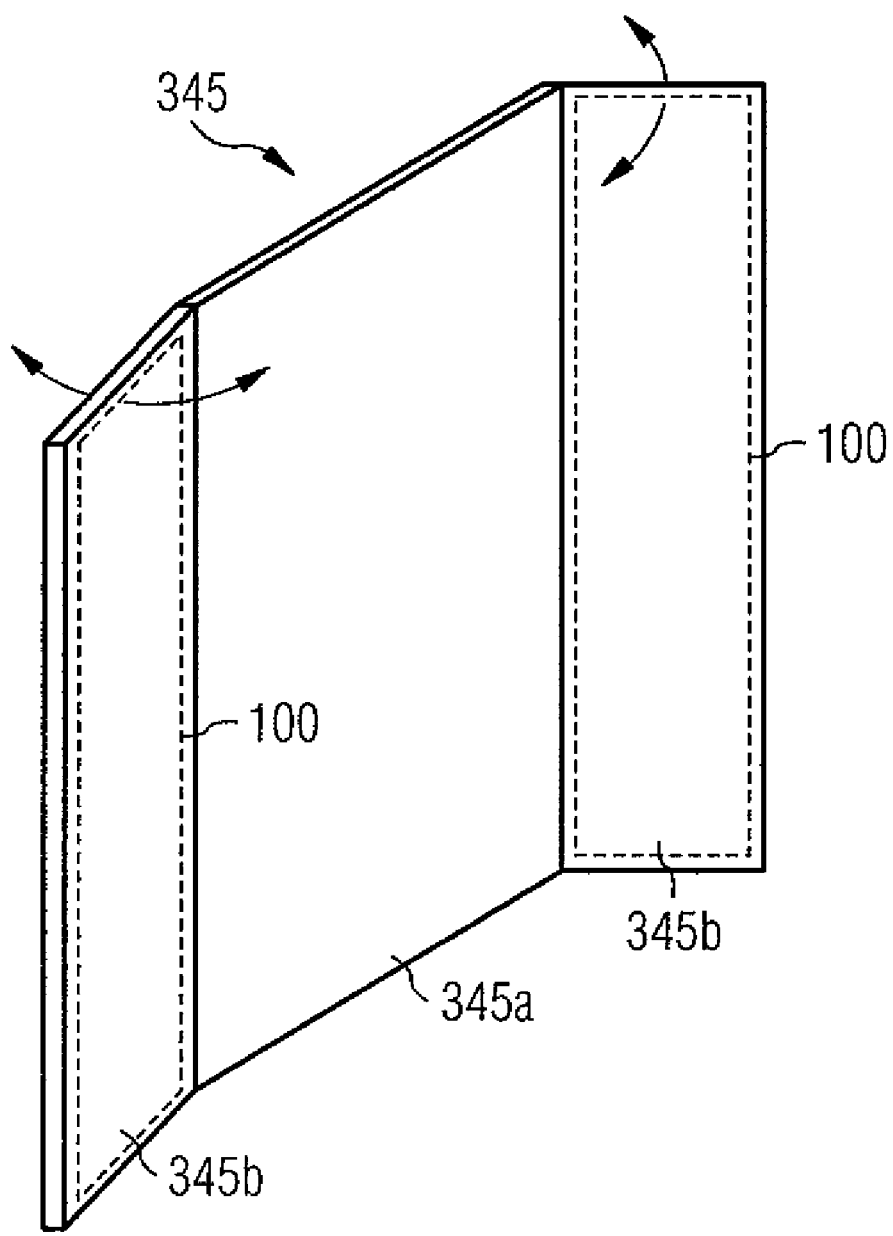

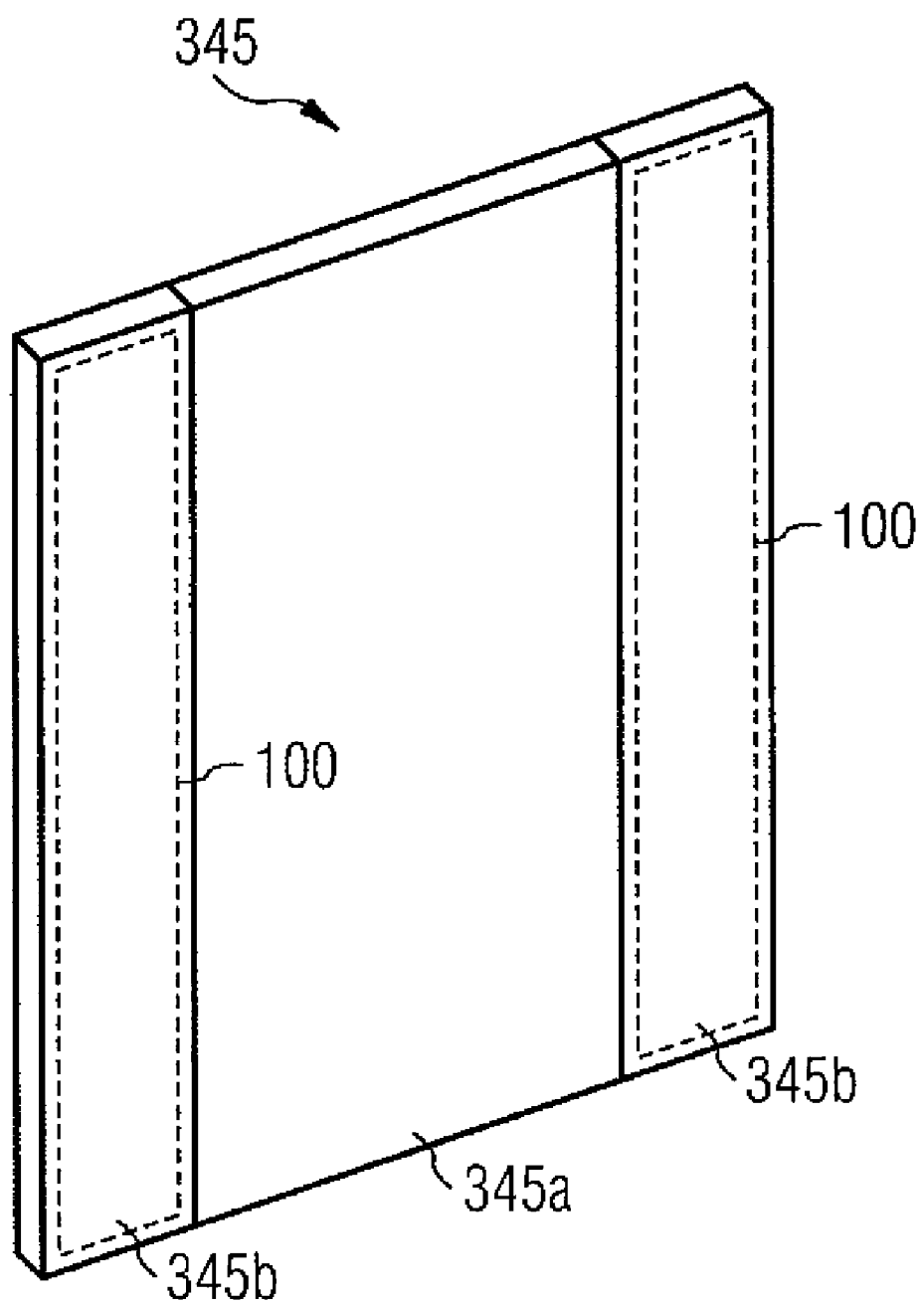

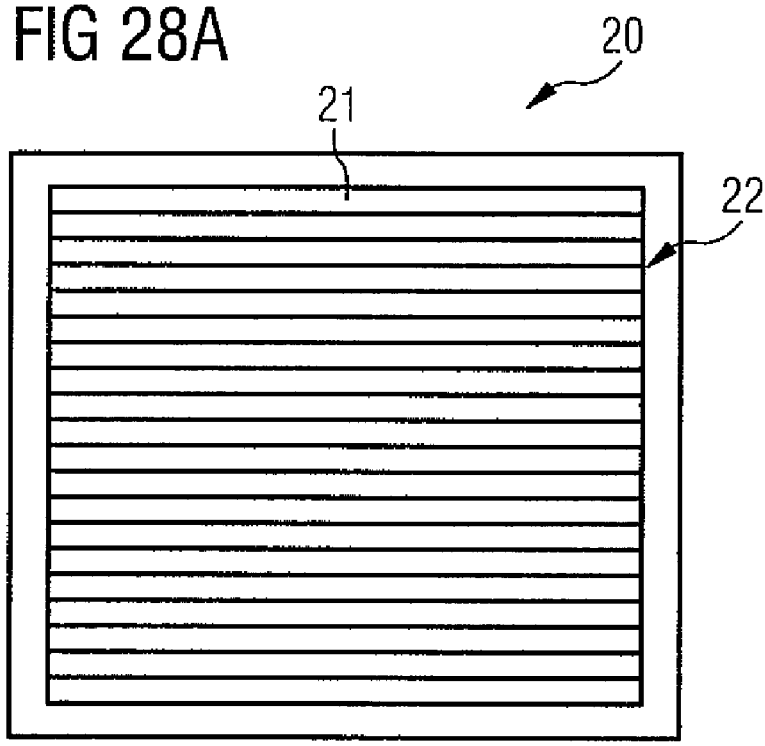
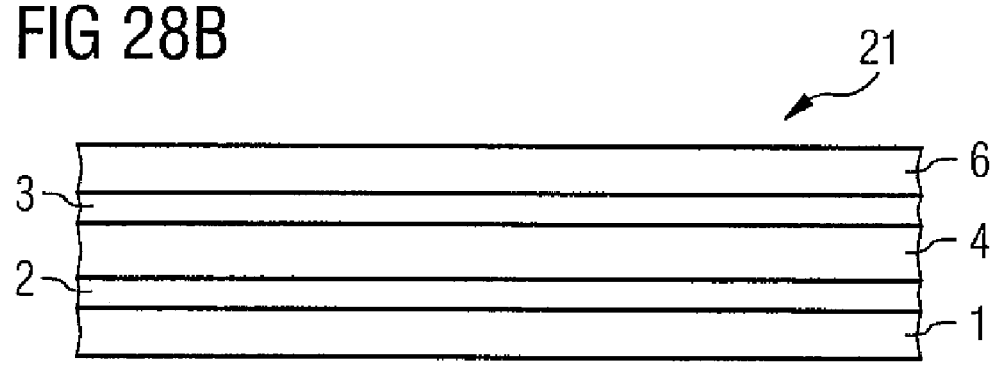

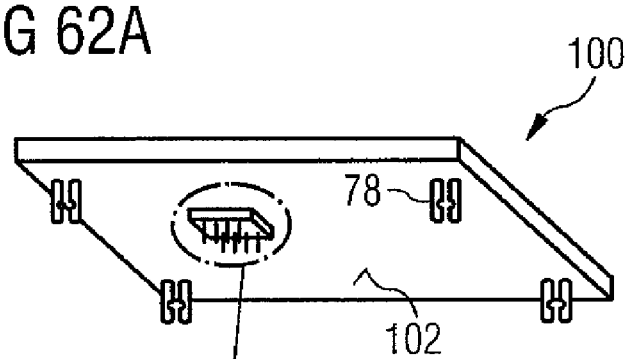
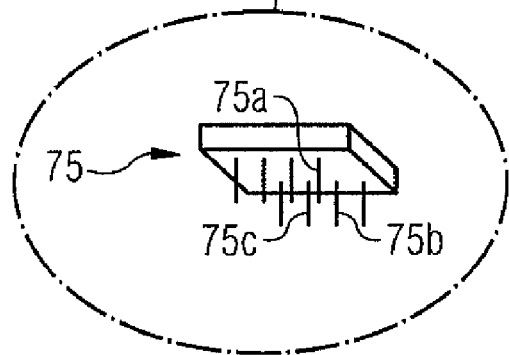
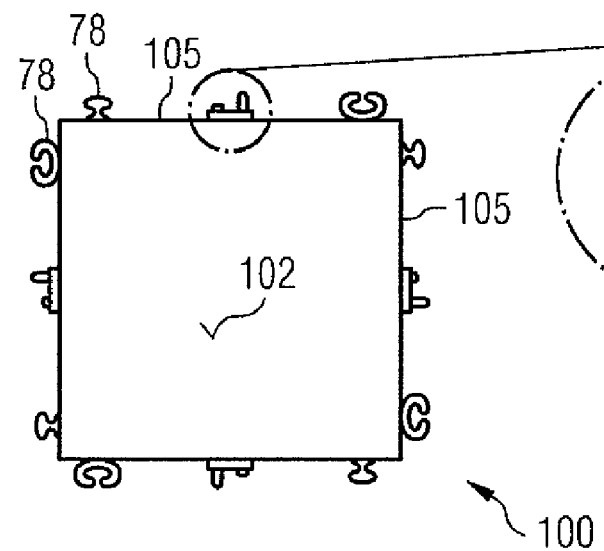
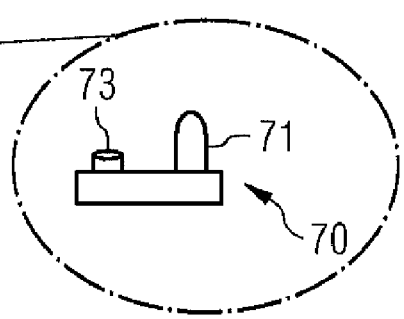

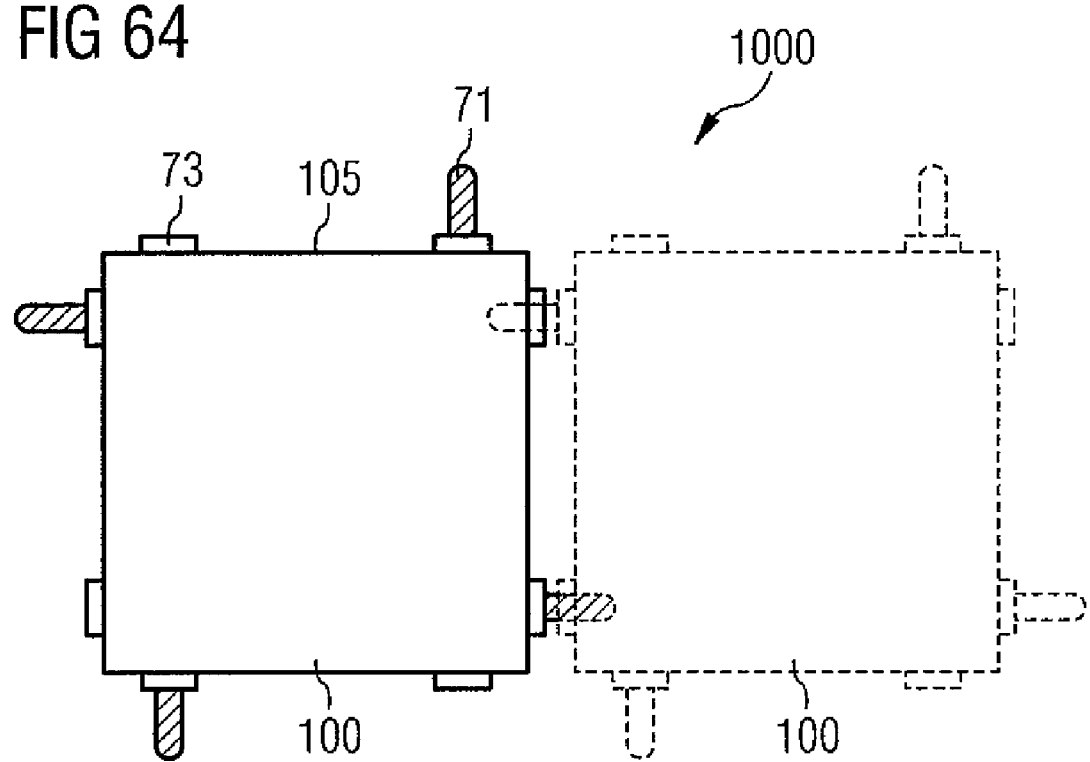

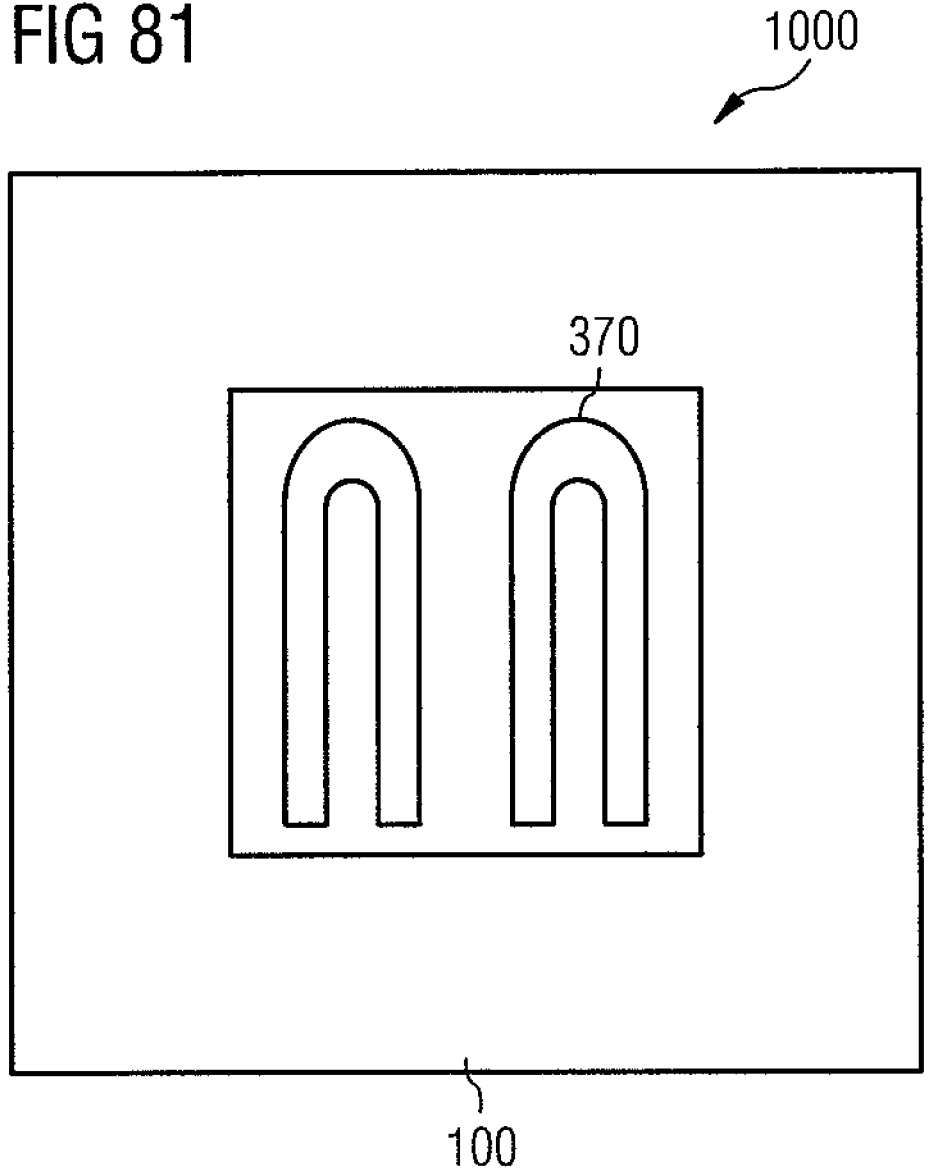

ORGANIC LIGHTING DEVICE AND LIGHTING EQUIPMENT

RELATED APPLICATIONS

This is a U.S. national stage under 35 USC §371 of application No. PCT/DE2007/001744, filed on Sep. 26, 2007.

This application claims the priority of German Patent Application Nos. 10 2006 046 293.9 filed Sep. 26, 2006, 10 2006 046 198.3 filed Sep. 26, 2006, 10 2006 054 584.2 filed Nov. 20, 2006 and 10 2006 060781.3 filed Dec. 21, 2006, the entire contents of all of which are hereby incorporated by reference.

BACKGROUND OF THE INVENTION

The present application relates to an organic luminous means and an illumination device comprising such a luminous means. The present application furthermore relates to an optical display apparatus, emergency lighting, motor vehicle interior lighting, an item of furniture, a construction material, a glazing and a display comprising such a luminous means and, respectively, comprising an illumination device having such a luminous means.

The documents U.S. Pat. No. 6,554,443 and U.S. Pat. No. 6,626,554 describe a luminous means which has semiconductor-based light-emitting diodes as light sources.

However, semiconductor-based light-emitting diodes are generally relatively expensive. In particular, the costs for a semiconductor-based light-emitting diode rise with the luminous area thereof. Therefore, large-area semiconductor-based light-emitting diodes are particularly expensive and are produced only rarely, on account of their low profitability. Furthermore, semiconductor-based light-emitting diodes are generally embodied neither as flexible nor as transmissive to visible light.

SUMMARY OF THE INVENTION

One object of the present invention, inter alia, is to specify a cost-effective luminous means.

A further object of the present invention, inter alia, is to specify a luminous means which is transmissive to visible light.

A further object of the present invention, inter alia, is to specify a luminous means which is suitable for representing information, for example in public spaces.

A further object of the present invention, inter alia, is to specify a luminous means which can be used as glazing for example in public spaces or in items of furniture and can furthermore serve as illumination.

A further object of the present invention, inter alia, is to specify a luminous means which can serve as a mirror and/or as an illumination source.

A further object of the present invention, inter alia, is to specify a luminous means which is suitable for representing information, for example in motor vehicles.

A further object of the present invention, inter alia, is to specify a luminous means which can be used in a decorative element.

A further object of the present invention, inter alia, is to specify a luminous means for a search mirror.

A further object of the present invention, inter alia, is to specify a flexible luminous means.

A further object of the present invention, inter alia, is to specify an illumination device comprising luminous means.

A further object of the present invention, inter alia, is to specify an illumination device comprising a luminous means and whose light can cause a variable color impression.

At least one object of specific embodiments of the present invention, inter alia, is to specify storage furniture comprising a storage element having a luminous means. By way of example, illumination of a region of the storage furniture and the surroundings thereof can be made possible thereby.

In accordance with at least one embodiment of the luminous means, a luminous means comprises, in particular:
 a substrate having a first main surface, to which a first electrode is applied,
 a second electrode, and
 an organic layer stack within an active region of the substrate between the first and the second electrode, wherein the organic layer stack comprises at least one organic layer which is suitable for generating light.

The organic layers of the organic layer stack can comprise low molecular weight materials (small molecules) or polymeric materials. Low molecular weight materials are generally applied by vacuum processes, such as evaporation, for example, while polymeric materials can be applied by solvent-based processes such as blade coating, spin-coating or printing methods.

One of the electrodes generally serves as an anode which injects holes into the organic layer stack, while the other electrode serves as a cathode which impresses electrons into the organic layer stack. The anode preferably comprises a material having a high work function for electrons, such as indium tin oxide (ITO), for example.

The cathode, by contrast, preferably comprises a material having a low work function for electrons, such as alkali or alkaline earth metals, for example. Since such materials are generally very sensitive to atmospheric gases—such as oxygen and moisture for example—the cathode can comprise, alongside a layer of such a material having a low work function, one or a plurality of further layers which are significantly less sensitive to ambient influences, such as silver, aluminum or platinum layers, for example. The further layers encapsulate the layer having the low work function for electrons.

The organic layer stack can comprise, alongside the at least one layer which is suitable for generating light, further organic layers, such as, for example, a hole injecting layer, a hole conducting layer, an electron injecting layer and an electron conducting layer.

In this case, the hole conducting layer and the hole injecting layer are preferably situated on the side of the organic layer stack facing the anode, while the electron conducting layer and the electron injecting layer are preferably situated on that side of the organic layer stack which faces the cathode. In this case, the organic layer suitable for generating light is preferably arranged between the hole conducting layer and the hole injecting layer, on the one hand, and the electron conducting layer and the electron injecting layer, on the other hand. In general, the organic materials are embodied in light-transmissive fashion, in particular to a light emitted by the organic layer stack.

By way of example, the hole injecting layer contains or consists of at least one of the following materials:
 Pedot: PSS
 F4TCNQ (tetrafluorotetracyano-quinodimethane), p-doped,
 NHT-5 with NDP-2.

By way of example, the hole conducting layer contains or consists of at least one of the following materials:
 aNPD=aNPB=4,4'-bis[N-(1-naphthyl)-N-phenyl-amino] biphenyl 1-TNATA=4,4',4"-tris(N-naphth-1-yl)-N-phenyl-amino)
triphenylamine MTDATA=4,4',4"-tris(N-3-methylphenyl-N-phenyl-amino)triphenylamine TPD=N,N'-diphenyl-N,N'-(3-methylphenyl)-1,1'biphenyl-4,4'-diamine spTAD=2,2',7,7'-diphenylamino-spiro-9,9'-bifluorene.

By way of example, the electron conducting layer contains or consists of at least one of the following materials:

Alq3=tris(8-hydroxyquinoline)aluminum

BAlq=bis(2-methyl-8-quinolinolate)-4-(phenylphenolato)aluminum

TPBi=1,3,5-tris(1-phenyl-1H-benzimidazol-2-yl)-benzene.

By way of example, the electron injecting layer contains or consists of at least one of the following materials:

LiF, NaF

Cs2CO3

Ba

NET-5 with NDN-1.

The luminous means generally has two main surfaces lying opposite one another. That main surface of the luminous means which is remote from the substrate is referred to hereinafter as the "top side" of the luminous means, while the main surface lying opposite the top side of the luminous means is called the "underside" of the luminous means.

The luminous means emits a light generated in the organic layer stack either through its underside or through its top side or through underside and top side. In any event the elements of the luminous means through which the light generated in the organic layer stack passes on the way to the respective light-emitting side—top side or underside—of the luminous means must be transmissive to the light generated by the organic layer stack. If it is provided that the light generated in the organic layer stack is emitted from the underside and top side of the luminous means, then in general all the elements of the luminous means, in particular the electrodes, and also an encapsulation and the substrate must be transmissive to the light generated by the organic layer stack. In the present case, an element is also referred to as "light-transmissive" if it is embodied as transmissive at least to the light generated by the organic layer stack.

In accordance with at least one embodiment of the luminous means, the first electrode is transmissive to a light emitted by the organic layer stack during operation.

If only the first electrode is transmissive to a light generated by the organic layer stack during operation, whereas the second electrode is not transmissive, then it is generally provided that the light is emitted through the underside of the luminous means. Preferably, therefore, in this case at least the substrate is likewise embodied as transmissive to the light generated by the organic layer stack.

Examples of a suitable material for a substrate which is embodied as transmissive to the light emitted by the organic layer stack include glass or plastics such as, for example, polyethylene terephthalate (PET), polybutylene terephthalate (PBT), polyethylene naphthalate (PEN), polycarbonate (PC), polyimide (PI), polysulfone (PSO), polyphenylene ether sulfone (PES), polyethylene (PE), polypropylene (PP), polyvinyl chloride (PVC), polystyrene (PS) and polymethyl methacrylate (PMMA), polyamide (PA), polyurethane (PUR), and also rubbers.

Furthermore, a laminate composed of a glass and at least one of the plastics listed above is suitable as a substrate which is embodied as transmissive to the light emitted by the organic layer stack.

In accordance with at least one further embodiment of the luminous means, the second electrode is transmissive to a light emitted by the organic layer stack during operation. If only the second electrode is transmissive to a light generated by the organic layer stack during operation, whereas the first electrode is not transmissive, then it is generally provided that the light is emitted through the top side of the luminous means. Preferably, therefore, in this case, the elements between second electrode and top side—for example an encapsulation—are likewise embodied as transmissive to the light generated by the organic layer stack.

In accordance with at least one particularly preferred embodiment of the luminous means, both electrodes are embodied as transmissive to the light generated by the layer stack. In this embodiment, the luminous means is generally provided for being embodied as transmissive to the light emitted by the organic layer stack. As already mentioned above, in this case the further elements of the luminous means through which the light passes on the way to the top side and respectively underside of the luminous means, in particular the substrate and an encapsulation, are likewise embodied as transmissive to the light emitted by the organic layer stack.

In accordance with at least one embodiment, at least one of the electrodes comprises a transparent conductive oxide, a metal or a conductive organic material or consists thereof.

Transparent conductive oxides (TCO, for short) are conductive materials, generally metal oxides, such as, for example, zinc oxide, tin oxide, cadmium oxide, titanium oxide, indium oxide or indium tin oxide (ITO), which are transmissive to visible light. They are therefore particularly suitable for being used for electrodes which are embodied as transmissive to the light emitted by the organic layer stack. ITO, for example, is suitable as an anode material. Alongside binary metal-oxygen compounds such as, for example, $ZnO$, $Sn_2$ or $In_2O_3$, ternary metal-oxygen compounds such as, for example, $ZnO:Al$ (ZAO), $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

Alkali or alkaline earth metals, for example, can be used as metal for the cathode. The TCO materials specified above are furthermore also suitable for forming the cathode.

The electrode can for example comprise a metallic layer or consist of such a layer. If the electrode which comprises the metallic layer or consists of such a layer is intended to be embodied as transmissive to the light emitted by the organic layer stack, then the metallic layer must be made sufficiently thin. The thickness of such a semitransparent metallic layer preferably lies between 1 nm and 100 nm, inclusive of the limits.

A suitable organic conductive material for an electrode is PEDOT:PSS, for example, which is particularly well suited to the anode. Further suitable organic conductive materials are polythiophenes or pentacene, inter alia.

Organic materials are generally transmissive to visible light. Therefore, an electrode which comprises organic conductive material or consists of such material is also generally transmissive to the light emitted by the organic layer stack.

In accordance with at least one embodiment of the luminous means, at least one of the electrodes has electrically conductive tracks. The electrically conductive tracks preferably comprise a metal or consist of such a metal. Particularly preferably, the electrical tracks are made relatively thick, for example in comparison with a semitransparent metallic layer described above. Preferably, the thickness of the metallic tracks is at most 1.5 μm. Such thick electrically conductive tracks generally have a good electrical conductivity, such that they are particularly well suited to impressing charge carriers into the organic layer stack. Furthermore, the metallic tracks are preferably embodied in such a way that they fill only a small part of the area of the electrode that comprises them. By way of example, the electrically conductive tracks are embodied as a grid which is transmissive to the light emitted by the organic layer stack. In this way, with the aid of the electrically conductive tracks, it is possible to provide an electrode which is transmissive to the light emitted by the organic layer stack and which furthermore advantageously permits good charge carrier impression into the organic layer stack.

Preferably, the proportion of the total electrode area made up by the metallic tracks is at most 25%, preferably at most 10%, particularly preferably at most 5%. The metallic tracks are then no longer or only scarcely perceptible to an observer.

Particularly preferably, the electrically conductive tracks have a multilayer construction. Such a multilayer construction can have a plurality of metallic layers, for example. Preferably, the multilayer construction comprises or consists of three metallic layers, of which the two outer layers serve as protective layers for the middle layer, for example against corrosion. The middle layer of the multilayer construction can for example comprise aluminum or consist of aluminum, or the two outer layers can comprise chromium, molybdenum, copper or silver or can consist of one of these materials.

In this case, the multilayer construction has a thickness of preferably at least 50 nm and at most 100 nm.

In this case, the materials mentioned are particularly well suited to rather poorly conductive electrodes. For example for electrodes which contain a TCO or consist thereof. In principle, the materials are suitable for anode and cathode.

In accordance with at least one embodiment of the luminous means, the organic layer stack comprises a doped organic layer comprising a dopant, which layer is arranged between the at least one organic layer suitable for generating light and one of the electrodes. Particularly preferably, the doped organic layer forms an outermost layer of the organic layer stack, which layer particularly preferably forms a common interface with the respectively facing electrode. The doped organic layer can be an n-doped layer or a p-doped layer. If the doped layer is arranged in such a way that it faces the cathode or joins the cathode, an n-doped layer is generally involved. By contrast, if the doped layer is arranged in such a way that it faces the anode or adjoins the latter, then a p-doped layer is generally involved.

Preferably, the dopant of the doped layer involves the largest possible atoms or molecules which, in the case of an n-type dopant, are suitable for releasing electrons and, in the case of a p-type dopant, are suitable for releasing holes. Furthermore, the dopant preferably has a low diffusion constant within the organic layer stack, as is generally the case for example for large atoms or molecules.

The doping firstly advantageously increases the conductivity of the doped organic layer and, in the case of an n-doped layer adjoining the cathode, leads to a better injection of electrons from the cathode into the organic layer stack or, in the case of a p-doped layer adjoining the anode, leads to a better injection of holes from the anode into the organic layer stack. Cesium, barium and lithium fluoride are preferably used as n-type dopants. The following materials are suitable as p-type dopant, for example: F4TCNQ, HIL from Mitsubishi (MCC-PC1.020).

In accordance with at least one embodiment of the luminous means, the active region is arranged within an encapsulation. Since the organic materials of the organic layer stack and often also electrode materials, in particular materials of the electron injecting cathode, are reactive toward atmospheric gases, such as moisture and oxygen for example, it is generally particularly important, for the lifetime of the luminous means, to be closed off well from oxygen and moisture and other atmospheric gases, generally with the aid of an encapsulation. In particular the active region comprising the organic layer stack and the electrodes generally has to be protected here.

The encapsulation used can be a cap, for example, which has a cavity in the region of the active layer stack and which is mounted on the substrate, for example by adhesive bonding, within a fixing region of the substrate surrounding the active region. The cavity of the cap preferably forms a void above the active region in which the organic layer stack and the two electrodes are arranged. Furthermore, the cap is preferably not in direct contact by the underside of its cavity with the second electrode on the organic layer stack.

Furthermore, the encapsulation used can also be a plate which is connected to the substrate, for example by adhesive bonding, within a fixing region of said substrate surrounding the active region. Such a plate can be arranged in direct contract with the second electrode. By way of example, the plate can be fixed by means of an adhesive layer on the second electrode.

In order to produce a spacing between the cap or the plate in such a way that the cap or the plate is not in direct contact with the second electrode, the active region in accordance with one embodiment comprises spacers. The spacers can be for example spherical particles arranged on the organic layer stack or the second electrode.

Furthermore, the encapsulation used can also be a film. The film can be connected to the substrate, for example by adhesive bonding, within a fixing region of said substrate surrounding the active region. Such a film can be arranged in direct contact with the second electrode. By way of example, the film can be fixed by means of an adhesive layer on the second electrode.

In order to produce a spacing between the film and the second electrode or the organic layer stack in such a way that the film is not in direct contact with the second electrode, the active region in accordance with one embodiment comprises spacers. The spacers can be for example spherical particles arranged on the organic layer stack or the second electrode.

The film is formed for example from a transparent plastic or a glass. Preferably, the film has a thickness of at most 1 mm, particularly preferably of at most 0.5 mm.

Furthermore, the encapsulation used can also be a laminate comprising at least one layer composed of a glass to which at least one layer composed of a plastic is applied. Preferably, the glass layer is covered by a respective plastic layer at its two main surfaces. The laminate is then a plastic-glass-plastic laminate.

The laminate can be connected to the substrate, for example by adhesive bonding, within a fixing region of said substrate surrounding the active region. Such a laminate can be arranged in direct contact with the second electrode. By way of example, the laminate can be fixed by means of an adhesive layer on the second electrode.

In order to produce a spacing between the laminate and the second electrode or the organic layer stack in such a way that the laminate is not in direct contact with the second electrode, the active region in accordance with one embodiment comprises spacers. The spacers can be for example spherical particles arranged on the organic layer stack or the second electrode.

In accordance with at least one embodiment, the encapsulation is formed by a thin-film encapsulation. The thin-film encapsulation has at least one barrier layer. The barrier layer is provided for protecting the organic layer stack and also sensitive electrode materials against the penetration of harmful substances, such as moisture and oxygen for example.

A thin-film encapsulation furthermore comprises at least one thin-film layer, such as the barrier layer, for example, which is applied by means of a thin-film method such as sputtering, evaporation, and plasma enhanced CVD (short for "chemical vapor deposition"), ALD (short for "atomic layer deposition"), MOVPE (short for "metal organic vapor phase epitaxy"), flash evaporation and/or laser ablation. Such thin-film layers preferably have a thickness of between 0.5 and 5 µm, inclusive of the limits.

A thin-film encapsulation can be applied for example directly to the second electrode. A thin-film encapsulation generally affords the advantage of being able to be made particularly thin and space-saving in comparison with a cap or a plate.

In accordance with at least one embodiment, the barrier layer contains one of the following materials or consists thereof: silicon oxide, silicon nitride. These materials are particularly suitable for forming a barrier with respect to external influences, such as the penetration of oxygen and moisture for example.

In accordance with at least one embodiment, the thin-film encapsulation comprises a plurality of alternating barrier layers, wherein at least two barrier layers which are different with regard to their material composition are arranged in regular succession. In other words, the thin-film encapsulation in this embodiment comprises first and second barrier layers, wherein the material composition of the first barrier layers is different from the material composition of the second barrier layers. The first barrier layers can for example comprise silicon oxide or consist of this material, and the second barrier layers can for example comprise silicon nitride or consist of this material. The first and the second barrier layers are furthermore arranged in alternating fashion with regard to their material composition.

Such an alternating layer sequence of barrier layers within the thin-film encapsulation affords the advantage that the thin-film encapsulation is made particularly tight. This can generally be attributed to the fact that pinholes—that is to say small holes—which can arise in the respective barrier layer during the application thereof can be covered by the overlaying barrier layer or can even be filled by the material thereof. Furthermore, the probability of a pinhole from one barrier layer producing a continuous connection with a pinhole from the adjacent barrier layer is extremely low. This applies in particular to barrier layers which are arranged in alternating fashion with regard to their material composition.

Particularly preferably, one of the alternating barrier layers comprises silicon oxide and the other alternating barrier layer comprises silicon nitride.

In accordance with at least one further embodiment, the thin-film encapsulation comprises at least one polymer interlayer arranged between two barrier layers.

By way of example, multicomponent resin systems are suitable for the polymer interlayer, said systems being vapor-deposited as monomers and depositing in liquid form. A high planarity of the polymer interlayer is thereby achieved. The deposited layer is subsequently crosslinked by means of UV radiation. The task of the polymer interlayer is the planarization in the thin-film encapsulation in order to prevent pinholes from lying one above another in the inorganic alternating barrier layers. The water and oxygen permeability of the thin-film encapsulation is thereby reduced.

The thickness of the polymer interlayer can preferably lie between 50 and 100 nm, inclusive of the limits. Particularly preferably, the polymer interlayer is light-transmissive if a top emitter is present or transparency of the luminous means is required.

Particularly preferably, the thin-film encapsulation comprises a protective lacquer layer as the outermost layer. The protective lacquer layer can be applied to the thin-film encapsulation for example by means of a spraying method with mask process.

As an alternative, as a protective lacquer layer, for example, an epoxy resin film can be adhesively bonded onto the thin-film encapsulation. In this case, the protective lacquer layer in particular also contributes to the watertightness. A thin glass can be laminated onto the epoxy resin film and improves the watertightness further.

In accordance with a further embodiment, an adhesion promoting layer is arranged between the thin-film encapsulation and the second electrode, said adhesion promoting layer preferably likewise being a thin-film layer. The adhesion promoting layer has the task of improving the adhesion of the thin-film encapsulation on the second electrode or some other layer applied on the second electrode, if appropriate. For this purpose, the adhesion promoting layer comprises for example sulfur and/or nitrogen atoms or sulfur and/or nitrogen compounds. It is furthermore possible for the adhesion promoting layer to contain aluminum oxide or to consist of aluminum oxide, for example.

In accordance with at least one further embodiment, an organic planarization layer is arranged between the second electrode and the thin-film encapsulation.

By way of example, multicomponent resin systems are suitable for the organic planarization layer, said systems being vapor-deposited as monomers and deposited in liquid form. A high planarity of the organic planarization layer is thereby achieved. The deposited layer is subsequently crosslinked by means of UV radiation. The task of the organic planarization layer is the planarization in the thin-film encapsulation in order to prevent pinholes from lying one above another in the inorganic alternating barrier layers. The water and oxygen permeability of the thin-film encapsulation is thereby reduced. The thickness of the organic planarization layer can preferably lie between 50 and 100 nm, inclusive of the limits.

If an adhesion promoting layer is arranged between the second electrode and the thin-film encapsulation, then the organic planarization layer is preferably arranged between the adhesion promoting layer and the second electrode, wherein the adhesion promoting layer is intended to improve the adhesion between the planarization layer and the thin-film encapsulation.

The organic planarization layer can have scattering centers, for example, such as diffuser particles, for example silica balls. Apart from silica balls, other light-transmissive materials having a different refractive index than the surrounding matrix are also suitable, such as glass balls, for example.

The diffuser particles are provided for scattering light; by way of example, lateral structures of the OLED layer construction—which can occur for example on account of the electrode design—are intended to be blurred in order that a homogeneous impression arises for the observer. Furthermore, the emission characteristic can be influenced by the light scattering.

The diffuser particles preferably have a diameter of at least 0.5 to at most 5 µm. The surrounding layers are preferably correspondingly adapted in terms of their thickness, such that the diffuser particles are embedded into the layers.

If the intention is to provide a luminous means which is substantially transmissive to the light emitted by the organic layer stack during operation or a luminous means which emits light from its top side, then the encapsulation is preferably likewise embodied as transmissive to the light emitted by the luminous means during operation.

In accordance with at least one embodiment, the encapsulation comprises glass or consists of glass. Such an encapsulation is generally transmissive to the light emitted by the organic layer stack. In particular, it is possible to use a glass cap or a glass plate as encapsulation which is transmissive to the light generated by the organic layer stack.

In accordance with at least one embodiment, the organic planarization layer contains a luminescence conversion material.

The luminescence conversion material converts for example blue light partly into yellow light, whereby a white mixed light then arises which is emitted by the luminous means. An embedding of the luminescence conversion material into the planarization layer or other functional layers such as the encapsulation or the substrate proves to be particularly advantageous since process steps during production can thereby be saved. Production is particularly cost-effective as a result.

Luminescence conversion materials are materials which absorb incident light from a first wavelength range and emit light from a second wavelength range, which is different from the first wavelength range and which generally comprises longer wavelengths than the first wavelength range.

Organic materials such as perylene phosphors, for example, can be used as luminescence conversion materials. Further organic materials which can for example be used for dye lasers in a corresponding wavelength range are suitable as luminescence conversion materials.

Luminescence conversion materials whose molecules contain an aromatic system and preferably conjugate double bonds are furthermore suitable. The skeleton of these luminescence conversion materials is formed for example from chromene, xanthene, coumarin, thioindole, and/or benzene.

In particular, the following materials are suitable, for example: Rhodamine 6G, DCM=4-(dicyanomethylene)-2-methyl-6-(p-dimethylaminostyryl)-4H-pyran.

In particular, molecules are desired here which have an abnormal Stokes shift which brings about a reduced or no overlap of the ranges of the luminescence and the exciting radiation. So-called triplet emitters are furthermore suitable since no overlap between exciting radiation and luminescence occurs here. A further positive effect in the case of triplet emitters is that absorption losses are avoided; rhodamine B, for example, is particularly suitable here.

Furthermore, the following inorganic materials are also suitable for being used as luminescence conversion materials: garnets doped with rare earth metals, alkaline earth metal sulfides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxynitrides doped with rare earth metals, and aluminum oxynitrides doped with rare earth metals.

In accordance with at least one further embodiment, the luminous means comprises a getter material. The getter material is advantageously suitable for binding moisture and/or oxygen. By way of example, BaO, CaO, zeolite, Al-alkoxy compounds and barium can serve as getter materials.

The getter material can be arranged within the active region, for example. Furthermore, the getter material can alternatively also be arranged outside the active region. The getter material can for example enclose the active region and be arranged approximately in ring-shaped fashion around the active region between the substrate and the encapsulation. In this way the penetration of harmful substances, through the getter material, can be avoided particularly effectively.

Furthermore, when using a cap or a plate for encapsulation, a getter material can also be applied on that side of the cap or plate which faces the active layer stack. If the intention is to produce a luminous means which is substantially transmissive to the light generated by the organic layer stack, then in this case the getter material is also preferably transmissive to the light generated by the organic layer stack. For this purpose, Al-alkoxy compounds, for example, are suitable as getter material.

If the luminous means comprises an encapsulation which prevents the penetration of harmful substances into the luminous means particularly well, as is the case for example with a thin-film encapsulation, then the luminous means is preferably free of any getter material.

In accordance with at least one embodiment, the luminous means comprises an electrical lead on the substrate which electrically conductively connects one of the electrodes and a connection location preferably lying outside the active region. Preferably, electrical contact is made with the luminous means via the connection location, for example with the aid of a plug.

In accordance with at least one embodiment, the electrical lead is embodied as transmissive to the light emitted by the layer stack. Such a lead is suitable in particular for being used in a luminous means which is embodied as completely transmissive to the light emitted by the layer stack.

The electrical lead can for example contain a metal or consist thereof. If the electrical lead is intended to be embodied as transmissive to the light emitted by the layer stack, then the metal in this case is applied in a manner so thin that a semitransparent metal layer arises which is transmissive to light from the organic layer stack.

Furthermore, the electrical lead of the luminous means can also contain a transparent conductive oxide or consist thereof. Since transparent conductive oxides are transmissive to visible light, such an electrical lead is generally likewise transmissive to the light emitted by the layer stack and preferably to external visible light.

In accordance with at least one embodiment, the luminous means is embodied as substantially transmissive to the light generated by the organic layer stack. In this case, the luminous means is provided for emitting the light generated by the organic layer stack from its top side and from its underside. Furthermore, the luminous means in this case is preferably embodied in such a way that it is readily transmissive to visible external light in the switched-off state and comprises no elements which absorb or reflect large portions of visible light. In this case, the luminous means is only scantily perceptible to an observer in the switched-off state. That is to say that the luminous means is then preferably embodied such that it is clearly transparent and not diffusely scattering.

If the luminous means is transmissive to the light emitted by the organic layer stack, then the elements of the luminous means such as the organic layer stack, the electrodes, the substrate, the encapsulation, if appropriate the getter material and the leads are likewise transmissive to the light generated by the organic layer stack, particularly preferably transmissive to visible light.

In accordance with at least one embodiment of the luminous means, a window glazing serves as the substrate. This can be advantageous particularly when the luminous means is embodied as transmissive to the light generated by the organic layer stack.

A luminous means which is embodied as transmissive to the light generated by the organic layer stack can be integrated in a window, a ceiling element, a windshield, a door, a room divider, a glass block, a wall or a partition and can be used for example in buildings, furniture, motor vehicles or aircraft.

In accordance with a further embodiment, a window glazing serves as encapsulation.

Particularly preferably, substrate and encapsulation are embodied as window glazing. In this embodiment, the luminous means, preferably embodied as transmissive to the light emitted by the organic layer stack, or an illumination device comprising such a luminous means can be integrated as simply as possible as glazing in a glass pane.

Glass panes comprising a luminous means embodied as transmissive at least to a light emitted by the organic layer stack or comprising an illumination device comprising such a luminous means can serve for example for signal representation in doors of hotels, at trade fairs or museums. Information can thereby be represented by the luminous means and can be displayed by the luminous means as required. In this way it is advantageously possible to avoid stickers, for example on doors. Furthermore, a significantly better signal effect is provided by the luminous information of the luminous means than by a sticker.

Furthermore, with the aid of luminous means embodied as transmissive to a light emitted by the organic layer stack, advertising representations such as company logos, for example, can easily be integrated in display windows or information can be presented in windshields of motor vehicles or aircraft.

Furthermore, luminous means which are at least partly transmissive to the light generated by the organic layer stack can be used in ceiling elements for example in museums or conference centers. As a result, with the luminous means switched off, daylight can penetrate through the ceiling element into the respective space, while the ceiling element with the luminous means can be used for illumination at night or twilight.

In accordance with at least one embodiment, the substrate is embodied in milky fashion.

In accordance with a further embodiment, the encapsulation is embodied in milky fashion.

By way of example, a surface of substrate and/or encapsulation is embodied in rough fashion and/or scattering centers are introduced into the substrate/encapsulation.

Furthermore, it is possible to apply an additional film/layer comprising so-called "polymer dispersed liquid crystals" to the substrate and/or the encapsulation. The milkiness can thus be switched on and off electrically. When a voltage is applied, said layer is clear, and it becomes milky when turned off.

A milky embodiment of substrate and/or encapsulation, for example as milky window glazing, can be advantageous particularly in the abovementioned applications if, for design reasons or functional reasons, it is not necessary for the respective window to afford a clear view through it.

In accordance with at least one embodiment, the luminous means comprises at least one reflective element. The reflective element is preferably formed along one of the main planes of the luminous means. Particularly preferably, the reflective element is formed completely along the main plane of the luminous means. The reflective element can be arranged on the underside of the luminous means, for example on that side of the substrate which faces away from the organic layer stack, or on the top side of the luminous means, for example on that side of the encapsulation which faces away from the organic layer stack. Furthermore, the reflective element can be arranged for example between the first electrode and the substrate or between the second electrode and the encapsulation. As a result of the arrangement of a reflective element within the luminous means, in general one of the main surfaces is cut off from the light generated in the organic layer stack, that is to say that the light generated in the organic layer stack is emitted only from one of the main surfaces, that is to say from underside or top side. This main surface is also called "light-emitting front side" hereinafter. It should be pointed out at this juncture that the expression "light-emitting front side" does not necessarily mean that the entire main surface from which the light generated in the organic layer stack is emitted is embodied in light-emitting fashion. Rather, it is also possible for only a part of the surface of the front side to be light-emitting. In the present case, that surface of the light-emitting front side, of the underside and of the top side which is luminous is also referred to as "luminous surface".

The remaining elements of the luminous means, but at least the elements of the luminous means through which the light generated in the organic layer stack passes on the way to the light-emitting front side, are preferably embodied as transmissive to the light generated in the organic layer stack. Particularly preferably, these elements are generally embodied as transmissive to visible light.

If a luminous means in which those elements through which the light generated by the organic layer stack passes on the way to the light-emitting front side are embodied in light-transmissive fashion comprises at least one reflective element, then the luminous means can advantageously serve as an illumination source in the switched-on state and as a mirror in the switched-off state on account of the reflective element in combination with the remaining elements of the luminous means which are transmissive to visible light. In the case of this luminous means it is thus advantageously possible to change over between mirror function and illumination function.

In the present case, a luminous means which comprises a reflective element is also called "reflective luminous means".

In this case, the luminous means can have an additional reflective element or one of the elements of the luminous means such as, for example, substrate, electrodes or encapsulation can be embodied as a reflective element.

In accordance with at least one embodiment, the luminous means comprises a reflective layer sequence as reflective element.

The reflective layer sequence can for example comprise a dielectric mirror or consist thereof. Furthermore, it is possible for the reflective layer sequence to comprise a silver layer and a layer composed of mechanically more resistant copper. Preferably, the reflective layer is then electrically insulated from the functional layers of the luminous means such as electrodes or the organic layer stack.

The reflective layer sequence can be arranged on the underside of the luminous means, for example on that side of the substrate which faces away from the organic layer stack, or on the top side of the luminous means, for example on that side of the encapsulation which faces away from the organic layer stack. Furthermore, the reflective layer sequence can be arranged for example between the first electrode and the substrate or between the second electrode and the encapsulation.

The reflective layer sequence can for example also form the outermost layer of one of the electrodes.

In accordance with at least one embodiment, the luminous means comprises an antireflective layer sequence. Such an antireflective layer sequence is preferably applied on one of the outer surfaces, that is to say on the top side or the underside of the luminous means. If the luminous means emits light only from one of the main surfaces, namely from the light-emitting front side, then the antireflective layer sequence is preferably applied on the light-emitting front side.

An antireflective layer sequence preferably comprises a dielectric material or consists thereof. By way of example, the layer sequence can in this case comprise at least one layer which comprises a silicon nitride or silicon oxide.

In accordance with at least one embodiment, the first or the second electrode is embodied in reflective fashion. In this case, the reflective electrode forms the reflective element. Preferably, the reflective electrode comprises silver, aluminum and/or gold or consists of one of these materials.

Furthermore, the encapsulation can be embodied in reflective fashion and serve as a reflective element. In this case, the luminous means emits the light generated in the organic layer stack through the substrate.

In accordance with at least one embodiment, the reflective encapsulation comprises a metal cap or consists thereof. Particularly preferably, the metal cap is polished at its inner side facing the organic layer stack.

In accordance with a further preferred embodiment, the reflective encapsulation is formed by a reflective thin-film encapsulation comprising at least one barrier layer. In this embodiment, the thin-film encapsulation already described above comprises at least one reflective layer. Said reflective layer preferably comprises a metal or consists thereof. Particularly preferably, the reflective thin-film encapsulation comprises at least one of the following layers as reflective layer: a silver layer, a copper layer. Particularly preferably, the thin-film encapsulation comprises a silver layer and a copper layer as reflective layer.

Furthermore, the reflective thin-film encapsulation can comprise a mirroring layer sequence, such as a Bragg mirror for example, as reflective layer. For this purpose—as described above—the thin-film encapsulation can comprise alternating layers of different materials, which forms a particularly tight encapsulation and at the same time a Bragg mirror or a dielectric mirror.

In accordance with a further embodiment, the luminous means comprises a getter material which is embodied as transmissive to the light emitted by the organic layer stack, preferably furthermore generally transmissive to visible light.

In accordance with at least one embodiment, the getter material which is at least transmissive to the light emitted by the layer stack is comprised by the reflective encapsulation.

The getter material has the task of binding substances such as oxygen and/or moisture, for example, which can penetrate into the luminous means despite the encapsulation.

The getter material is preferably comprised by the encapsulation in such a way that it faces into the space to be encapsulated, that is to say toward the organic layer stack. If a metal cap is used as encapsulation, then the getter material is preferably applied, for example in the form of a layer, at the inner side of the metal cap facing the organic layer stack. In order that the metal cap has good reflection properties, a getter material which is transmissive to the light emitted by the layer stack is particularly advantageous.

In order to fix a cap as encapsulation on the substrate, an adhesive is used, for example, which is arranged around the active region. Such an adhesive, but also some other connecting means, can furthermore be admixed with a getter material. Since the connecting means is often more permeable to harmful substances, such as moisture and oxygen, than the cap, this affords the advantage that these substances can already be bound by the getter material upon penetrating into the luminous means.

A thin-film encapsulation, in particular comprising the alternating barrier layers described above, is generally made tight in such a way that no getter material has to be used.

In accordance with at least one further embodiment, the substrate is embodied in reflective fashion. In this case, the substrate preferably forms the reflective element described above. In this case, preferably all the other elements of the luminous means which are arranged above the substrate are embodied as at least transmissive to the light emitted by the organic layer stack. By way of example, a metal film or a metal plate can serve as the reflective substrate.

Luminous means which comprise a reflective element and whose further elements through which the light generated in the organic layer stack passes on the way to the light-emitting front side are embodied as transmissive to visible light can be used as a mirror or as an illumination source, as already mentioned above. In this case, the luminous means can be embodied in such a way that the entire surface of the light-emitting front side serves as an illumination source during the operation of the luminous means and is used as a mirror in the switched-off state. Furthermore, it is also possible for the entire surface of the light-emitting front side of the luminous means to be used simultaneously as mirror and illumination source during operation. Furthermore, the surface of the light-emitting front side can be segmented, such that at least one certain region is provided as a mirror and at least one other region is provided as an illumination source during operation.

Luminous means having mirror and illumination functions generally comprise at least one electrode which is embodied as transmissive to the light generated by the organic layer stack and through which said light passes on the way to the light-emitting front side.

In accordance with at least one embodiment, this light-transmissive electrode is embodied in structured fashion, such that a desired form of the luminous surface within the front side of the luminous means is predetermined. The form of the luminous surface can be embodied for example in accordance with a logo or a symbol, such that this or other information appears against the background of a mirroring surface during operation. In a mirror for motor vehicles, such as a rear-view or side mirror, for example warnings, such as distance messages when parking, can thus be inserted into the mirror.

Furthermore, a luminous means having mirror and illumination functions can be comprised by a bath mirror or a wardrobe mirror or be embodied as a bath or wardrobe mirror. The bath or wardrobe mirror can be embodied for example in a plurality of parts with a main mirror in the center and two lateral mirror wings. The laterally fitted mirror wings can in this case be embodied for example as luminous means having mirror and illumination functions and serve as a mirror under good light conditions. Under poor light conditions, one or both mirror wings can then be supplementarily switched in as a light source in order to illuminate the observer. Such an illuminated mirror wing can advantageously also serve as a decorative illumination element.

Furthermore, a luminous means having illumination and mirror functions can be contained in a search mirror. Such a search mirror is, in the simplest case, a holding element having an angled mirror element at one end, such as a dental mirror, for example. In accordance with one embodiment, the mirror element comprises a luminous means having illumination and mirror functions. The combination of mirror function and illumination function in the mirror element of the search mirror in this case advantageously affords the possibility of being able both to look at locations that are not very accessible, and to illuminate these regions. Such search mirrors can for example find application as dental equipment or be used in the domestic sector for instance for searching for lost articles behind or under furniture that is difficult to move. Furthermore, the use of a luminous means having mirror and illumination functions in a search mirror affords the advantage that mirror and lamp can be guided simultaneously by one hand.

A luminous means having mirror and illumination functions can furthermore be integrated in a mirror of a portable cosmetic set. If no external light is available, the illumination of the mirror can be activated in order to provide better light conditions for the observer.

Furthermore, luminous means having mirror and illumination functions can be used as decoration elements, such as for example as flashing mirrors. A flashing mirror can be used for example in a flashing Christmas star.

In accordance with at least one embodiment of the luminous means, the luminous means is embodied in flexible fashion. A luminous means embodied in flexible fashion is distinguished, inter alia, by the fact that it can be bent to a certain degree without being damaged in the process. Preferably, the luminous means embodied in flexible fashion can be bent repeatedly without being damaged in the process. The luminous means is then suitable, therefore, for withstanding a plurality of bending cycles without being damaged.

Particularly preferably, the luminous means is embodied in flexible fashion such that it can be wound up onto a roll and be unwound from the roll without being damaged in the process.

In accordance with at least one embodiment of the luminous means, the encapsulation of the luminous means is embodied in flexible fashion. In this case, flexible means, inter alia, that the encapsulation can be bent to a certain degree without the encapsulation being damaged in the course of bending. The flexible encapsulation is for example a thin glass layer, a laminate or a thin layer—for example a film—composed of a plastic or a metal. Furthermore, the flexible encapsulation can be a thin-film encapsulation such as has been described further above. The thin-film encapsulation preferably comprises at least one barrier layer such as has been described further above.

In accordance with at least one embodiment, the flexible encapsulation is embodied in light-transmissive fashion, that is to say that the flexible encapsulation is transmissive at least to a part of the light generated in the organic layer stack of the luminous means, such that this part of the light can leave the luminous means through the flexible encapsulation.

In accordance with at least one embodiment of the luminous means, the substrate of the luminous means is flexible. In this case, flexible means, inter alia, that the substrate can be bent to a certain degree without the substrate being damaged in the course of bending.

In accordance with at least one embodiment of the luminous means, the substrate is formed from a metal. The substrate then preferably comprises at least one of the following materials: aluminum, high-grade steel, gold, silver. It proves to be particularly advantageous when using a metallic substrate as the substrate for the luminous means inter alia that the good reflectivity of the metal can contribute to an increase in the light power of the luminous means. At least a part of the light which impinges on the metallic substrate from the active region of the luminous means during operation of the luminous means can be reflected from said substrate in the direction of the light-emitting front side of the luminous means.

Preferably, the metal is embodied in flexible fashion. For this purpose, the substrate can be embodied as sheet metal. The substrate is then preferably embodied as medium sheet metal having a thickness of at least 3 mm and at most 4.75 mm or as thin sheet metal having a thickness of at most 3 mm.

Furthermore, it is possible for the flexible substrate to be embodied as a metal film. The substrate then preferably has a thickness of at most 1 mm, particularly preferably at most 0.5 mm.

In accordance with at least one embodiment of the luminous means, both the substrate and the encapsulation are embodied in flexible fashion. For this purpose, encapsulation and substrate are preferably embodied in accordance with one of the embodiments described above. By way of example, substrate and/or encapsulation can be embodied as film. Furthermore, it is possible for the substrate to be embodied as film and the encapsulation to be embodied as thin-film encapsulation.

In accordance with at least one embodiment of the luminous means, the luminous means comprises a flexible substrate formed from a metallic material. By way of example, the flexible substrate is embodied as sheet metal. The first electrode of the luminous means is disposed downstream of the first main surface of the flexible substrate. In this case, it is possible for further layers to be arranged between the substrate and the first electrode. By way of example, an electrically insulating layer can be arranged between the substrate and the first electrode, with which at least the first main surface of the substrate is coated. The electrically insulating layer electrically decouples the first electrode from the substrate.

In this embodiment, the organic layer stack of the luminous means is disposed downstream of the first electrode. The organic layer stack is applied for example directly to the first electrode. The organic layer stack comprises an organic layer provided for generating light.

The second electrode succeeds the organic layer stack. The second electrode is applied for example directly to the organic layer stack. The second electrode is preferably embodied in light-transmissive fashion, as described further above.

In this embodiment, a planarization layer—described further above—is disposed downstream of the second electrode. By way of example, the planarization layer is arranged directly on the second electrode. The planarization layer preferably contains an organic material. Furthermore, the planarization layer can contain one of the following materials: scattering centers such as, for example, diffuser particles, luminescence conversion material, color filter material.

A barrier layer succeeds the planarization layer. Preferably, a plurality of barrier layers succeed the planarization layer. The barrier layers, as part of a thin-film encapsulation, form the flexible encapsulation of the luminous means and are applied for example directly to the planarization layer.

In accordance with at least one embodiment, the substrate of the luminous means is embodied as a plastic film. That is to say that the substrate has a thickness of preferably at most 1 mm, particularly preferably at most 0.5 mm, and contains or consists of a plastic.

In accordance with at least one embodiment of the luminous means, the luminous means comprises a flexible substrate embodied as a film, preferably as a plastic film. In this case, the plastic film can consist of a plastic or contain a plastic. By way of example, it is possible for the substrate to comprise a metal film as a basic body, which film is coated with a plastic material.

Particularly preferably, the plastic film consists of a light-transmissive plastic which is transmissive to at least a part of the light generated in the organic layer stack of the luminous means during operation.

A first electrode is disposed downstream of the first main surface of the plastic film. Preferably, the first electrode is applied directly to the first main surface of the substrate—that is to say the film. In this case, the first electrode is preferably embodied in light-transmissive fashion, as described further above.

The organic layer stack of the luminous means is disposed downstream of the first electrode. By way of example, the organic layer stack is applied directly to the first electrode. The organic layer stack comprises an outermost organic layer. The outermost organic layer is doped with a dopant. Preferably, the dopant of the doped layer—as described further above—involves the largest possible atoms or molecules which, in the case of an n-type dopant, are suitable for releasing electrons and, in the case of a p-type dopant, are suitable for releasing holes. Furthermore, the dopant preferably has a low diffusion constant within the organic layer stack, as is generally the case for example for large atoms or molecules. In this case, cesium, inter alia, is a particularly suitable dopant.

The second electrode is disposed downstream of the organic layer stack. The second electrode is preferably applied directly to the organic layer stack. In this case, the second electrode is embodied in light-transmissive fashion—as described further above. In this embodiment, the luminous means is preferably free of any getter material.

In accordance with one embodiment of the luminous means, the latter comprises a flexible encapsulation. Preferably, the flexible encapsulation is light-transmissive, that is to say that it is transmissive at least to a part of the light generated in the active region during the operation of the luminous means.

In this case, the luminous means makes use of the idea, inter alia, that a flexible luminous means comprising a light-transmissive substrate, light-transmissive first electrode, light-transmissive second electrode and light-transmissive encapsulation can be used particularly diversely. By way of example, a luminous means embodied in this way can be used as a light-transmissive enclosure of other luminous means—for instance as a lampshade for an incandescent lamp. The light generated by the incandescent lamp can largely penetrate through the flexible, light-transmissive luminous means. By means of the luminous means, light of a different color can be admixed with the light from the incandescent lamp.

In accordance with at least one embodiment of the luminous means, the substrate is embodied as a laminate. Preferably, the substrate is embodied in flexible fashion in this case. The laminate preferably comprises at least a first layer and at least a second layer. Particularly preferably, in this case the material from which the first layer is formed differs from the material from which the second layer is formed.

In accordance with at least one embodiment of the luminous means, the substrate of the luminous means is formed as a laminate comprising a first layer consisting of a plastic. A second layer consisting of a glass is applied to the first layer. Preferably, a third layer consisting of a plastic is applied directly to the second layer. Particularly preferably, the third layer consists of the same plastic as the first layer. That is to say that the substrate is embodied as a plastic-glass-plastic laminate in accordance with this embodiment.

Preferably, the laminate is embodied in flexible fashion. For this purpose, the plastic layers are embodied as film or thin coating of the glass basic body. The glass basic body is formed by a thin, flexible glass pane.

In accordance with at least one embodiment of the luminous means, the luminous means has a flexible plastic-glass-plastic laminate as substrate. A first electrode succeeds the substrate. In this case, the first electrode is applied directly to the first main surface of the substrate.

The organic layer stack of the luminous means is disposed downstream of the first electrode. The organic layer stack is applied for example directly to the first electrode. The organic layer stack comprises an organic layer provided for generating light.

The second electrode succeeds the organic layer stack. The second electrode is applied for example directly to the organic layer stack. The second electrode is preferably embodied in light-transmissive fashion, as described further above.

A planarization layer—described further above—is disposed downstream of the second electrode. By way of example, the planarization layer is arranged directly on the second electrode. The planarization layer preferably contains an organic material. Furthermore, the planarization layer can contain one of the following materials: scattering centers such as, for example, diffuser particles, luminescence conversion material, color filter material.

A barrier layer succeeds the planarization layer. Preferably, a plurality of barrier layers succeed the planarization layer. The barrier layers, as part of a thin-film encapsulation, form the flexible encapsulation of the luminous means and are applied for example directly to the planarization layer.

In accordance with at least one embodiment of the luminous means, the substrate is formed by the slat of a louver. That is to say that the slat of a louver serves as substrate for the luminous means. Preferably, all the slats of the louver then serve as a substrate for a respective luminous means. The louver is fitted for example to a window or a door in such a way that the first main surfaces of the substrates formed by the slats of the louver are directed into the interior of the room having the window or the door. The louver can then be used, in the case of a closed louver, for example, for illuminating the interior with a light—preferably similar to sunlight.

In accordance with at least one embodiment of the luminous means, an adhesive layer is applied to the second main surface of the substrate remote from the first main surface of the substrate of the luminous means. The adhesive layer is preferably covered by a protective film prior to the fixing of the luminous means at its intended location. The luminous means can be permanently fixed at its intended location after the stripping of the protective film in the sense of a transfer or adhesive image. In this case, the adhesion is promoted by the adhesive layer on the second main surface of the substrate. In particular, a luminous means configured in flexible fashion—such as has been described further above for example—is suitable in this case since, in this way, the luminous means can be stuck even on uneven surfaces, for example rounded or curved surfaces.

In accordance with at least one embodiment of the luminous means, the luminous means comprises at least one first color subregion. The first color subregion is suitable for emitting light of a first color. Furthermore, the luminous means comprises at least one second color subregion. The second color subregion is suitable for emitting light of a second color, which is different from the first color. That is to say that the luminous means comprises at least two color subregions which are in each case suitable for emitting light of mutually different colors.

A luminous means comprising at least two color subregions is also called "multicolored" in the present case. The color subregions of a multicolored luminous means can be arranged as desired with respect to one another, for example alongside one another or vertically one above another.

In this case, it is furthermore possible for the luminous means to comprise a plurality of first color subregions. The first color subregions are in each case suitable for emitting light of the first color. The luminous means can then furthermore comprise a plurality of second color subregions which are in each case suitable for emitting light of the second color.

In this case, the luminous means is based on the idea, inter alia, of making possible, by means of the division into at least two color subregions, a luminous means which can emit light of at least two different colors.

It is also possible, moreover, for the luminous means to be suitable for emitting mixed light of the two different colors. This means that an observer perceives mixed-colored light and the individual color subregions cannot be differentiated. This can be achieved for example by the dimensions of color subregions arranged laterally alongside one another being chosen to be sufficiently small, or by the color subregions being arranged vertically one above another. In this case, the first and the second color subregions of the organic layer stack can emit light simultaneously or sequentially in short succession.

In accordance with at least one embodiment of the luminous means, the color subregions are arranged in a common plane. That is to say that the color subregions are arranged laterally alongside one another or laterally at a distance from one another. The color subregions can be arranged for example in the manner of pixels of a display apparatus. In comparison with pixels of a display apparatus, however, the color subregions have a larger luminous surface area. Preferably, the luminous surface area of each color subregion of the luminous means is at least one square millimeter.

If the color subregions are arranged in a common plane, a color subregion is formed for example by dividing the active region of the substrate into different subregions, wherein each subregion of the substrate is assigned to a color subregion. A first electrode is applied to the subregions, the organic layer stack being situated on said first electrode. Furthermore, the second electrode is applied to the organic layer stack. At least one of the electrodes can be structured in this case, preferably in a manner corresponding to the subregions. In this case, a structuring of at least one electrode can enable the individual color subregions to be driven separately.

Furthermore, the organic layer stack can be structured in a manner corresponding to the subregions, preferably in such a way that each subregion of the substrate comprises a separate organic layer stack.

In accordance with one embodiment of the luminous means, in this case the organic layer stacks of different color subregions comprise in each case mutually different light-generating layers which differ with regard to their emitter material and which are suitable for generating light of different colors.

In accordance with at least one embodiment, the subregions of the substrate which correspond to the color subregions are separated from one another by webs. The webs preferably comprise an electrically insulating material, for example a photoresist.

In accordance with at least one embodiment of the luminous means, the color subregion of the luminous means comprises a color filter. The color filter is suitable for filtering light from a specific wavelength range. This means that light from this wavelength range is at least partly absorbed by the color filter. In this way, from white light, for example, a first color component can be filtered and a second color component can radiate through the color filter essentially unimpeded. The color subregion comprising the color filter then substantially emits light of the second color component.

The color filter is embedded for example in the form of particles of one or more color filter materials into a matrix material.

In particular color subregions which are arranged within one plane can expediently comprise a color filter. In this case, the color filter is generally arranged between the first electrode and the underside of the luminous means if the luminous means is provided for emitting light from its underside, and between the second electrode and the top side of the luminous means if the luminous means is provided for emitting light from its top side. If the luminous means is provided for emitting light from its top side and from its underside, then a color filter can also respectively be provided between the first electrode and the underside and also between the second electrode and the top side. The color filter of the color subregion can be applied to the substrate for example within a subregion of said substrate. Furthermore, the color filter can also be arranged on the outer side of the substrate within a region of the substrate that corresponds to the subregion, or within a region of the encapsulation that corresponds to the subregion.

In accordance with at least one embodiment of the luminous means, the luminous means comprises a first color subregion comprising a first color filter, and a second color subregion comprising a second color filter, wherein the first color filter is different from the second color filter. In this way, the same organic emitter material can be used for the two color subregions. The color of the light emitted by the color subregions is then determined by the respective color filter of each color subregion. In this way, a luminous means comprising a first color subregion and a second color subregion is realized, wherein the first color subregion emits light of a first color and the second color subregion emits light of a second color and the first color is different from the second color. By way of example, the layer of the organic layer stack that is provided for generating light is suitable for emitting white light. The color filters then filter different color components from said white light.

An emitter material suitable for emitting white light is described for example in the document D. Buchhauser et al., "Characterization of White-Emitting Copolymers for PLED-Displays", Proc. of SPIE, Vol. 5519, pp. 70-81, (2004), the disclosure content of which in this respect is hereby incorporated by reference. The emitter material described here is a broadband emitter based on a polymeric material which comprises copolymers. The copolymers comprise as backbone polyspirobifluorenes suitable for emitting light from the blue spectral range. Green emitting and red emitting units are furthermore covalently coupled to the polyspirobifluorenes.

In accordance with at least one embodiment of the luminous means, the luminous means comprises at least one color subregion which contains a luminescence conversion material. The luminescence conversion material is suitable for converting light from a first wavelength range into light from a second wavelength range, wherein the first wavelength range is different at least in places from the second wavelength range. In this case, the luminescence conversion material is preferably provided for downward conversion. This means that the luminescence conversion material absorbs light of at least a first wavelength comprised by the first wavelength range and re-emits light of at least a second wavelength comprised by the second wavelength range, wherein the first wavelength is lower than the second wavelength. Suitable luminescence conversion materials are for example the organic and inorganic materials that have already been described above in connection with the planarization layer.

In accordance with at least one embodiment of the luminous means, the luminous means comprises at least two color subregions which each comprise a luminescence conversion material, wherein mutually different color subregions comprise mutually different luminescence conversion materials. By way of example, the active region comprises a first color subregion comprising a first luminescence conversion material, and a second color subregion comprising a second luminescence conversion material, wherein the first luminescence conversion material is different from the second luminescence conversion material. In this way, the first color subregion is suitable for emitting light of a first color and the second color subregion is suitable for emitting light of a second color, wherein the first color is different from the second color.

In particular color subregions which are arranged within one plane can expediently comprise a luminescence conversion material. In this case, the luminescence conversion material is generally arranged between the first electrode and the underside of the luminous means if the luminous means is provided for emitting light from its underside, and between the second electrode and the top side of the luminous means if the luminous means is provided for emitting light from its top side.

If the luminous means is provided for emitting light from its top side and from its underside, then a luminescence conversion material can also respectively be provided between the first electrode and the underside, and also between the second electrode and the top side. The luminescence conversion material of the color subregion can be applied to the substrate for example within a subregion of said substrate. Furthermore, the luminescence conversion material can also be arranged on the outer side of the substrate within a region of the substrate that corresponds to the subregion, or within a region of the encapsulation that corresponds to the subregion.

In accordance with at least one embodiment of the luminous means, the color subregions of the luminous means are arranged vertically one above another. Each color subregion comprises at least one organic layer of the layer stack of the luminous means which is suitable for generating light. The different layers of the organic layer stack which are provided for generating light can then differ from one another for example with regard to an emitter material.

In accordance with at least one embodiment of the luminous means, different color subregions of the luminous means comprise different emitter materials. That is to say that the first color subregion comprises a first organic emitter material. The second color subregion then comprises a second organic emitter material, wherein the first organic emitter material is different from the second organic emitter material. On account of the different emitter materials, the different color subregions are then suitable for generating light of mutually different colors.

In accordance with at least one embodiment of the luminous means, the luminous means comprises at least one third color subregion which is suitable for emitting light of a third color, wherein the third color is different from the first color and the second color. That is to say that the luminous means comprises at least three different color subregions which in pairs emit light of different colors. Preferably, the luminous means then comprises a plurality of third color subregions which are in each case suitable for emitting light of the third color.

In accordance with at least one embodiment, the luminous means comprises at least one fourth color subregion which is suitable for emitting light of a fourth color, wherein the fourth color is different from the first color, the second color and the third color. That is to say that the luminous means comprises at least four different color subregions which in pairs emit light of different colors. Preferably, the luminous means then comprises a plurality of fourth color subregions which are in each case suitable for emitting light of the fourth color.

In accordance with at least one embodiment of the luminous means, the luminous means comprises more than four different color subregions, wherein the different color subregions differ from one another in terms of the color of the light emitted by them.

In accordance with at least one embodiment of the luminous means, the luminous means comprises at least one color subregion which is suitable for emitting white light. Preferably, the luminous means comprises a plurality of color subregions which are in each case suitable for emitting light of white color.

In accordance with at least one embodiment of the luminous means, color subregions of the luminous means which are of identical type can be driven jointly. In this case, color subregions of identical type should be understood to mean color subregions which are constructed identically and are thereby suitable for emitting light of identical color. Color subregions of identical type are distinguished for example by the same organic emitter material and/or the same color filter and/or the same luminescence conversion material. By way of example, all the first color subregions, which are suitable emitting light of the first color, can be driven jointly.

Can be driven jointly means that said color subregions can be energized at identical times. The same color subregions can then be energized with the same current intensity for example for identical times, for identical time durations. This can be achieved for example by color subregions of identical type being electrically connected to one another. By way of example, one of the electrodes of the luminous means is then structured in such a way that all the color subregions of identical type are electrically conductively connected to one another by means of this electrode.

In accordance with at least one embodiment of the luminous means, color subregions that are not of identical type can be driven independently of one another. That is to say that for example the first and the second color subregion can be energized independently of one another, such that the first color subregion is energized at first times and the second color subregion is energized at second times. By way of example, all the first color subregions and all the second color subregions can be energized alternately, such that the luminous means is suitable for alternately emitting light of the first and of the second color. Upon simultaneous operation of the first color subregion and the second color subregion, the luminous means then emits light, for example mixed light, of the first and second colors.

In accordance with at least one embodiment of the luminous means, the luminous means comprises a controller provided for setting the operating state of the luminous means. The controller can be a switch, for example, by which the luminous means can be switched on and off. Preferably, however, the controller is suitable for setting more than two operating states of the luminous means. By way of example, the controller can be suitable for driving different color subregions of the luminous means separately from one another.

In accordance with at least one embodiment of the luminous means, the controller comprises a microcontroller.

In accordance with at least one embodiment of the luminous means, the controller is arranged on the first main surface of the substrate of the luminous means. The controller can then be a separate component, for example, which is arranged at a distance from the organic layer stack of the luminous means on the first main surface of the substrate. Furthermore, it is possible for the controller to contain at least one organic material and to be produced jointly with the layer stack of the luminous means. This enables a particularly space-saving and cost-effective integration of the controller into the luminous means.

In accordance with at least one embodiment of the luminous means, the controller is encapsulated together with the organic layer stack of the luminous means in a common encapsulation. This proves to be particularly advantageous if the controller contains an organic material as described above.

The encapsulation of the luminous means protects the controller against damage owing to atmospheric gases, moisture and mechanical loading. A controller which is encapsulated jointly with the organic layer stack of the luminous means and which contains an organic material enables, inter alia, an advantageously compactly constructed, flexible luminous means. In particular, one of the encapsulations described further above such as caps, thin plates, films or a thin-film encapsulation is appropriate as encapsulation.

In accordance with at least one embodiment of the luminous means, the controller is provided for driving at least two color subregions of the luminous means independently of one another. The controller is then suitable for energizing two different color subregions of the luminous means at different times, for different time durations and/or with current of different intensities.

In accordance with at least one embodiment of the luminous means, the controller comprises a pulse width modulation circuit. The pulse width modulation circuit is suitable for applying a pulse-width-modulated signal to the active region and/or color subregions of the active region of the luminous means.

A pulse-width-modulated signal is an electrical signal, preferably a rectangular signal, a sawtooth signal, a triangular signal, or a sinusoidal signal, which is switched on for a specific time $t_{on}$ within a fixed basic period and is switched off for the remaining duration of the basic period $t_{off}$. The duration for which the signal is switched on is also referred to as pulse duration in the present case. The value of the signal during the pulse duration is furthermore also referred to as pulse height in the present case. The ratio of switched-on time and basic period $t_{on}/(t_{on}+t_{off})$ is referred to as duty ratio. It specifies the percentage temporal proportion over which the rectangular signal is switched on within the basic period.

The pulse height, pulse duration and/or direction of the pulse-width-modulated signal therefore changes periodically, for example. In this case, the pulse duration, the spacing between the pulses and also the pulse height can preferably be set. Furthermore, the reverse voltage level and the frequency can also be set. These parameters of the pulse width modulation circuit can be set for example by a microcontroller that is part of the controller.

In accordance with at least one embodiment of the luminous means, the controller can be regulated by a user. The user can then set for example the parameters of the pulse width modulation circuit of the controller.

In accordance with at least one embodiment of the luminous means, the color of the light emitted by the luminous means can be set by means of the controller. By way of example, for this purpose the controller energizes specific color subregions of the luminous means, thus resulting in the desired color impression of the light emitted by the luminous means.

This is possible in a particularly simple manner for example when the luminous means comprises a first and a second color subregion which are reverse-connected in parallel with one another. By energizing the organic layer stack with current of a first direction, the first color subregion is then operated in the forward direction and the second color subregion is connected in the reverse direction for this time, such that no current flows through the second color subregion. By simply changing the current direction, the second color subregion is energized in the forward direction for a second time, such that light of the second color is emitted by the luminous means. The first color subregion is connected in the reverse direction for the second time period, such that no current flows through the first color subregion.

In accordance with at least one embodiment of the luminous means, the color and brightness of the light emitted by the luminous means are dependent on the current density of the current with which the luminous means is energized. For this purpose, the luminous means has for example at least two color subregions which are preferably arranged vertically one above another. The field strength of the electric field generated between the first and second electrodes during operation of the luminous means then determines the color subregion in which a recombination of the charge carriers takes place in the active region of the luminous means. In this way, the color and the brightness of the emitted light can be set for example by the pulse height and the pulse duration of a current flowing through the active region.

In accordance with at least one embodiment, the controller is provided for setting the current density of the current with which the luminous means is energized. That is to say that the controller is preferably suitable for setting the intensity of the current with which the luminous means is energized, and/or the duration of the current with which the luminous means is energized. The color and brightness of the light emitted by the luminous means are then preferably dependent on the intensity of the current with which the luminous means is energized and/or the duration of energization of the luminous means. In this case, it is possible that two, three, four or more colors can be driven independently of one another.

In accordance with at least one embodiment, the luminous means comprises a sensor suitable for determining the color locus and/or the brightness of the light emitted by the luminous means during operation. The sensor can be arranged for example on the first main surface within the active region of the substrate of the luminous means. In particular, it is possible for the sensor to contain an organic material and to be produced together with the organic layer stack of the luminous means. The sensor can then be encapsulated for example together with the organic layer stack of the luminous means by a common encapsulation. The sensor is preferably a photodiode or a phototransistor.

As an alternative, it is possible for the sensor to be embodied as a separate component. The sensor can then be arranged for example on the first main surface or the second main surface of the substrate, remote from the first main surface. In this case, the sensor is not necessarily encapsulated jointly with the organic layer stack of the luminous means.

In accordance with at least one embodiment of the luminous means, the luminous means comprises a controller provided for energizing the luminous means in a manner dependent on the measured values determined by the sensor. That is to say that the controller is suitable for regulating the luminous means in a manner dependent on the color locus and/or the brightness of the light emitted by the luminous means during operation. The luminous means comprises for example an organic layer stack as described above, in which the color of the light emitted by the luminous means is dependent on the current density of the current with which the luminous means is energized. The controller is then suitable for setting a specific color locus and a specific brightness of the generated light by virtue of the fact that said controller readjusts the current density of the current with which the luminous means is energized in a manner dependent on the measured values determined by the sensor. In this way, the controller is suitable for setting a specific color of the light generated by the luminous means by means of a control loop. In this case, the color can be predetermined by a user of the luminous means or a microcontroller of the controller.

In accordance with at least one embodiment of the luminous means, the luminous means comprises at least one connection location which is provided for making electrical contact with the luminous means. The connection location is electrically conductively connected to at least one electrode of the luminous means—for example by means of an electrical lead described further above. Via the connection location, electrical contact can be made with the luminous means from outside the luminous means. The connection location can be electrically conductively connected for example to a voltage source, a current source or a controller.

In accordance with at least one embodiment of the luminous means, the connection location is arranged at the second main surface of the substrate, remote from the first main surface of the substrate of the luminous means. In this case, the connection location is electrically conductively connected to at least one of the electrodes of the luminous means for example by means of vias or perforations in the substrate. As an alternative, it is possible for an electrically conductive connection to be led between the connection location and at least one electrode of the luminous means by way of the side surfaces of the substrate. In this case, it is possible to dispense with vias or perforations in the substrate.

The connection between at least one electrode of the luminous means and the connection location can be effected by electrical leads. The electrical leads are embodied for example as an electrically conductive coating of parts of the luminous means, as conductor tracks integrated into the substrate, or as contact wires.

In accordance with at least one embodiment of the luminous means, at least one connection location of the luminous means is arranged at a side surface of the substrate. The side surface of the substrate preferably connects the first main surface of the substrate to the second main surface of the substrate. For the case where the luminous means has more than one connection location, all the connection locations of the luminous means can be arranged either at a side surface of the substrate or at the second main surface of the substrate. Furthermore, it is possible for connection locations to be situated both at the side surface of the substrate and at the second main surface of the substrate.

In accordance with at least one embodiment of the luminous means, at least one connection location of the luminous means is embodied as a connection pin. The connection pin can be arranged at the second main surface of the substrate or at a side surface of the substrate. The connection pin contains or consists of an electrically conductive material, such as a metal for example.

In accordance with at least one embodiment of the luminous means, at least one connection location of the luminous means is embodied as a connection plug. The connection plug can be arranged at the second main surface of the substrate or at a side surface of the substrate. The connection plug is embodied for example in the manner of a phono plug or in the manner of a jack plug. In this case, it is possible, in particular, for the connection plug to have at least two contact regions which are electrically insulated from one another. The first contact region is then electrically conductively connected to the first electrode of the luminous means—for example by means of first electrical leads. The second contact region is correspondingly conductively connected to the second electrode of the luminous means—for example by means of second electrical leads.

In accordance with at least one embodiment of the luminous means, at least one connection location of the luminous means is embodied as a cutout. The cutout is a hole or a bore, for example, which is introduced into the substrate at a side surface of the substrate or at the second main surface of the substrate.

In this case, the side surfaces of the cutout are embodied in electrically conductive fashion at least in places. The side surfaces of the cutout can be coated in electrically conductive fashion, by way of example.

In accordance with at least one embodiment of the luminous means, at least one connection location of the luminous means is embodied as a socket. The socket can be embodied for example in the manner of a phono socket or a jack socket. The socket then has two electrically conductive contact regions which are electrically insulated from one another. The first contact region is then electrically conductively connected to the first electrode of the luminous means, for example by means of first electrical leads. The second contact region is electrically conductively connected to the second electrode of the luminous means—for example by means of second electrical leads.

In accordance with at least one embodiment of the luminous means, the luminous means has at least one connection location which comprises a plurality of connection pins. The connection location then comprises at least one first connection pin, which is electrically conductively connected to the first electrode of the luminous means. Furthermore, the connection location comprises a second connection pin, which is electrically conductively connected to the second electrode of the luminous means. Moreover, the connection location can comprise further connection pins which, by way of example, are electrically conductively connected to a controller of the luminous means. In this way, it is possible that the controller can be driven from outside the luminous means by means of the corresponding connection pins.

In accordance with at least one embodiment of the luminous means, the luminous means has a controller and a connection location which is electrically conductively connected to the controller. Electrical signals can be conducted to the controller via the connection location. In this way, the controller can be set from outside the luminous means—for example by a user.

In accordance with at least one embodiment of the luminous means, at least one connection location of the luminous means is embodied as a connection rail which extends along a side surface of the substrate. The connection rail is preferably electrically conductively connected to at least one electrode of the luminous means.

The connection rail can be embodied for example in cylindrical fashion or in the manner of a cut-open cylinder. Preferably, the connection rail extends over at least 60% of the length of the side surface of the substrate at which the connection rail is arranged. Particularly preferably, the connection rail extends over at least 80% of the length of the side surface of the substrate at which the connection rail is arranged.

In accordance with at least one embodiment of the luminous means, at least one of the connection locations is provided for the mechanical fixing of the luminous means. The luminous means can be mechanically connected to other luminous means or to a carrier, for example, by means of said connection location. Particularly preferably, the connection location is provided both for mechanical and for electrical fixing of the luminous means. That is to say that, by means of the same connection location, electrical contact is made with the luminous means and the latter is mechanically connected to some other luminous means or a carrier.

An illumination device is furthermore specified. The illumination device comprises at least one luminous means such as has been explained in connection with at least one of the embodiments described above.

In accordance with at least one embodiment of the illumination device, the illumination device comprises at least two luminous means which are electrically and mechanically connected to one another. In this case, it is possible for the luminous means to be directly electrically and mechanically connected to one another. However, it is also possible for the luminous means to be electrically and mechanically connected to one another by means of a carrier of the illumination device.

In accordance with at least one embodiment of the illumination device, the illumination device comprises a first luminous means and a second luminous means. The first luminous means has at least one connection location which is embodied as a connection pin. The connection pin is arranged at a side surface of the substrate of the first luminous means. The second luminous means has at least one connection location which is embodied as a cutout in a side surface of the substrate of the second luminous means. The connection pin of the first luminous means engages into the cutout of the second luminous means. The first and the second luminous means are electrically conductively connected to one another by means of their connection locations—the connection pin and the cutout.

The illumination device can furthermore comprise further luminous means which are electrically conductively connected to the first or the second luminous means in the manner described.

In accordance with at least one embodiment of the illumination device, the first and the second luminous means are also mechanically connected to one another by an interference fit by means of the connection locations.

For this purpose, by way of example, a first connection location of the first luminous means is embodied as a connection pin. A second connection location of the second luminous means is then embodied as a cutout. The diameter of the connection pin of the first luminous means is chosen to be greater than or equal to the diameter of the cutout of the second luminous means. By pressing the connection pin of the first luminous means into the cutout of the second luminous means, a mechanically fixed connection between the first and the second luminous means is then produced. Preferably, the first and the second luminous means are mechanically and electrically connected to one another by the connection pin and the corresponding cutout.

In accordance with at least one embodiment of the illumination device, the first and the second luminous means are mechanically connected to one another by a plug connection by means of the connection locations. For this purpose, by way of example, the first luminous means has a first connection location embodied as a connection plug. The second luminous means has a second connection location embodied as a socket. By plugging the connection plug of the first luminous means into the connection socket of the second luminous means, a plug connection is produced by means of which the first luminous means is mechanically connected to the second luminous means. Preferably, the first luminous means and the second luminous means are also electrically connected to one another by means of the plug connection. The plug connection between the first and the second luminous means is preferably embodied in detachable fashion, preferably in such a way that the first and the second luminous means can be detached from one another again by applying a small mechanical force. In this way, by way of example, a defective luminous means can be removed from the illumination device in a simple manner and be replaced by a new luminous means.

In accordance with at least one embodiment of the illumination device, the illumination device comprises a carrier to which the at least one luminous means of the illumination device is mechanically connected.

In accordance with at least one embodiment of the illumination device, the illumination device comprises a carrier to which the at least one luminous means of the illumination device is electrically connected. In this case, it is possible for the luminous means of the illumination device also to be electrically interconnected with one another by way of the carrier.

In accordance with at least one embodiment of the illumination device, the illumination device comprises a carrier to which the at least one luminous means of the illumination device is mechanically and electrically connected. For the case where the illumination device has a plurality of luminous means, the luminous means are mechanically connected to one another by means of the carrier. Furthermore, it is also possible for the luminous means also to be electrically connected to one another by means of the carrier.

In accordance with at least one embodiment, the carrier is embodied as a carrier plate. That is to say that the carrier is formed by a solid body having two main surfaces which lie opposite one another and which are connected to one another by side surfaces.

In accordance with at least one embodiment of the illumination device, the carrier is embodied as a grid. In this case, the carrier can be embodied in the manner of a carrier plate having a plurality of perforations. A carrier having a lowest possible weight is realized in this way.

In accordance with at least one embodiment of the illumination device, the carrier is embodied as a cable system. The carrier then comprises at least two cables which contain an electrically conductive material or consist of an electrically conductive material. Electrical contact can be made with the luminous means of the illumination device by means of the cables of the carrier. By way of example, the cables of the illumination device run parallel or substantially parallel to one another. One or a plurality of luminous means can then be arranged and electrically connected between two respective cables of the carrier.

In accordance with at least one embodiment of the illumination device, the carrier is embodied as a rod system. The carrier then comprises at least two rods which contain an electrically conductive material or consist of an electrically conductive material. Electrical contact can then be made with the luminous means of the illumination device by means of the rods. By way of example, the rods of the illumination device run parallel or substantially parallel to one another.

One or a plurality of luminous means can then be arranged and electrically connected between two respective rods of the carrier.

In accordance with at least one embodiment of the illumination device, at least one luminous means of the illumination device is mechanically and electrically connected to the carrier by means of a connection location embodied as a connection pin. Preferably, all the luminous means of the illumination device are then mechanically and electrically connected to the carrier by means of at least one connection location embodied as a connection pin. For this purpose, the carrier can have a multiplicity of cutouts, for example. The connection locations of the luminous means which are embodied as connection pins then engage into corresponding cutouts of the carrier. The mechanical connection between the luminous means and the carrier is preferably provided by an interference fit in this case.

In accordance with at least one embodiment of the illumination device, at least one luminous means of the illumination device is mechanically and electrically connected to the carrier by means of at least one connection location embodied as a connection plug. Preferably, all the luminous means of the illumination device are then mechanically and electrically connected to the carrier by means of at least one connection location embodied as a connection plug. For this purpose, the carrier can have a multiplicity of cutouts, for example, which are in each case embodied as connection sockets. The connection plugs of the luminous means then engage into corresponding sockets of the carrier. The mechanical connection between the luminous means and the carrier is preferably embodied in detachable fashion in this case, in such a way that the luminous means can be detached from the carrier by applying small mechanical force. Damaged luminous means can be replaced particularly simply in this way.

In accordance with at least one embodiment of the illumination device, at least one luminous means of the illumination device is mechanically and electrically connected to the carrier by means of at least one connection location embodied as a connection rail. Preferably, all the luminous means of the illumination device are then connected to the carrier by means of at least one respective connection rail. In this case, the carrier is preferably embodied as a cable system or rod system.

By way of example, the carrier comprises two cables or rods which run parallel to one another and which are embodied in electrically conductive fashion. At least one luminous means of the illumination device then comprises at least two connection locations embodied as connection rails. The connection rails run at side surfaces of the luminous means which are remote from one another. Each connection rail engages into a cable or a rod of the carrier, such that the luminous means is arranged between the cables or the rods of the carrier. Preferably, a plurality of luminous means are connected to the carrier in this way.

In accordance with at least one embodiment of the illumination device, the illumination device comprises a first luminous means and a second luminous means, wherein the first and the second luminous means emit light of different colors during operation. In this case, it is possible, on the one hand, for the first and the second luminous means to differ from one another with regard to the organic emitter material used, a luminescence conversion material or a color filter. The first and the second luminous means are then embodied differently, therefore.

However, it is also possible to use, for the first and the second luminous means, luminous means as described further above which are suitable for emitting light of at least a first and a second color during operation. This can be realized as described further above, for example, by the first and the second luminous means each comprising at least two color subregions which are suitable for emitting light of mutually different colors. That is to say that the illumination device comprises at least one multicolored luminous means such as has been described in more detail further above.

In accordance with at least one embodiment of the illumination device, the illumination device comprises a plurality of luminous means which are suitable for emitting light of mutually different colors. That is to say that the illumination devices comprises a multiplicity of multicolored luminous means.

In accordance with at least one embodiment of the illumination device, an optical element comprising a diffuser is disposed downstream of the luminous means of the illumination device in an emission direction of the luminous means. By way of example, in this case the carrier is embodied as a carrier plate. A plurality of luminous means are then applied to the carrier plate, said luminous means being mechanically and electrically connected to the carrier plate. An optical element comprising a diffuser is disposed downstream of that side of the luminous means which is remote from the carrier plate. The optical element can be formed for example by a light-transmissive plate—for example a glass plate—into which light-scattering particles are introduced. As an alternative, it is possible for the surface of the light-transmissive plate to be roughened, such that, on account of light refraction during passage through the plate, a diffuse scattering of the light passing through takes place. The optical element—for example the diffuser plate—can be mechanically fixed to the carrier of the illumination device.

In this case, the optical element disposed downstream of the at least one luminous means of the illumination device is preferably suitable for mixing the light generated by the luminous means in such a way that the modular construction of the illumination device composed of a plurality of luminous means is no longer discernible to an observer. The illumination device then appears as though the illumination device has a single luminous surface, wherein the form and surface area content of the luminous surface are determined by the form and light passage surface of the optical element.

In accordance with at least one embodiment of the illumination device, the illumination device has a multiplicity of luminous means arranged in matrix-like fashion. "Arranged in matrix-like fashion" means that the luminous means are arranged in rows and in columns. The illumination device additionally has a controller suitable for driving each of the luminous means of the illumination device independently of the remaining luminous means. The controller can therefore energize each luminous means of the illumination device with a predeterminable operating current for predeterminable time periods, at predeterminable times.

On account of the matrix-like arrangement of the luminous means and of the controller suitable for driving each of the luminous means independently of the other luminous means of the illumination device, the illumination device is suitable for forming a coarse-grained display apparatus. Each luminous means then corresponds to a pixel of the display apparatus. The illumination device is suitable in this way for use as a coarse-grained display, advertising logo or signal transmitter. The illumination device can furthermore be provided in the sense of a seven-segment display representing numerals and letters. The illumination device is also particularly well suited as emergency lighting that indicates an escape route, for example, using symbols or words.

The luminous means of the illumination device embodied as a coarse-grained display apparatus are preferably mechanically and electrically connected to a carrier by means of connection locations and/or electrically and mechanically interconnected by means of connection locations, as described above.

Particularly preferably, the illumination device embodied as a coarse-grained display apparatus in this case comprises at least one multicolored luminous means which is suitable for emitting light of a first color during a first time period and for emitting light of a second color during a second time period, wherein the first color differs from the second color. This can be made possible for example—as described above—by virtue of the fact that the luminous means has a plurality of color subregions which are suitable for generating light of mutually different colors. As an alternative, it is possible for the color of the light generated by the luminous means during operation to be dependent for example on the current density with which the luminous means is operated.

The use of luminous means which are suitable for emitting light of different colors makes it possible to use the illumination device as a coarse-grained display apparatus which can be used particularly diversely.

In accordance with at least one embodiment of the illumination device, the carrier of the illumination device contains a textile material. The luminous means of the illumination device are then at least mechanically connected to the carrier. The mechanical connection can be imparted for example by a hook-and-loop connection between the textile material and a hook-and-loop layer applied to the second main surface of the luminous means.

Furthermore, it is possible for conductor tracks—for example thin metal wires—to be integrated into the textile material. The conductor tracks can be interwoven for example with the material of the carrier. By means of these conductor tracks, it is possible to make electrical contact with the luminous means of the illumination device by means of the carrier. As an alternative, the luminous means of the illumination device can bear a dedicated power supply in the form of a battery, a rechargeable battery or a capacitor.

The luminous means of the illumination device with the carrier containing a textile material are preferably embodied in flexible fashion. Particularly preferably, the luminous means are embodied in similarly flexible fashion to the carrier. That is to say that the luminous means can largely adapt themselves to a deformation of the carrier on which they are applied—for example by folding.

In accordance with at least one embodiment of the illumination device, the carrier containing a textile material is embodied as a curtain. At least one—for example flexible—luminous means is then applied on the curtain. In this case, it is possible for a large part of that surface of the curtain which faces the at least one luminous means to be covered by the at least one luminous means.

With the curtain drawn, the main surface of the curtain which is covered by the at least one luminous means forms the luminous surface of the illumination device.

By way of example, the curtain is fitted in front of a window. The curtain then forms an illumination device whose luminous surface area corresponds approximately to the area content of the window covered by the curtain. In this way, the illumination device realizes room lighting corresponding to the window in terms of size and direction of light incidence. A room with such a curtain is preferably illuminated with light similar to daylight by the illumination device.

In accordance with at least one embodiment of the illumination device, the carrier containing a textile material is embodied as a garment. At least one luminous means is mechanically fixed on the garment. The mechanical connection can be imparted for example by a hook-and-loop connection between the textile material of the garment and a hook-and-loop layer applied to the second main surface of the luminous means. In this case, the luminous means is preferably embodied in flexible fashion—as described further above—and has a flexibility which corresponds approximately to the flexibility of the garment. Preferably, the luminous means is suitable—as described further above—for generating light of at least two different colors. The luminous means can then serve as a signal apparatus by means of which the wearer of the garment can optically represent information. For this purpose, the luminous means is connected to a controller which can be set by the wearer of the garment.

As an alternative or in addition it is possible for the control means to set the operating state of the luminous means—that is to say for example the color of the light emitted by the luminous means—in a manner dependent on specific measured values. For this purpose, the illumination device comprises at least one sensor which is suitable for determining body functions of the wearer of the garment such as the pulse rate, the skin resistance and/or the body temperature of the wearer. Depending on the values determined, the controller then sets the operating state of the luminous means. The luminous means is then suitable, therefore, for optically reproducing information about body functions of the wearer of the garment.

Furthermore, the illumination device whose carrier is embodied as a garment can serve to improve the visibility of the person wearing the garment—for example in road traffic. Such a garment is particularly well suited to cyclists and pedestrians.

Furthermore, an optical display apparatus is specified. The optical display apparatus comprises an imaging element and at least two luminous means which are embodied in accordance with at least one of the embodiments described above. In this case, the luminous means form a backlighting apparatus for the imaging element.

The backlighting apparatus is preferably embodied like at least one of the illumination devices described further above.

In accordance with at least one embodiment of the display apparatus, the backlighting apparatus of the display apparatus comprises at least two luminous means which are electrically and mechanically connected to one another. In this case, it is possible for the luminous means to be directly electrically and mechanically connected to one another. However, it is also possible for the luminous means to be electrically and mechanically connected to one another by means of a carrier of the backlighting apparatus of the display apparatus. The luminous means of the backlighting apparatus are then mechanically connected and/or electrically connected among one another and/or to a carrier, as described further above, by means of connection locations which can be embodied as connection pins, connection plugs, connection holes, or sockets.

The imaging element of the display apparatus can be an LCD panel, for example. The imaging element is disposed directly downstream of the luminous means of the backlighting apparatus in the emission direction thereof. That is to say that the imaging element is then directly backlit by the luminous means. The modular construction of the backlighting apparatus for the imaging element composed of two or more luminous means enables the backlighting of a particularly large area. A particularly large display apparatus can be realized in this way. Furthermore, defective luminous means of the backlighting apparatus can be replaced particularly simply—on account of the modular construction of the backlighting apparatus of the display apparatus.

In accordance with at least one embodiment of the optical display apparatus, at least one of the luminous means of the display apparatus is suitable for emitting white light during operation. Preferably, all of the luminous means of the backlighting apparatus of the display apparatus are then suitable for emitting white light.

In accordance with at least one embodiment of the display apparatus, the light emitted by the luminous means of the display apparatus during operation is mixed to form white light. That is to say that the display apparatus then comprises for example luminous means suitable for emitting green light, luminous means suitable for emitting red light, and luminous means suitable for emitting blue light. These luminous means are then preferably arranged in such a way that a white color impression is established as a result of the intermixing of the light of the individual luminous means. For this purpose, an optical element comprising a diffuser can be arranged between the luminous means and the imaging element. By way of example, the optical element is a diffuser plate which—as described further above—is suitable for intermixing the light generated by the luminous means.

In accordance with at least one embodiment of the illumination device, the illumination device comprises one of the luminous means described here as a first light source and a further second light source.

The luminous means is in this case preferably embodied in such a way that it is embodied as transmissive at least to the light generated by the organic layer stack and also the light from the second light source.

In accordance with at least one embodiment, the second light source is an incandescent lamp, a light-emitting diode module—"LED module" for short—, at least one individual light-emitting diode—"LED" for short—a cold cathode lamp, a lava lamp, a fluorescent lamp or an organic light-emitting diode—"OLED" for short.

An LED module comprises one or a plurality of LEDs arranged on a carrier. The carrier can be a printed circuit board, for example, such as a metal-core circuit board, for example. Furthermore, an LED module can comprise a beam-shaping optical unit disposed downstream of the LEDs in the emission direction thereof. The beam-shaping optical unit is formed for example at least partly in the manner of one of the following optical elements: compound parabolic concentrator (CPC), compound elliptic concentrator (CEC), compound hyperbolic concentrator (CHC). Furthermore, the beam-shaping optical unit can be a lens.

In accordance with at least one embodiment, the luminous means emits light of a first color and the second light source emits light of a second color, which is different from the first color.

In accordance with at least one embodiment, the luminous means is embodied such that it is dimmable.

In accordance with at least one further embodiment, the second light source is embodied such that it is dimmable.

Dimming of the luminous means and of the second light source can be achieved for example by the use of a PWM circuit that generates pulse-width-modulated signals (PWM signals), or by means of a conventional dimmer.

In accordance with at least one embodiment, the luminous means is embodied in flexible fashion.

In accordance with at least one embodiment, the luminous means is embodied as a lampshade, which is arranged for example around or above the second light source.

In accordance with at least one embodiment, the luminous means and the second light source are arranged with respect to one another in such a way that light from the second light source passes through the luminous means.

An illumination device in which:
the luminous means emits light of a first color and the second light source emits light of a second color, which is different from the first color,
at least one of the two light sources is dimmable, and
the luminous means and the second light source are arranged with respect to one another in such a way that light from the second light source passes through the luminous means, is referred to hereinafter as "color-variable illumination device".

Preferably, the luminous means of the color-variable illumination device is embodied as transmissive to visible light, in particular to the light generated by the organic layer stack and to the light emitted by the second light source.

The color-variable illumination device is suitable for emitting mixed-colored light comprising light from the luminous means and light from the second light source. This affords the advantage that the color locus and brightness of the illumination device can be varied by variation of the color and brightness of the luminous means and/or of the second light source. In this case, either the brightness of one of the light sources—luminous means or second light source—can be kept constant and the brightness of the other light source can be varied or the brightnesses of both light sources can be varied. Thus, the color and brightness of the light from the illumination device can be adapted to a specific situation or mood in a simple manner.

In accordance with at least one embodiment of the color-variable illumination device, the luminous means emits light from the yellow spectral range and the second light source emits light from the blue spectral range. Likewise, it is also conceivable for the luminous means to emit light from the blue spectral range and the second light source to emit light from the yellow spectral range. A color-variable illumination device which emits light having a color locus in the white region of the CIE standard chromaticity diagram is advantageously obtained in this way. By varying the brightness of the second light source and/or of the luminous means—that is to say by adapting the color component of the blue light and of the yellow light in the mixed-colored light of the color-variable illumination device—the color locus of the mixed-colored light of the color-variable illumination device can be varied in wide ranges of the CIE standard chromaticity diagram and, in particular, be adapted to a desired value. In particular, different white tones of the mixed-colored light can thus be set and adapted to the corresponding situation.

Furthermore, the luminous means and the second light source of a color-variable illumination device, alongside yellow and blue, can also have other mutually different colors. If both light sources—luminous means and second light source—are embodied in dimmable fashion, the color of the mixed-colored light of the illumination device can thus be set fluidly from the color of the light from the luminous means to the color of the light from the second light source.

In particular, it is possible in this case for the luminous means to be embodied as a multicolored luminous means comprising at least two color subregions as described further above. Such a multicolored luminous means enables a color-variable illumination device which can generate for example a particularly large number of white tones and/or white light having a high color rendering index (CRI).

In accordance with at least one embodiment of the color-variable illumination device, the luminous means emits light of a first color from the warm white region of the CIE standard chromaticity diagram and the second light source emits light of a second color from the cold white region of the CIE standard chromaticity diagram. It is likewise possible for the luminous means to emit light of a first color from the cold white region of the CIE standard chromaticity diagram and for the second light source to emit light of a second color from the warm white region of the CIE standard chromaticity diagram. The color locus of the mixed-colored light of this color-variable illumination device can be set between cold white and warm white. Such a color-variable illumination device can be used as a light source in the private domain, for example, wherein in work situations for instance cold white light is rather used, which in relaxation phases can be altered by the user rapidly and simply by dimming the cold white light source and increasing the warm white component in the mixed-colored light to form warm white light.

Particularly preferably, the luminous means of the color-variable illumination device is embodied as a lampshade. The latter is arranged around or above the second light source, for example. Particularly preferably, the luminous means is embodied in flexible fashion in this case.

In accordance with at least one embodiment, the luminous means is embodied in flexible fashion in such a way that the form of the luminous means can be altered during the application.

A color-variable illumination device comprising a second light source which serves predominantly for decoration, such as a lava lamp for example, is preferably used for decoration purposes, for example in bars or as floor lighting of dance floors.

Furthermore, color-variable illumination devices can be used for medical purposes in light therapy.

In accordance with at least one embodiment of the illumination device, a light-emitting main surface of the luminous means and a light-emitting front side of the second light source are arranged in a common plane. In this case, the second light source can be an LED module, for example, which is arranged within the radiation-emitting front side of the luminous means. Particularly preferably, the LED module is in this case arranged centrally within the radiation-emitting main surface of the luminous means. Such an arrangement can be used for example as a decoration element.

Storage furniture is furthermore specified. The storage furniture comprises a radiation-emitting component. The radiation-emitting component can be, in particular, a luminous means according to at least one of the embodiments described here. In particular, the storage furniture can also be an illumination device according to at least one of the embodiments described here. That is to say that the storage furniture can have any desired features of the luminous means and illumination devices described here. Embodiments which relate to storage furniture, in particular, are described below. The luminous means and illumination devices described here can also have any desired features of the storage furniture described here.

In the case of a storage surface on which articles or objects are positioned for example for storage or for exhibition, it may be desirable also to illuminate said articles or objects in addition to the possibility of arranging them on the storage surface. In this case, the desire for illumination may have functional and also esthetic reasons. For this purpose, usually in the surroundings of the storage surface, that is to say above or alongside the latter for instance, an illumination device is fitted in such a way that a desired illumination of the storage surface and possibly also of the surroundings is obtained.

Storage furniture in accordance with one embodiment of the invention comprises, in particular, a storage element shaped in planar fashion and having at least one storage surface and at least one radiation-emitting component, having an active region which emits electromagnetic radiation during operation, and at least one holding apparatus for holding the storage element.

In this case, in particular, the storage surface can serve for positioning and/or storing articles on it.

In a further embodiment, the radiation-emitting component is shaped in planar fashion. In this case, "shaped in planar fashion" can mean that the radiation-emitting component extends continuously over an areal region having at least a surface area of a plurality of square millimeters, preferably a plurality of square centimeters and particularly preferably at least one or a plurality of square decimeters or more. In particular a radiation-emitting component shaped in planar fashion can have a surface area which is of the order of magnitude of the storage surface.

In one preferred embodiment, the radiation-emitting component is an organic radiation-emitting component, in particular an organic light-emitting diode (OLED). In this case, an OLED can have an organic layer or a layer sequence having at least one organic layer, having an active region which can emit electromagnetic radiation during operation. Furthermore, an OLED can have a first electrode and a second electrode, wherein the organic layer or the layer sequence having at least one organic layer having the active region can be arranged between the first and second electrodes. In this case, the first and the second electrode can be suitable for injecting "holes" and electrons, respectively, into the active region, which can recombine there with emission of electromagnetic radiation.

Furthermore, the first electrode can be arranged on a substrate. The organic layer or the layer sequence having one or a plurality of functional layers composed of organic materials can be applied above the first electrode. In this case, the functional layers which can comprise the active region can have for example electron transport layers, electroluminescent layers and/or hole transport layers. The second electrode can be applied above the functional layers or above the at least one organic layer.

By way of example, the substrate can comprise glass, quartz, plastic films, metal, metal films, silicon wafers or another other suitable substrate material. By way of example, the substrate can also be embodied as a layer sequence or laminate of a plurality of layers. If the organic radiation-emitting component is embodied as a so-called "bottom emitter", that is to say that the electromagnetic radiation generated in the active region can be emitted through the substrate, then the substrate can advantageously have a transparency to at least a part of the electromagnetic radiation.

In accordance with at least one embodiment, at least one of the electrodes comprises a transparent conductive oxide, a metal or a conductive organic material or consists thereof.

In the bottom emitter configuration, the first electrode can advantageously be transparent to at least a part of the electromagnetic radiation. A transparent first electrode, which can be embodied as an anode and can therefore serve as a material that injects positive charges or "holes", can for example comprise a transparent conductive oxide or consist of a transparent conductive oxide. Transparent conductive oxides "TCO" for short are transparent conductive materials, generally metal oxides, such as, for example, zinc oxide, tin oxide, cadmium oxide, titanium oxide, indium oxide or indium tin oxide (ITO). Alongside binary metal-oxygen compounds such, as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs need not necessarily correspond to a stoichiometric composition and can also be p- or n-doped. As an alternative or in addition, the first electrode can also comprise a metal, for example silver.

The layer sequence having at least one organic layer can comprise polymers, oligomers, monomers, organic small molecules or other organic non-polymeric compounds or combinations thereof. In particular, it can be advantageous if a functional layer of the layer sequence is embodied as a hole transport layer in order to enable an effective hole injection into an electroluminescent layer or an electroluminescent region. Such structures concerning the active region or the further functional layers and regions are known to the person skilled in the art in particular with regard to materials, construction, function and structure and will therefore not be explained in any greater detail at this juncture.

The second electrode can be embodied as a cathode and therefore serve as a material that induces electrons. Inter alia, in particular aluminum, barium, indium, silver, gold, magnesium, calcium or lithium and also compounds, combinations and alloys thereof can prove to be advantageous as cathode material. In addition or as an alternative, the second electrode can also be embodied in transparent fashion. This means, in particular, that the OLED can also be embodied as a "top", that is to say that the electromagnetic radiation generated in the active region can be emitted on that side of the organic radiation-emitting component which is remote from the substrate.

If an electrode which comprises the metallic layer or consists thereof is intended to be embodied as transmissive to the light emitted by the organic layer stack, then it can be advantageous if the metallic layer is made sufficiently thin. Preferably, the thickness of such a semitransparent metallic layer lies between 1 nm and 100 nm, inclusive of the limits.

Furthermore, the first electrode can be embodied as cathode and the second electrode as anode, wherein the organic radiation-emitting component can in this case be embodied as a bottom or top emitter. Moreover, the organic radiation-emitting component can simultaneously be embodied as a top emitter and as a bottom emitter.

Furthermore, the organic radiation-emitting component can have an encapsulation in order to achieve a protection against moisture and/or oxidizing substances such as oxygen, for instance, for the electrodes and/or the functional region. In this case, the encapsulation can surround the entire organic radiation-emitting component including the substrate. As an alternative, the substrate and/or at least one electrode can form a part of the encapsulation. In this case, the encapsulation can comprise one or a plurality of layers, wherein the layers of the encapsulation can be for example planarization layers, barrier layers, water and/or oxygen absorbing layers, connecting layers or combinations thereof.

As an alternative, the radiation-emitting component can be embodied as an electroluminescent film. In this case, an active region comprising an inorganic material, for example based on zinc sulfide, can be arranged between a first and a second electrode. In this case, the electrodes can have features and structures as described in connection with the organic radiation-emitting components. The active region can have a suitable doping, for instance copper or europium.

The electromagnetic radiation generated by the active region of the radiation-emitting component can have in particular a spectrum having wavelengths in an ultraviolet to infrared spectral range. In particular, it can be advantageous if the spectrum has at least one wavelength visible to an observer. The spectrum of the electromagnetic radiation can advantageously also comprise a plurality of wavelengths, such that a mixed-colored luminous impression can arise for an observer. For this purpose, it can be possible that the radiation-emitting component itself can generate electromagnetic radiation having a plurality of wavelengths or that a part of the electromagnetic radiation generated by the organic radiation-emitting component or the entire electromagnetic radiation generated by the radiation-emitting component and having a first wavelength, for instance in a blue and/or green spectral range, is converted into a second wavelength, for instance in a yellow and/or red spectral range, by a wavelength conversion substance. For this purpose, a layer or a region which comprises a wavelength conversion substance can be disposed downstream of the active region. In particular, a wavelength conversion substance structured into partial regions can be disposed downstream of the active region, such that an observer can be given different-colored luminous impressions in different partial regions of the radiation-emitting component. Suitable wavelength conversion substances and layers comprising wavelength conversion substances and also the structurings thereof are known to the person skilled in the art with regard to their construction and their function and will not be explained in any greater detail at this juncture.

In a further embodiment, the first and/or the second electrode of the radiation-emitting component is structured, for example in the form of electrode strips, which can also run parallel to one another. This can mean, in particular, that the first and/or the second electrode has partial regions which can be connected to a current and/or voltage source independently of one another. As a result, the radiation-emitting component can have different operating states depending on the contact-connection of the partial regions of the first and/or second electrode, that is to say that different luminous patterns and luminous distributions of the radiation-emitting component can be generated. Furthermore, by way of example, the active region of the radiation-emitting component, in the case of an organic radiation-emitting component for instance the organic layer or the layer sequence having at least one organic layer, in the different partial regions of the first and/or the second electrode, can comprise in each case different materials and for example also be structured, such that the radiation-emitting component can emit for example electromagnetic radiation having different wavelengths in different operating states. As a result, a different-colored or else a mixed-colored luminous impression can be generated for an observer depending on the contact-connection of the partial regions of the first and/or second electrode to a current and/or voltage source.

In particular, the first electrode can be structured in such a way that it is embodied as parallel strips. In this case, groups of parallel strips can together respectively form partial regions which can be connected to a current and/or voltage source independently of one another. As an alternative or in addition, the second electrode can also be structured in this way. Preferably, the first and the second electrode can in each case be structured as parallel strips, wherein the parallel strips of the first electrode can be perpendicular to the parallel strips of the second electrode. As an alternative, the strips of the first electrode and the strips of the second electrode can also be parallel to one another. In this case, the first and/or the second electrode can have respectively independent partial regions of parallel strips, such that a plurality of illumination patterns can be generated. Furthermore, it can also be possible that, by way of example, the first electrode is embodied in planar fashion and the second electrode is structured in the form of pictograms, or vice versa, such that the luminous impression for an observer can be perceived in conjunction with a pictorial impression.

In a further embodiment, the storage element can have at least partial regions which are transparent to the electromagnetic radiation generated by the radiation-emitting component. In one preferred embodiment, "transparent" can mean that a transparent element or structural part is transmissive at least to a partial region of the spectrum of the emitted radiation of the organic radiation-emitting component. Preferably, "transparent" can also mean transmissive to the entire spectrum. A storage element having at least transparent partial regions can for example comprise glass or transparent plastic or else be composed of glass or a transparent plastic. As an alternative, the storage element can have at least partial regions which are opaque to the electromagnetic radiation generated by the radiation-emitting component. For this purpose, the storage element can comprise opaque glass, an opaque plastic, metal or wood or a combination thereof or be composed of such materials or a combination thereof.

In a further embodiment of the invention, the radiation-emitting component can be a constituent part of the storage element and for example be integrated into the storage element shaped in planar fashion. In this case, it is possible for the radiation-emitting component to be arranged in the interior of the storage element and to emit the electromagnetic radiation emitted during operation toward the outside via one of the outer surfaces of the storage element. Said outer surfaces are then at least partially transparent to the electromagnetic radiation generated by the organic radiation-emitting component.

In a particularly preferred embodiment, the storage element has a glass substrate, on which the radiation-emitting component is fitted, and also a further glass plate, which is arranged on that side of the organic radiation-emitting component which is remote from the glass substrate and which can enable for example an encapsulation or a part of an encapsulation for the radiation-emitting component. In this case, that side of the glass substrate which is remote from the radiation-emitting component or that side of the glass plate which is remote from the radiation-emitting component can have the storage surface. As an alternative, the storage element can also have a plastic substrate and/or a plastic plate.

In particular, the storage element can be embodied as a substrate for a radiation-emitting component. As an alternative, an organic radiation-emitting component comprising a substrate can be applied on the storage element. As an alternative or in addition, the encapsulation of the radiation-emitting component can also be embodied as a storage surface. In particular, the radiation-emitting component can have a radiation exit surface for the electromagnetic radiation generated in the active region. Said exit surface can be at least a part of an outer surface of the storage element. In this case, the outer surface can be the storage surface. This can mean that articles which can be arranged on the storage surface can be illuminated from the storage surface. As an alternative or in addition, the outer surface can for example also be a different side of the storage element than the storage surface. As an alternative or in addition, the exit surface can also be an outer surface arranged on a side remote from the storage surface. This can mean that regions or articles which are situated on the side remote from the storage surface can be illuminated.

In a further embodiment, the storage element has a top side, an underside and side surfaces. In this case, the organic radiation-emitting component can be fitted on at least one of the top sides, the underside and the side surfaces.

In a further embodiment, a holding apparatus has for example a rail, a holding bracket, a carrying arm, a strut, a post, a furniture wall or a combination thereof. In particular, the holding apparatus can also have a plurality of the elements mentioned or a combination thereof. Furthermore, a holding apparatus can also have a radiation-emitting component.

In a further embodiment, the storage element has holding elements by means of which the storage element can be mounted onto the holding apparatus. In one embodiment, "can be mounted" can mean that the storage element can be fixed rigidly to the holding apparatus. Merely by way of example, for instance a screw, clamping or plug connection and also hanging or adhesive bonding shall be mentioned here for a rigid fixing. As an alternative or in addition, "can be mounted" can also mean that the storage element is arranged at the holding apparatus in such a way that it is fixed non-rigidly. Merely by way of example, it shall be mentioned in this regard for instance that the storage element can be placed on the holding apparatus or a part of the holding apparatus. The holding elements can comprise or be in particular for example hooks, eyes, rails, openings, holes, threads or bearing surfaces or combinations thereof.

In a further embodiment, the storage element has at least two electrical contacts for making electrical contact with the radiation-emitting component. In this case, the at least two electrical contacts can preferably be suitable for making contact with the first and/or the second electrode. Particularly preferably, contact is made with the first and the second electrode or partial regions of the first and/or second electrode by different electrical contacts. Furthermore, an electrical line may be necessary for electrically contact-connecting an electrical contact to an electrode or a partial region of a structured electrode. In this case, the electrical contacts can be embodied for example in strip-shaped, round or n-gonal fashion, where n is an integer greater than or equal to 3.

In one preferred embodiment, the holding elements comprise the electrical contacts. As a result, for example the retention of the storage element and the electrical contact-connection of the radiation-emitting component can be realized in a space-saving, compact and/or esthetically pleasing manner.

In a further embodiment, the holding apparatus has mount parts onto which the storage element can be mounted onto the holding apparatus by means of the holding elements of said storage element. In this case, the mount parts can comprise or be for example hooks, eyes, rails, backing surfaces, pegs, screw, plug or clamping connections or angle connectors or combinations thereof.

In a further embodiment, the holding apparatus has at least two electrical lead contacts for making electrical contact with the organic radiation-emitting component, wherein the electrical contacts of the storage element are electrically connected to the electrical lead contacts when the storage furniture is constructed or assembled. Particularly preferably, the mount parts comprise the electrical lead contacts.

In further embodiments, the electrical contacts and the electrical lead contacts can be embodied for example as mutually matching parts of plug, clamping or screw connections. In particular a reliable and stable electrically conductive contact-connection of the radiation-emitting component can thereby be made possible. As an alternative, the electrical contacts and/or the electrical lead contacts can also be embodied as plane contact surfaces or have spring elements.

In a further embodiment, the storage element can have an n-gonal form, where n is an integer greater than or equal to 3. Particularly preferably, the storage element can have a square or rectangular form. Furthermore, the form can also be for example circular or elliptical or a combination of the forms mentioned. In particular, the storage surface of the storage element can have one of the forms mentioned or a combination thereof, in this case particularly preferably for example a square or rectangular form with rounded corners. In this case, a holding element and/or an electrical contact can be arranged in each or at least one corner of the storage element or the storage surface. In particular, the storage furniture can have a holding apparatus, or be contact-connected by a holding apparatus, in each or at least one corner of the storage element or the storage surface.

In particular, the holding apparatus can be suitable for holding the storage element in such a way that at least partial regions of the storage surface are parallel to a floor above which the storage element can be arranged. By way of example, for this purpose the storage furniture can be placeable or installable on the floor. As an alternative or in addition, the holding apparatus can be suitable for holding the storage element in such a way that at least partial regions of the storage surface are substantially perpendicular to a wall at or in front of which the storage furniture can be mounted or installed. In this case, "substantially perpendicular" can mean that the storage surface should be at such an angle with respect to the wall that articles arranged on the storage surface can remain on the latter. Since it may be possible that the wall is not entirely parallel to the direction of gravity, it may therefore be necessary for the angle between the wall and the storage surface to deviate from 90 degrees to a comparable extent.

In a further embodiment, the storage furniture has a plurality of storage elements. Such storage furniture can be for example shelving or a cupboard having a plurality of storage elements. In particular, it can be possible in this case that a radiation-emitting component of one storage element can illuminate the storage surface of another storage element, arranged underneath for example. In this case, the plurality of storage elements can be arranged in such a way that the storage surfaces of the respective storage elements are arranged parallel to one another.

Furthermore, the storage element can form or be comprised by a base of storage furniture. As a result, it can be possible for example that articles which are positioned below or laterally offset with respect to the storage furniture can be illuminated by the radiation-emitting component.

A storage element can be, purely by way of example, an insert base for shelving, a cupboard or a chest of drawers, or else a drawer base, a cupboard base or a wall-mountable storage shelf. In this respect, storage furniture can be for example shelving, a cupboard, a chest of drawers, a drawer, a kitchen cabinet, in particular a wall-mountable upper kitchen cabinet, bath furniture or a bookcase.

BRIEF DESCRIPTION OF THE DRAWINGS

The invention is explained in more detail below on the basis of exemplary embodiments and the associated figures.

FIG. 4B shows a schematic plan view of the substrate of the luminous means in accordance with FIG. 4A, FIG. 4C shows a schematic sectional illustration of a luminous means in accordance with a further exemplary embodiment, FIG. 5A shows a schematic sectional illustration of a luminous means in accordance with a further exemplary embodiment, FIG. 5B shows a schematic illustration of the construction of a light-transmissive luminous means, FIG. 13A shows a schematic perspective illustration of shelving in accordance with one exemplary embodiment, FIG. 13B shows an enlarged excerpt from FIG. 13A, FIG. 18A shows a schematic perspective illustration of a motor vehicle mirror in accordance with one exemplary embodiment, FIG. 18B shows a schematic perspective illustration of the motor vehicle mirror in accordance in FIG. 18A, FIG. 19 shows a schematic perspective illustration of a multi-part mirror in accordance with one exemplary embodiment, FIG. 20 shows a schematic perspective illustration of a multi-part mirror in accordance with a further exemplary embodiment, FIG. 28A shows a schematic plan view of a window with a louver in accordance with one exemplary embodiment, FIG. 28B shows a schematic sectional illustration through a slat of the louver in FIG. 28A, FIG. 62A shows a further schematic perspective illustration of a luminous means in accordance with one exemplary embodiment, FIG. 62B schematically shows an enlarged excerpt from FIG. 62A, FIG. 63A shows a schematic plan view of a luminous means in accordance with a further exemplary embodiment, FIG. 63B shows a schematic enlargement of an excerpt from a connection location of the luminous means in accordance with FIG. 63A, FIG. 64 shows a schematic plan view of an illumination device in accordance with one exemplary embodiment, FIGS. 65 and 67 shows schematic illustrations of a further illumination device in accordance with one exemplary embodiment, FIG. 81 shows a schematic plan view of an illumination device in accordance with a further exemplary embodiment.

DETAILED DESCRIPTION OF THE DRAWINGS

In the exemplary embodiments and figures, identical or identically acting constituent parts are in each case provided with the same reference symbols. The elements illustrated should not be regarded as true to scale; rather, individual elements may be illustrated with an exaggerated size for the sake of a better understanding.

Figure 1:
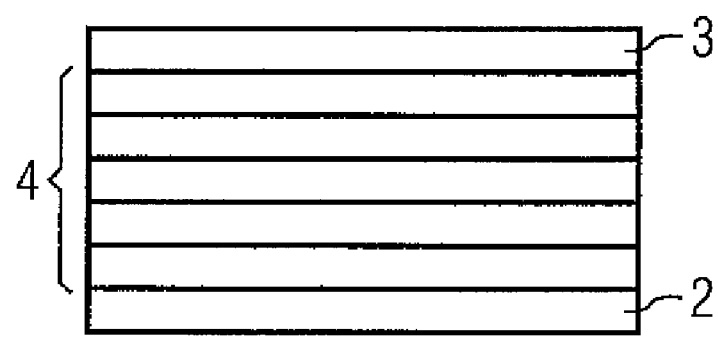
FIG. 1 shows a schematic sectional illustration of an organic layer stack between a first and a second electrode in accordance with one exemplary embodiment.

FIG. 1 shows a schematic sectional illustration of an organic layer stack 4 between a first electrode 2 and a second electrode 3 in accordance with one exemplary embodiment. The first electrode is embodied as transmissive to visible light and comprises a TCO (transparent conductive oxide), for example ITO (indium tin oxide). Furthermore, the first electrode 2 serves as an anode. The second electrode 3 serves as a cathode in the present case. It comprises an aluminum or silver, for example.

An organic layer stack 4 having the following layers is applied on the first electrode 2, wherein the order of the layers that is presented below corresponds to their order within the organic layer stack starting from the cathode: a 1-TNATA layer (1-TNATA=4,4',4''-tris(N(naphth-1-yl)-N-phenylamino)triphenylamine) having a thickness of approximately 40 nm, an sp-TAD layer (spTAD=2,2',7,7'-diphenylaminospiro-9,9'-bifluorene) having a thickness of approximately 20 nm, SEB-010:SEB020 layer having a thickness of approximately 10 nm, a TMM-004:Ir(ppy)3 (15%) layer (Irppy=fac-tris(2-phenylpyridyl)iridium complex) having a thickness of approximately 10 nm and TMM-04:TER012 layer having a thickness of approximately 30 nm. The present organic layer stack is suitable for emitting white light.

Figure 2A:
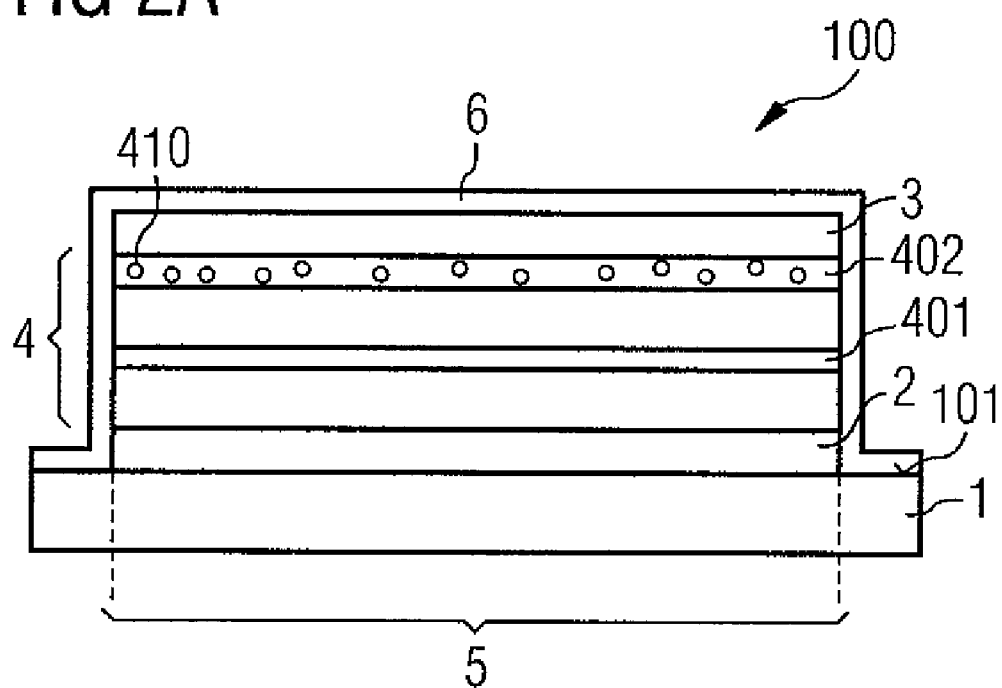
FIG. 2A shows a schematic sectional illustration of a luminous means in accordance with one exemplary embodiment.

FIG. 2A shows a schematic sectional illustration of a luminous means in accordance with one exemplary embodiment. The luminous means comprises a substrate 1 having a first main surface 101, to which the first electrode 2 is applied within an active region 5 of the substrate 1. Arranged on the first electrode 2 is an organic layer stack 4 having at least one layer 401 suitable for generating light, the second electrode 3 being applied to said stack. In the present case, the first electrode 2 on the substrate 1 is the anode and the second electrode 3 on the organic layer stack 4 is the cathode. The organic layer stack 4 has, on its outer side facing the cathode, a doped layer 402 comprising a dopant 410 that functions as an electron donor. The injection of electrons from the cathode into the organic layer stack is advantageously increased thereby. By way of example, cesium, barium or lithium fluoride can be used as dopant 410.

Furthermore, the luminous means in accordance with FIG. 2A comprises a thin-film encapsulation 6. The active region 5 with the organic layer stack 4 is arranged within the thin-film encapsulation 6. The thin-film encapsulation 6 is applied directly to the second electrode 3. A thin-film encapsulation such as can be used for example in the case of the luminous means in FIG. 2A is described for example in conjunction with FIG. 3.

The luminous means in accordance with FIG. 2A is embodied as transmissive to visible light, in particular to a light generated by the organic layer stack 4. For this purpose, the substrate 1 is embodied as transmissive to visible light. It can for example comprise glass or a plastic or consist thereof.

By way of example, the substrate used can be a thin glass lamina or a flexible plastic film which comprises or consists of one of the plastic materials presented in the general part of the description.

The first electrode 2 on the substrate is also embodied as transmissive to visible light. The first electrode 2 can for example consist of or comprise a TCO. The organic material of the organic layer stack 4 is generally embodied as transmissive to visible light. In particular, in the present case the doped layer is embodied as transmissive to visible light. The organic layer stack 4 can comprise for example the layers of the organic layer stack in FIG. 1. The second electrode 3 is likewise embodied as transmissive to visible light, in particular to a light generated by the organic layer stack 4. The second electrode 3 is preferably embodied as the cathode. The latter can comprise a metallic layer, for example, which contains aluminum or silver and has a thickness of approximately 30 nm.

Furthermore, an electrode 2, 3 embodied as transmissive to visible light can comprise a conductive organic material or consist thereof. In this case, by way of example, PEDOT:PSS is suitable as organic electrode material. In this case, PEDOT:PSS can form the anode, for example. In the case of a suitable conductivity doping, however, it is also possible for the cathode to consist of PEDOT:PSS or to contain this material.

Should the conductivity of the electrode material, in particular of the organic material, not suffice to inject enough charge carriers into the organic layer stack, then thin metal tracks can be arranged between the electrode and the organic layer stack.

Figure 2B:
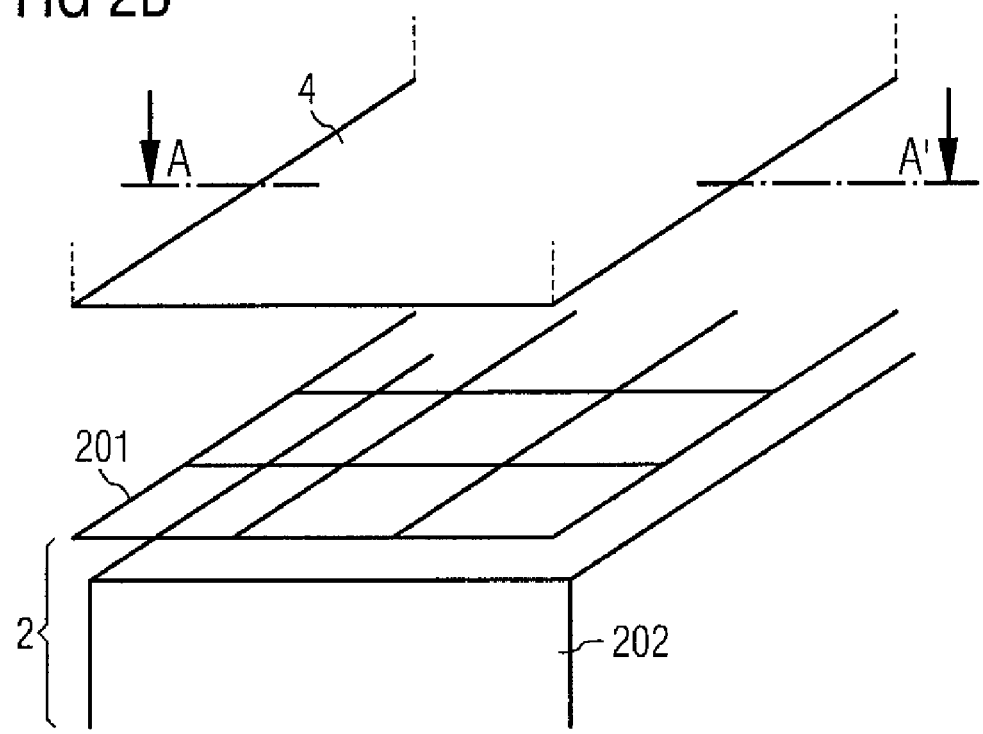
FIG. 2B shows a schematic perspective illustration of an electrode in accordance with one exemplary embodiment.
Figure 2C:
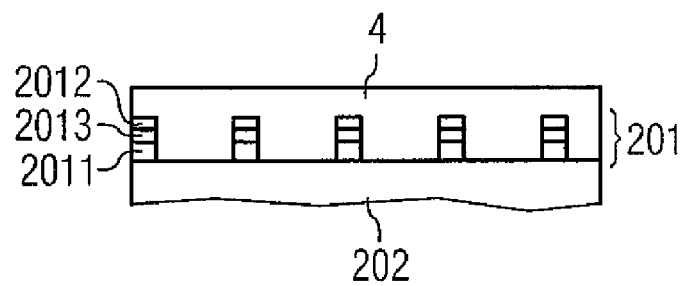
FIG. 2C shows a schematic sectional illustration along the line A-A' in FIG. 2B.

FIG. 2B shows a schematic perspective illustration of an electrode 2 in accordance with one exemplary embodiment, which has a layer comprising organic conductive material and thin metal tracks 201 which are arranged between the organic electrode layer 202 and the organic layer stack 4. FIG. 2C shows a schematic sectional illustration along the line AA' in FIG. 2B.

The metal tracks 201 are embodied in the form of a grid in the case of the present exemplary embodiment. The thickness of the metal tracks is preferably a few µm. The distance between directly adjacent grid points is in this case preferably between 1 mm and 100 mm, inclusive of the limits.

Furthermore, the electrically conductive tracks 201 have a multilayer construction, for example comprising three metallic tracks, as shown in FIG. 2C. The two outer tracks 2011, 2012 are protective layers for the middle layer 2013, for instance against corrosion. They can for example comprise chromium, molybdenum, copper or silver or consist of one of these materials. The middle layer 2013 of the multilayer construction can for example comprise aluminum or consist of aluminum.

In this case, the multilayer construction has a thickness of preferably at least 50 nm and at most 100 nm.

Figure 3:
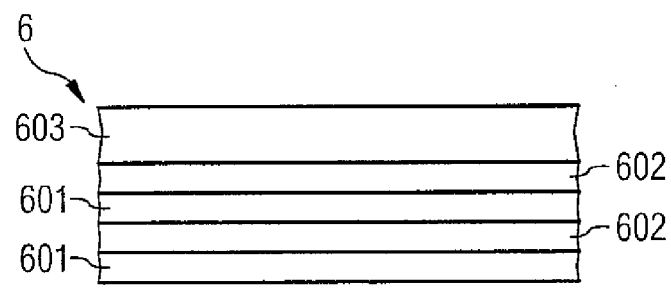
FIG. 3 shows a schematic sectional illustration of a thin-film encapsulation.

Furthermore, the thin-film encapsulation 6 of the luminous means in accordance with FIG. 2A is also embodied as transmissive to visible light, in particular to a light generated by the organic layer stack 4. A schematic sectional illustration through a thin-film encapsulation 6 such as can be used for example in accordance with FIG. 2A is shown in FIG. 3. The thin-film encapsulation 6 comprises here in each case two first barrier layers 601, which comprise silicon oxide or consist of silicon oxide, and two second barrier layers 602, which comprise silicon nitride or consist of silicon nitride. In this case, the first barrier layers 601 and the second barrier layers 602 of the thin-film encapsulation 6 are arranged alternately with regard to their material composition. The thin-film encapsulation 6 preferably has a thickness of between 0.5 and 5 µm, inclusive of the limits.

The barrier layers can for example be vapor-deposited, sputtered or deposited by means of a plasma-enhanced process such as chemical vapor deposition (CVD) on the second electrode. The barrier layers preferably have a thickness of in each case at least 30 nm to at most 300 nm. Particularly preferably, an individual barrier layer is approximately 100 nm thick. Preferably, a thin-film encapsulation comprises at least two to at most eight barrier layers. Typically, the thin-film encapsulation comprises three or four barrier layers.

The thin-film encapsulation can furthermore comprise polymer interlayers such as are described further below in the text with reference to FIG. 17.

Furthermore, a protective lacquer layer 603 is applied to the barrier layers. The protective lacquer layer 603 can be applied for example by means of spin-coating, spraying, blade coating, screen-printing or similar techniques. After application, the protective lacquer layer 603 is cured by supplying heat or UV radiation. Suitable materials for the protective lacquer layer 603 include acrylates, polacrylates, polyimides and similar materials. The thickness of the protective lacquer layer is for example between at least 30 and at most 40 µm.

The luminous means in FIG. 2A is suitable for emitting light simultaneously from a top side and from an underside lying opposite the top side, since the light generated in the organic layer stack 4, on the way to the top side and to the underside, only passes through elements which are embodied as transmissive to visible light.

Figure 4A:
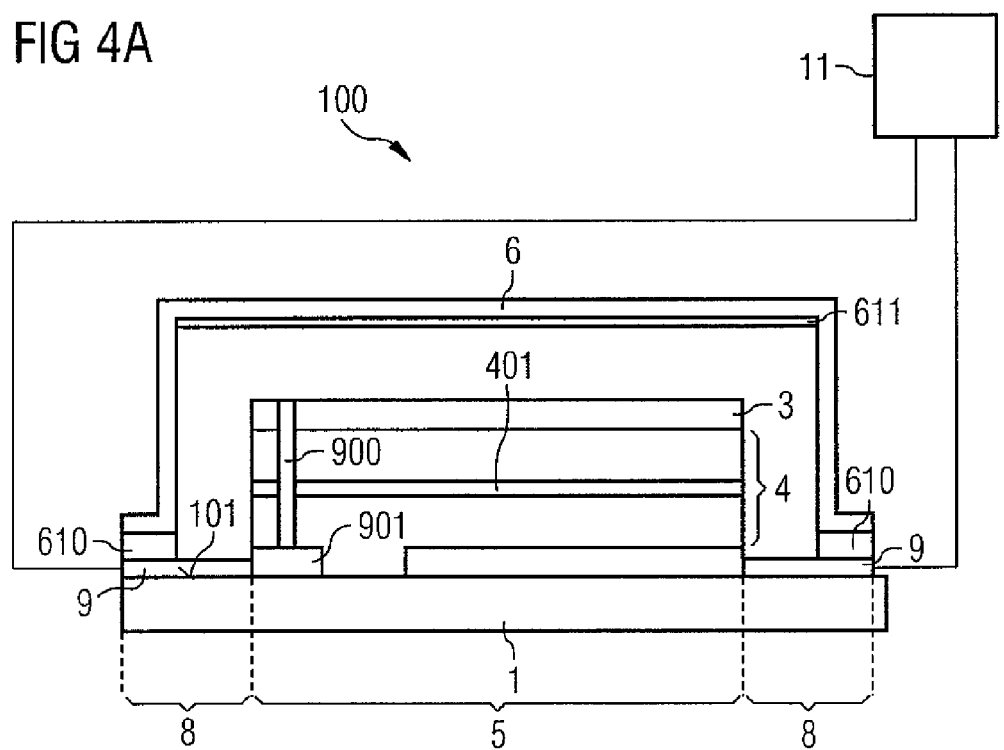
FIG. 4A shows a schematic sectional illustration of a luminous means in accordance with a further exemplary embodiment.

FIG. 4A shows a schematic sectional illustration of a luminous means in accordance with a further exemplary embodiment. The luminous means in accordance with FIG. 4A has a substrate 1 having an active region 5, to which a first electrode 2 is applied. Arranged on the first electrode 2 is an organic layer stack 4 having at least one layer 401 suitable for generating light. A further, second electrode 3 is arranged on the organic layer stack 4. The substrate, the first electrode and the second electrode and also the organic layer stack are in the present case embodied as transmissive to visible light, in particular to a light generated by the organic layer stack 4, as already described for example with reference to FIG. 2A.

The active region 5 of the substrate 1, on which the organic layer stack 4 is arranged between the first 2 and the second 3 electrode, is surrounded by a fixing region. Within the fixing region 8, the substrate 1 comprises electrically conductive leads 9 which are electrically conductively connected to the first electrode 2 and the second electrode 3. The leads 9 to the first electrode 2 can be for example structures of the first electrode 2 which are lengthened right into the fixing region 8. In this case, the electrical leads generally comprise the same material as the first electrode 2. In the present case, the leads 9 to the second electrode 3 are electrically conductively connected to a further electrode structure 901, which is electrically insulated from the first electrode 2, within the active region 5 of the substrate 1, for example by the leads 9 likewise being formed by lengthening of the further electrode structure 901 into the fixing region 8. The second electrode 3 on the organic layer stack 4 is electrically conductively connected to the further electrode structure 901 for example by means of a plated-through hole 900.

Within the fixing region 8, an adhesive layer 610 is arranged above the electrical leads 9, said adhesive layer being used to fix a cap, serving as encapsulation 6, on the substrate. The cap has a cavity above the active region 5 in which the active layer stack 4 is arranged. In the present case, the cap is not in direct contact with the second electrode 3. Furthermore, the cap, like the substrate 1, the first electrode 2 and the second electrode 3 and also the organic layer stack 4, is likewise embodied as transmissive to visible light, in particular to a light generated by the organic layer stack 4. It can be formed for example from glass or one of the light-transmissive plastics already mentioned in connection with the substrate 1 in the general part of the description.

A getter layer 611 is applied on the inner side of the cap facing the organic layer stack, said getter layer being embodied as transmissive to visible light. By way of example, one of the materials described above can be used as getter material. In particular, particles of a getter material—for example calcium oxide—which are embedded into a transparent matrix are suitable for a transparent getter layer 611. By way of example, solvent-free, curable plastic materials are suitable for the matrix. The getter layer 611 preferably has a thickness of at most 300 μm, particularly preferably between at least 50 and at most 100 μm.

The electrical leads 9 on the substrate 1 are electrically conductively connected to a controller 11 in the present case.

FIG. 4B shows a schematic plan view of the substrate 1 in accordance with FIG. 4A. The first electrode 2 and the further electrode structure 901 are arranged within the active region 5. Electrical leads 9 are in each case situated laterally with respect to the active region 5 within the fixing region 8, said electrical leads being embodied in grid-type fashion in the present case. The electrical leads on one side of the substrate 1 are continuations of the further electrode structure 901, while the electrical leads 9 on the other side of the substrate are continuations of the first electrode 2. The electrical leads in the present case comprise a TCO, for example ITO.

Furthermore, it is also possible for the electrical leads 9 to comprise a metal or to consist thereof. By way of example, the leads 9 contain or consist of at least one of the following materials or material combinations: Cr/Al/Cr, Cu/Cr, Mo/Al/Mo; Cr, Cu, Al, Ag, Au, Pt.

If the electrical leads 9 comprise a metal, then the degree of filling of the grid is generally chosen to be so low that the electrical leads are not perceived by an observer. In this way, the electrical leads 9 can advantageously be embodied as transmissive to visible light. In this case, the degree of filling of the grid is preferably less than 10%, particularly preferably less than 2%.

The electrical leads 9 are electrically conductively connected to electrical connection locations 70, in the present case pins 75, which are arranged laterally with respect to the substrate 1. By means of the pins 75, the luminous means can be electrically contact-connected to a socket or, as illustrated in FIG. 4A, be connected to the controller 11.

Figure 4D:
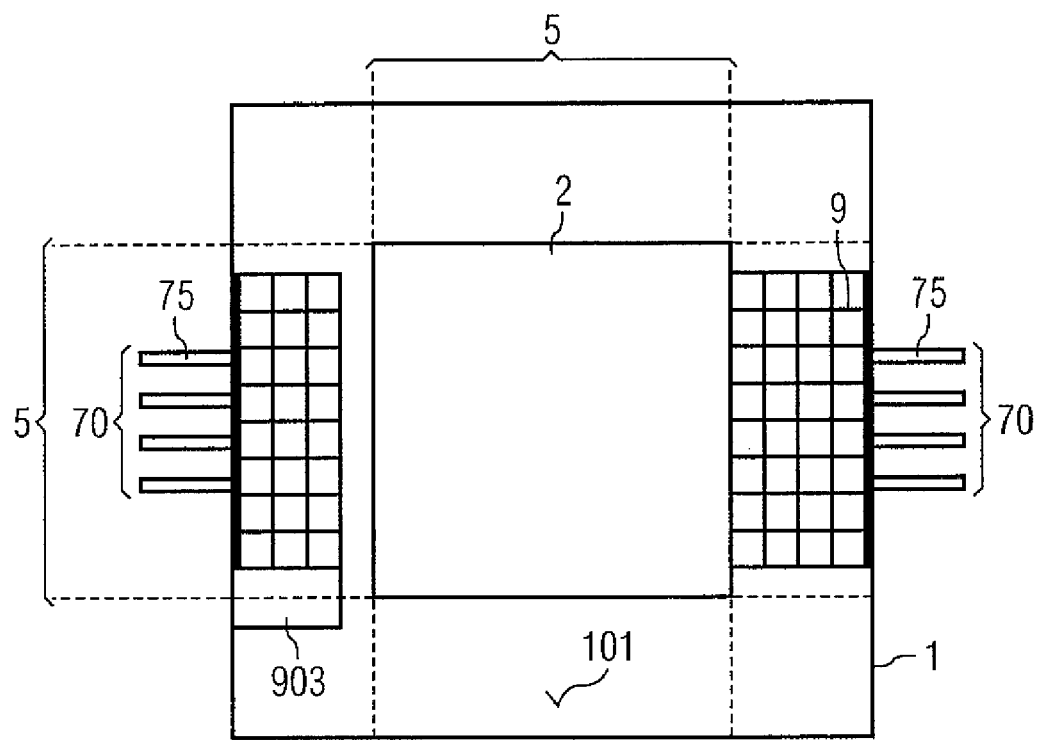
FIG. 4D shows a schematic plan view of the substrate of a luminous means in accordance with FIG. 4C.

FIG. 4C shows a schematic sectional illustration of a luminous means 100 in accordance with a further exemplary embodiment. FIG. 4D shows a schematic plan view of the substrate of the luminous means in accordance with FIG. 4C. The luminous means 100 corresponds to the luminous means in FIGS. 4A and 4B apart from the differences described below.

In contrast to the luminous means in FIGS. 4A and 4B, the organic layer stack 4 has no plated-through hole. Furthermore, the substrate comprises no further electrode structure.

Instead, the first electrode 2 is embodied over the whole area below the organic layer stack 4 within the active region 5 on the substrate 1. Electrical leads 9 which are electrically conductively connected to the first electrode 2 are arranged on one side of the active region 5 within the fixing region. These electrical leads 9 can be for example continued structures of the first electrode 2. On the other side, electrical leads 9 which are not electrically connected to the first electrode 2 are fitted on the substrate 1. Furthermore, the electrical leads on this side comprise a bonding pad 903, on which is arranged a bonding wire 902 that is electrically conductively connected to the second electrode 3.

FIG. 5A shows a schematic illustration through a luminous means 100 in accordance with a further exemplary embodiment. The luminous means 100 comprises a window glazing as substrate 1. A first electrode 2 is applied on the substrate, and an organic layer stack 4 having at least one layer 401 suitable for generating light is furthermore applied to said first electrode. The organic layer stack 4 can be for example a layer stack 4 such as has already been described with reference to FIG. 1. A second electrode 3 is applied to the organic layer stack 4. As encapsulation 6, the luminous means in accordance with FIG. 5A comprises a second window glazing, which is adhesively bonded onto the second electrode 3 by means of an adhesive layer 610. A suitable adhesive is a transparent adhesive, for example. This adhesive is preferably likewise embodied as transmissive to visible light. Examples of suitable adhesives include Nagase or Three-Bond.

Substrate 1, electrodes 2, 3, encapsulation 6, organic layer stack 4 and adhesive layer 610 are embodied as transmissive to visible light. The luminous means 100 is therefore suitable for emitting light from its top side 100A and its underside 100B. Furthermore, an observer can see through the luminous means 100 when it is not in operation. The luminous means is therefore suitable for being used as glazing for example in doors, windows, room dividers, furniture or the like, wherein the glazing can serve as an illumination source.

FIG. 5B shows a schematic illustration of the construction of a luminous means 100 which is embodied such that it is substantially transmissive to visible light and is integrated into the glazing. In the present case, a glass pane having an active region 5, to which a first electrode 2 is applied, serves as the substrate 1. In the present case, the electrode is likewise embodied as transmissive to visible light and comprises a TCO, for example ITO. In order to represent specific forms, for example a lettering or a logo, the first electrode 2 is structured in accordance with the desired form, in the present case in the lettering "Info 1".

Within the active region, an organic layer stack 4, for example such as has already been described in FIG. 1, is applied to the first electrode. A second electrode 3, which is likewise transmissive to visible light and in the present case serves as a cathode, is applied to the organic layer stack. The second electrode 3 is applied to the organic layer stack 4 over the whole area. It is furthermore also conceivable, however, for the first electrode 2 to be applied to the substrate over the whole area and for the second electrode 3 to be applied to the organic layer stack 4 in the form which is intended to embody the luminous surface of the luminous means. A second glass pane as encapsulation 6 is applied to the second electrode 3. In this case, the dimensions of the encapsulation 6 are preferably chosen to be identical to the dimensions of the substrate 1. This gives rise to a glazing having a luminous means 100 whose luminous surface is embodied in the desired manner, for example in the form of a lettering or a logo.

The second glass pane, serving as encapsulation 6, can be fixed on the substrate for example by means of an adhesive layer 610 that is transmissive to visible light. In this case, the adhesive layer 610 can be applied to the substrate and to the second glass pane over the whole area, or only within a fixing region 8 outside the active region 5.

Contact can be made with the active region 5 for example by means of electrically conductive leads 9 such as have been described with reference to FIGS. 4A to 4D.

Figure 6:
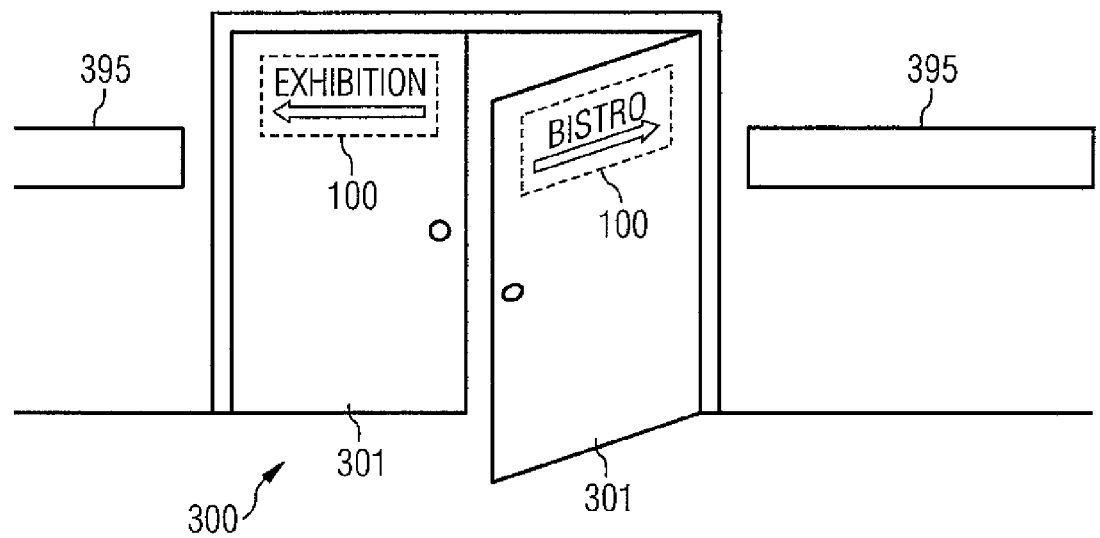
FIG. 6 shows a schematic perspective view of a door in accordance with one exemplary embodiment.

FIG. 6 shows a schematic perspective view of a door 300 in accordance with one exemplary embodiment. The door 300 has two door leaves 301 embodied as transmissive to visible light. They comprise glass for example or are formed from glass. A luminous means 100 embodied as transmissive to visible light is integrated into each door leaf 301. With the aid of the luminous means 100, which in the present case each have a luminous surface that respectively forms an inscription, it is possible to integrate luminous signs in doors 300. Such doors 300 having luminous signs can be used for example in museums, conference centers, hotels or the like. In the present case, the luminous means can either be integrated into the door 300, as already described with reference to FIGS. 5A and 5B, or the luminous means 100 can also be flexible luminous means which are embodied as transmissive to visible light and are fitted on the door by means of an adhesive layer, for example. A flexible luminous means suitable for being adhesively attached is described for example in conjunction with FIG. 9.

If the luminous means 100 are integrated into the door 300, then electrical leads 9 such as have already been described for example in conjunction with FIGS. 4A to 4D can be applied on the substrate 1, that is to say the window glazing on which the first electrode 2 is applied. The electrical leads 9 can be electrically conductively connected for example to connection locations 70 which are embodied as parts of the door hinges, wherein the electrically conductive parts run within the door hinges. For their part, the door hinges can be connected to electrical cables running within the door frame.

Furthermore, FIG. 6 shows emergency lighting 395, which comprises a luminous means 100 described here or an illumination device 1000 described here. The emergency lighting 395 is activated in the event of a power failure, for example, and comprises an autonomous power supply or is supplied with the necessary operating current by an emergency power unit. The luminous means 100 and illumination devices 1000 described here are particularly well suited to use as emergency lighting since they can generate light of sufficient brightness with a relatively low power consumption.

Figure 7:
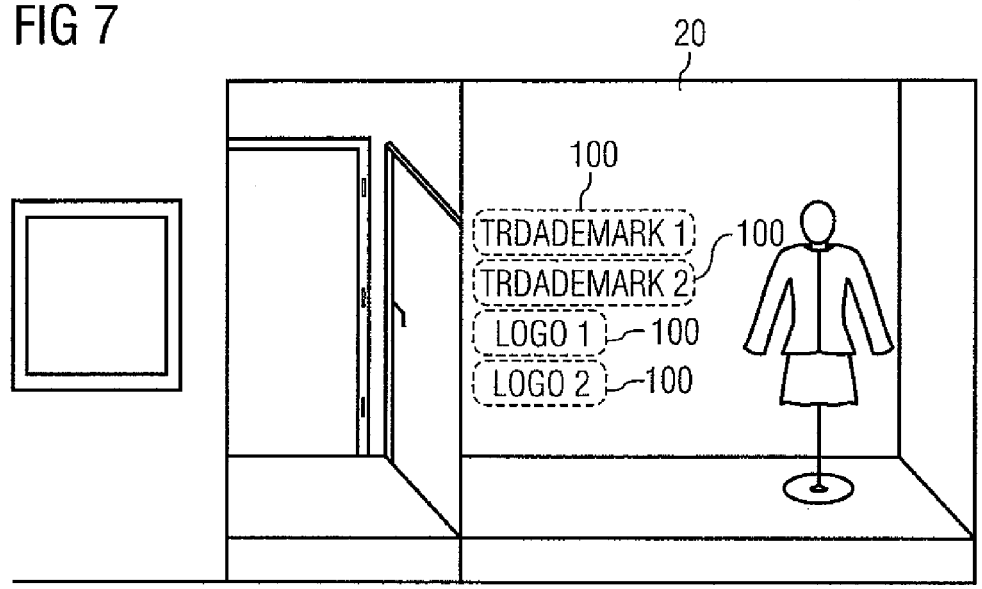
FIG. 7 shows a schematic perspective illustration of a display window in accordance with one exemplary embodiment.

FIG. 7 shows a schematic perspective illustration of a display window in accordance with one exemplary embodiment comprising four luminous means 100 which are embodied as transmissive to visible light. With the luminous means it is possible to display trade names "Trademark 1" and "Trademark 2" and logos "Logo 1" and "Logo 2". As already described in connection with FIGS. 5A and 5B, the luminous means 100 can be luminous means which are integrated into the glazing of the display window, or a flexible luminous means which is adhesively bonded onto the inner side of the glazing by means of an adhesive layer.

Figure 8:
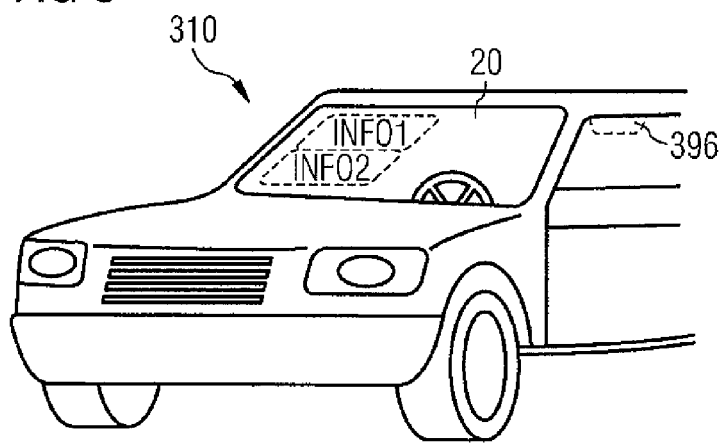
FIG. 8 shows a schematic perspective front view of a motor vehicle in accordance with one exemplary embodiment.

FIG. 8 shows a schematic front view of a motor vehicle 310 in accordance with one exemplary embodiment. In this case, two luminous means 100 are integrated into a window 20, for example the windshield, said luminous means being embodied as transmissive to visible light and being suitable for representing information "Info 1" and "Info 2" for the driver. As an alternative, it is also possible—as already described in connection with FIGS. 7 and 6—for the two luminous means 100 to be embodied in flexible fashion and to be adhesively bonded onto the windshield from inside.

FIG. 8 furthermore shows motor vehicle interior lighting 396. The motor vehicle interior lighting is formed for example by a luminous means 100 described here or an illumination device 1000 described here.

Figure 9:
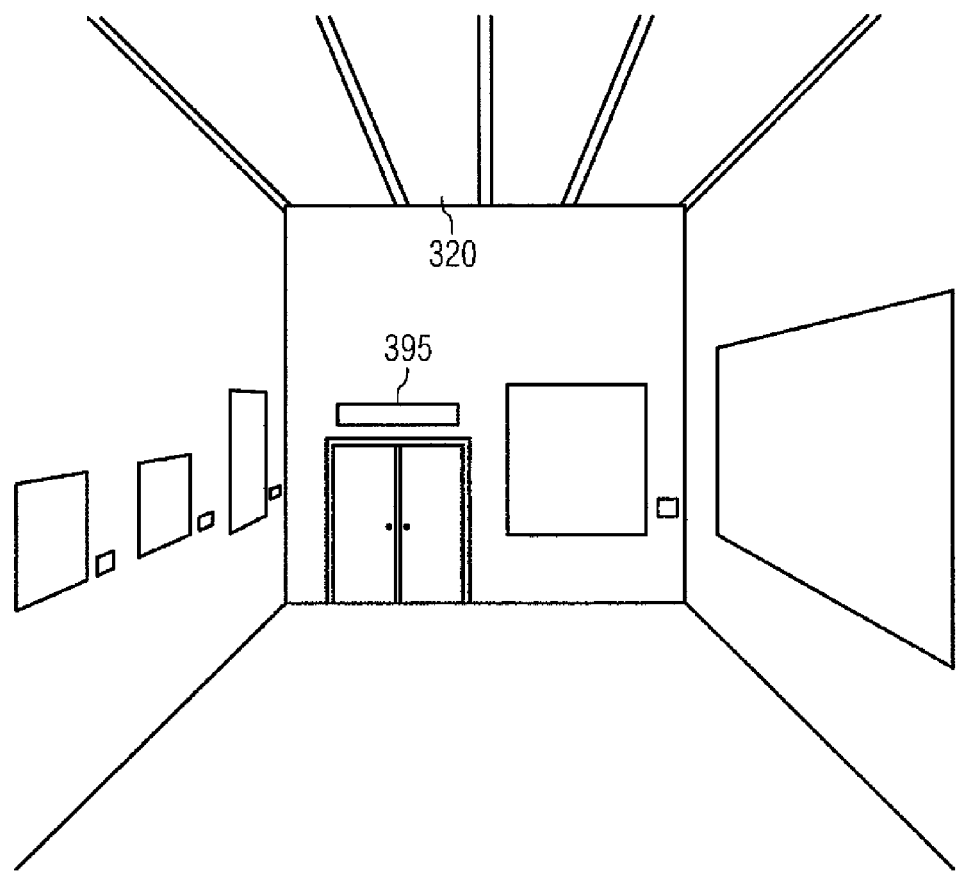
FIG. 9 shows a schematic perspective illustration of a museum room in accordance with one exemplary embodiment.

FIG. 9 shows a schematic perspective illustration of a museum room, the ceiling elements 320 of which comprise a glazing. The glazing of a ceiling element has, over part of the area or over the whole area, a luminous means 100 or an illumination device 1000 which is transmissive to visible light. The glazing can be for example a glazing having an integrated luminous means 100 such as has already been described with reference to FIGS. 5A and 5B. As an alternative, the luminous means can also be applied to the inner side of the glazing, for example by adhesive bonding.

The glazing of the ceiling elements of the museum room in accordance with FIG. 9 is therefore suitable for enabling the room to be illuminated by means of daylight during the day. Under poor light conditions, for example during the night, the luminous means 100 of the glazing can be used as additional light sources for the room.

The glazing of the ceiling elements of the museum room in FIG. 9 can furthermore be configured in milky fashion. For this purpose, either the glazing serving as substrate or the glazing serving as encapsulation or both is or are embodied in milky fashion.

Figure 10:
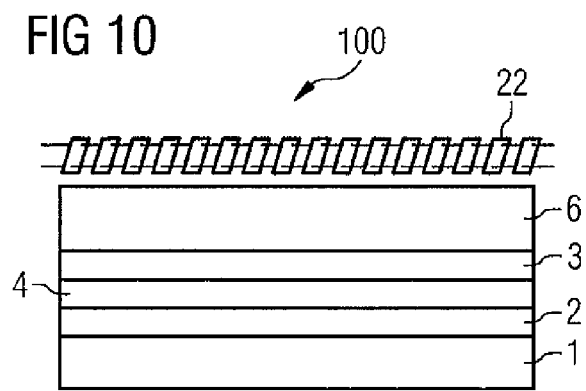
FIG. 10 shows a schematic sectional illustration of a luminous means in accordance with one exemplary embodiment.

FIG. 10 shows a schematic sectional illustration of a luminous means 100 in accordance with one exemplary embodiment. In the case of the luminous means 100 in accordance with FIG. 10, encapsulation 6 and substrate 1 are embodied as glazing, as for example in the case of the luminous means in accordance with FIGS. 5A and 5B. Such a glazing can serve for example as a window pane of a window 20, but also of a door 300 or of an item or furniture. During the day, such a glazing can be used as a window 20, that is to say that visible light from outside can penetrate into the room unhindered. At night, the luminous means 100 can be activated, such that the glazing serves as an illumination source for the room. Furthermore, on the outer side of the glazing a mirrored louver 22 is provided which serves for protecting the private sphere and which prevents uninvited looks from outside from being able to penetrate. In addition, the mirrored louver 22 is suitable for reflecting light emitted by the luminous means 100. The degree of utilization of the light emitted by the luminous means 100 is advantageously increased on account of the back-reflection by the mirrored louver 22. Furthermore, it is also possible for the louver 22 to be a traditional louver or a PDLC shutter. Other types of glass which can be darkened by applying an electrical voltage are also appropriate in addition to a PDLC shutter.

Figure 11:
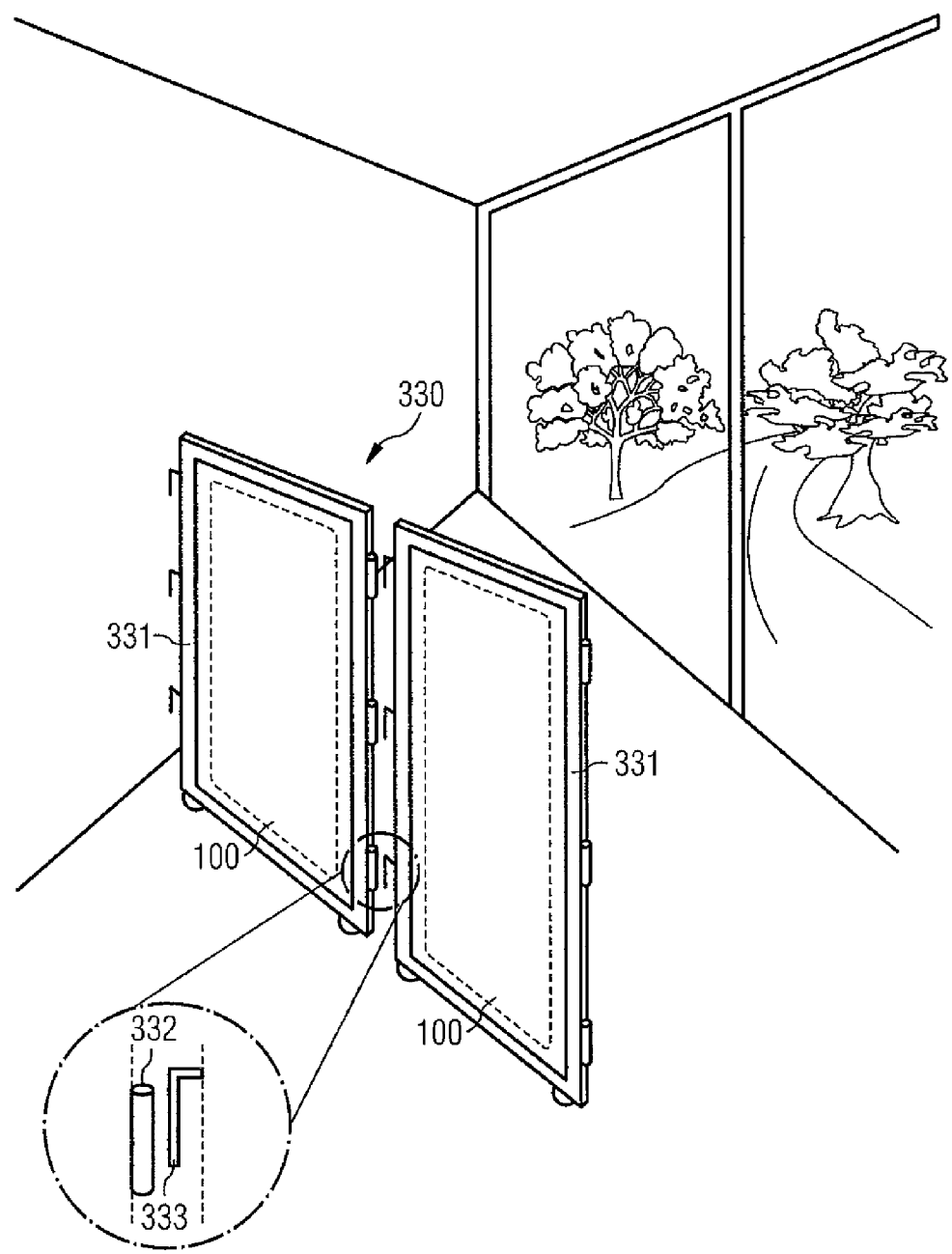
FIG. 11 shows a schematic perspective illustration of a room with a room divider in accordance with one exemplary embodiment.

FIG. 11 shows a schematic perspective illustration of a room with a room divider in accordance with one exemplary embodiment. The room divider 330 has two room divider elements 331 comprising a glazing within a frame, wherein the glazing comprises a luminous means 100 embodied as transmissive to visible light. The luminous means 100 is either integrated into the glazing, as described for example in conjunction with FIGS. 5A and 5B, or adhesively bonded onto the glazing. On account of their illumination function, the room divider elements 331 can advantageously be used to illuminate room regions which are separated by the room divider.

In the present case, the room divider 330 is constructed in modular fashion. It comprises two room divider elements 331, which can be connected to one another by plug connections. For this purpose, the frame of the room divider element comprises a sleeve 332 on one of its side surfaces, said sleeve being embodied for example in the manner of a cylinder. That side surface of the frame which lies opposite the side surface with the sleeve 332 is provided with pins 333 embodied in such a way that they can be fitted into the sleeves 332. By inserting the pins of one room divider element into the sleeves of a further room divider element, it is possible for two room divider elements 331 respectively to be connected to one another. In this case, in particular, an electrical connection of the room divider elements 331 by means of the sleeves 332 and the pins 333 is also possible. The room divider 330 forms a large-area illumination device.

FIG. 12 shows a schematic sectional illustration of a display in accordance with one exemplary embodiment. The display 335 can be for example the display of a television, of an LCD screen, of an OLED screen, or of a plasma screen. The front glass pane of the display is used as a substrate 1 for a luminous means embodied as transmissive to visible light. The first electrode 2 is applied to the front glass pane, which first electrode comprises a TCO and is therefore embodied as transmissive to visible light. An organic layer stack 4 such as has been described for example with reference to FIG. 1 is applied on the first electrode 2. A second electrode 3, in the present case likewise comprising a TCO, is applied to said organic layer stack.

By way of example, one of the following TCO materials is particularly suitable as TCO for the cathode: ITO, ATO, zinc oxide.

A further glass plate as encapsulation 6 is applied to the second electrode 3. It can be adhesively bonded onto the second electrode 3 by means of an adhesive layer 610, for example. In the present case, the organic layers are embodied in such a way that the emission from the organic layer stack is predominantly effected through the encapsulating glass pane. In the present case, the luminous means 100 integrated into the front pane of the display 335 can be used as an illumination source in the switched-off state of the display. For this purpose, the luminous means is preferably embodied in dimmable fashion. In the switched-off state of the luminous means, the content of the display 335 can be perceived by an observer since the luminous means is embodied as transmissive to visible light.

Figure 12A:
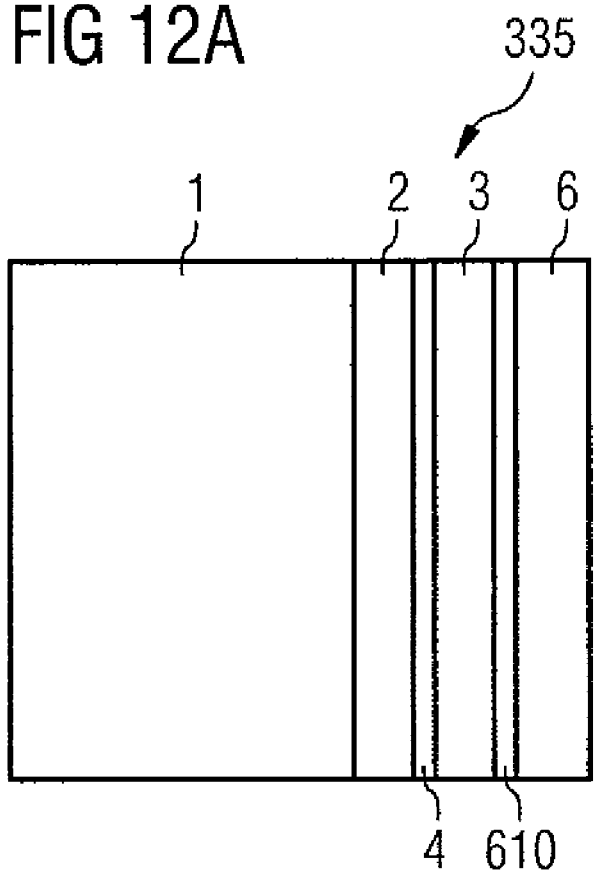
FIG. 12A shows a schematic sectional illustration of a display with a luminous means in accordance with one exemplary embodiment.
Figure 12B:
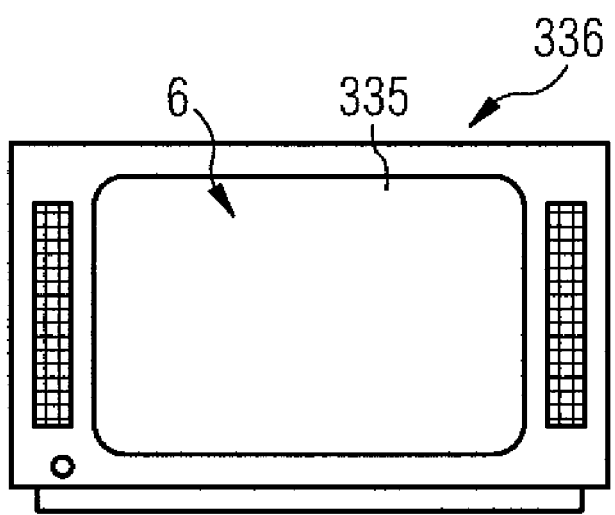
FIG. 12B shows a schematic plan view of a television set.

FIG. 12B shows a schematic plan view of a television set 336 comprising a display 335 such as has been described in conjunction with FIG. 12A.

FIG. 13A shows a schematic perspective illustration of shelving 340 in accordance with one exemplary embodiment. FIG. 13B shows an excerpt from FIG. 13A. The shelving 340 comprises two side parts having rods 83 which are embodied as hollow in the interior and comprise electrical cables. The side parts having the rods 83 form a rod system such as is also described with reference to FIG. 68, for example. Said rods 83 are provided for carrying shelves 341 of the shelving. For this purpose, the shelves 341 of the shelving each comprise mounts 342 which are correspondingly shaped at the sides. In the present case, in a manner corresponding to the rods of the side parts of the shelving, said mounts are embodied after the manner of a cut-open cylinder. However, it is also conceivable for the rods 83 and the mounts 342 to be embodied in cornered fashion. The shelves 341 of the shelving in the present case comprise a frame 343 into which is introduced a glazing comprising a luminous means 100 transmissive to visible light. For making electrical contact, the mounts 342 of the shelves of the shelving comprise in the present case a pin 71 which is inserted into an electrically conductive cutout 73 within the rods 83, as illustrated in FIG. 13B. The rods 83 of the side parts are preferably embodied in hollow fashion. Thus, the cables used for making contact with the plugs can be guided within the rods. Shelves of shelving as exhibited by the shelving 340 in accordance with FIG. 13B can for example also be used in display cabinets or other items of furniture and storage furniture.

Figure 14:
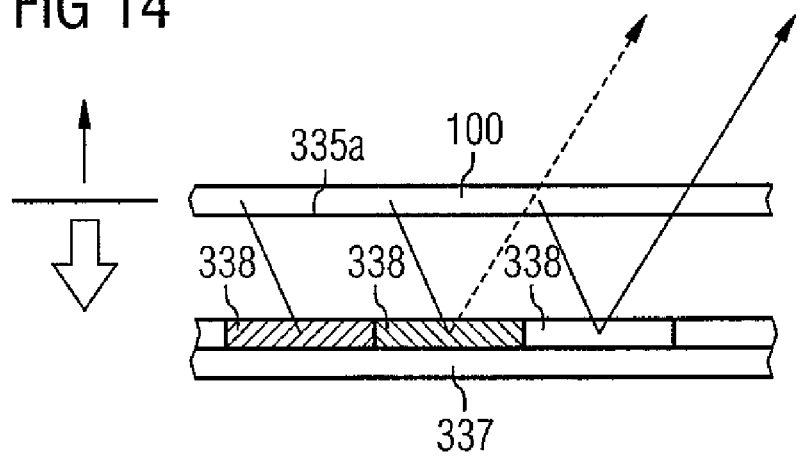
FIG. 14 shows a schematic sectional illustration of a reflective display in accordance with one exemplary embodiment.

FIG. 14 shows a schematic sectional illustration of a reflective display 335. A reflective display 335 comprises a reflective element 337, on which pixels 338 are arranged, on its rear side. Reflective displays 335 do not require backlighting, but rather reflect ambient light on account of the reflective element 337 in such a way that the display content can be represented. Therefore, reflective displays 335 are dependent on the ambient light. They can no longer be read in the dark. A luminous means transmissive to visible light, as described with reference to FIG. 5A, for example, is applied to the radiation-emitting front side 335A of the reflective display 335. Said luminous means is embodied in the present case in such a way that it predominantly emits radiation in the direction of the reflective element. For better color rendering, the luminous means 100 can be slightly colored, for example in the color of a light magenta. For this purpose, by way of example, the encapsulation 6 or the substrate 1 or both is or are colored in the desired color. The luminous means is preferably fitted with an index matching material on the front side 335a of the reflective display in order to avoid reflections. If the luminous means can be varied in color, for example in such a way that the color space RGB is covered, and if the reflective display 335 can furthermore be switched rapidly enough, time-sequential operation in RGB is also possible. During this time-sequential operation, the display is preferably operated with frequencies of at least 70 Hz, particularly preferably at least 100 Hz.

Figure 15:
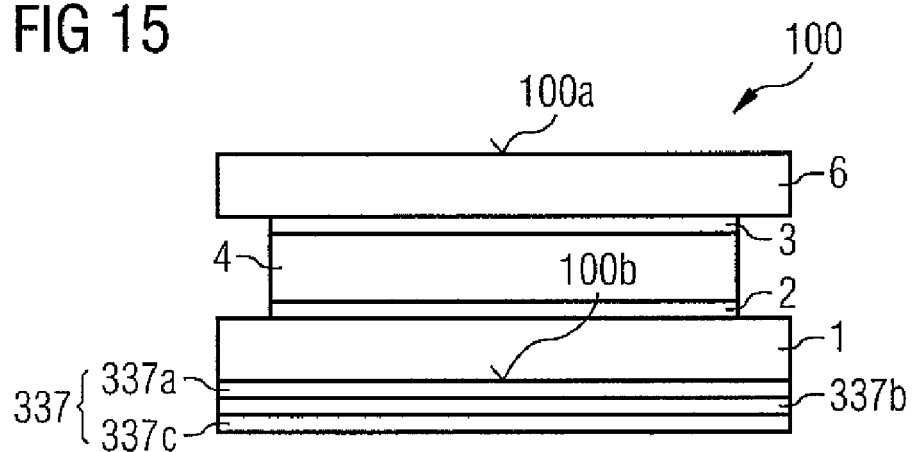
FIG. 15 shows a schematic sectional illustration of a luminous means in accordance with one exemplary embodiment.

FIG. 15 shows a schematic sectional illustration of a luminous means 100 in accordance with one exemplary embodiment. The electrodes 2, 3, the substrate 1, the encapsulation 6 and the organic layer stack 4 are embodied as transmissive to visible light, in particular to the light generated by the organic layer stack 4. A reflective element 337, which is a reflective layer sequence in the present case, is applied to the outer side of the substrate 1, which can be formed by a glass plate, for example. The reflective layer sequence comprises a copper layer 337b, a silver layer 337a and a protective lacquer layer 337c, wherein the silver layer 337a is applied to the substrate 1, the copper layer 337b is applied to that side of the silver layer 337a which is remote from the substrate, and the protective lacquer layer is applied to the copper layer 337b. Since the reflective layer sequence is formed along the underside 100b of the luminous means 100, the luminous means 100 can no longer emit light from the underside, but rather only from its top side 100a. Furthermore, the reflective element reflects light that passes through the first electrode 2 and the substrate 1 in the direction of the top side 100a of the luminous means 100.

As an alternative to the above-described layer sequence comprising a silver layer, a copper layer and a protective lacquer layer, the reflective element 337 used can also be for example a dielectric mirror which like the layer sequence above is applied to the outer side of the substrate.

The reflective element 337, such as a reflective layer sequence or a dielectric mirror, can for example furthermore be applied on the outer side of the encapsulation 6 or be applied between substrate 1 and first electrode 2 and between encapsulation 6 and second electrode 3. If the reflective element is arranged on the outer side of the encapsulation 6 or between encapsulation 6 and second electrode 3, then the luminous means 100 emits light from its underside 100b.

A luminous means 100 such as is illustrated in FIG. 15 permits, in particular, this luminous means to serve as a mirror when the luminous means is deactivated and as an illumination source during the operation of the luminous means 100. In the case of such a luminous means 100, the entire light-emitting front side 100a can either serve as illumination or serve as a mirror. Furthermore, it is also possible for the entire light-emitting front side 100a to serve as illumination and as a mirror. Furthermore, the light-emitting front side 100a can also be divided into regions, such that one part of the light-emitting front side 100*a* serves as a mirror and a further part serves as an illumination source.

By way of example, the luminous means can, however, also be embodied in such a way that it emits light both from its front side 100*a* and from its rear side 100*b*. Using the so-called cavity effect, for example, it is possible for light having different light properties to emerge from different sides of the luminous means in this case. A luminous means of this type is described for example in German patent application 102006046196.7, the disclosure content of which is hereby expressly incorporated by reference.

Figure 16:
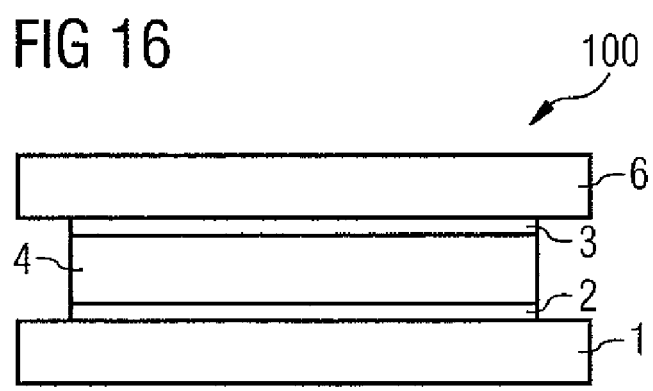
FIG. 16 shows a schematic sectional illustration of a luminous means in accordance with a further exemplary embodiment.

FIG. 16 shows a schematic sectional illustration of a luminous means 100 in accordance with a further exemplary embodiment. The following elements of the luminous means 100 are embodied as transmissive to visible light: encapsulation 6, substrate 1, first electrode 2 and organic layer stack 4. The substrate 1 used can be for example a glass plate or a plastic film which is embodied as transmissive to visible light.

The first electrode 2 can be formed from a TCO, for example.

The organic layer stack 4 can be a layer stack such as has already been described with reference to FIG. 1.

The encapsulation 6 can be for example a glass cap, a glass plate, a plastic cap or a plastic plate.

Furthermore, a getter material can be applied on the inner side of the cap or plate that faces the organic layer stack 4, said getter material likewise being embodied as transmissive to visible light. Furthermore, the encapsulation 6 can be a thin-film encapsulation having at least one barrier layer. The barrier layer can for example consist of SiOx or SiNx or comprise one of these materials. Furthermore, the thin-film encapsulation 6 can also have first and second barrier layers 601, 602, which alternate with regard to their material composition. Polymer interlayers, for example, can be arranged between the alternating barrier layers; in this respect, also see FIG. 3, for example.

Figure 17A:
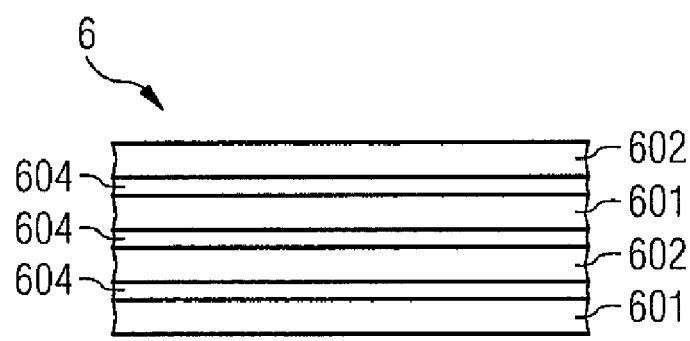
FIG. 17A shows a schematic sectional illustration of a thin-film encapsulation in accordance with one exemplary embodiment.

FIG. 17*a* shows a schematic sectional illustration of a thin-film encapsulation 6 comprising alternating barrier layers 601, 602, wherein a polymer interlayer 604 is fitted in each case between two adjacent barrier layers having different material compositions. The barrier interlayers can be for example two barrier layers 601 comprising SiOx and two barrier layers 602 comprising SiNx, such as have already been described in conjunction with FIG. 3. As in the case of the exemplary embodiment in accordance with FIG. 3, the barrier layers 601, 602 are arranged in alternating fashion with regard to their material composition, that it to say that first barrier layers 601 alternate with second barrier layers 602 within the thin-film encapsulation 6, wherein the first and the second barrier layers 601, 602 have different material compositions. In contrast to the thin-film encapsulation 6 in accordance with FIG. 3, however, the barrier layers 601, 602 are separated from one another by polymer interlayers 604.

As an alternative to the use of a separate reflective element 337, such as, for example, of the above-described reflective layer sequence or of the dielectric mirror, the second electrode 3 of the luminous means in accordance with FIG. 16 is embodied as reflective to visible light. For this purpose, the second electrode 3 comprises aluminum or silver for example or consists of one of these materials. A luminous means of this type is likewise suitable for being used as a mirror and/or an illumination source, like the luminous means in accordance with FIG. 15.

In order to obtain a luminous means which can serve as a mirror and/or as an illumination source and does not have an additional reflective element, it is also possible for the second electrode 3 to be embodied as transmissive to visible light, for example by a TCO being used as electrode material, and for the encapsulation 6, the substrate 1 or the first electrode 2 to be embodied in reflective fashion instead.

A reflective encapsulation 6 can be a polished metal cap, for example.

Figure 17B:
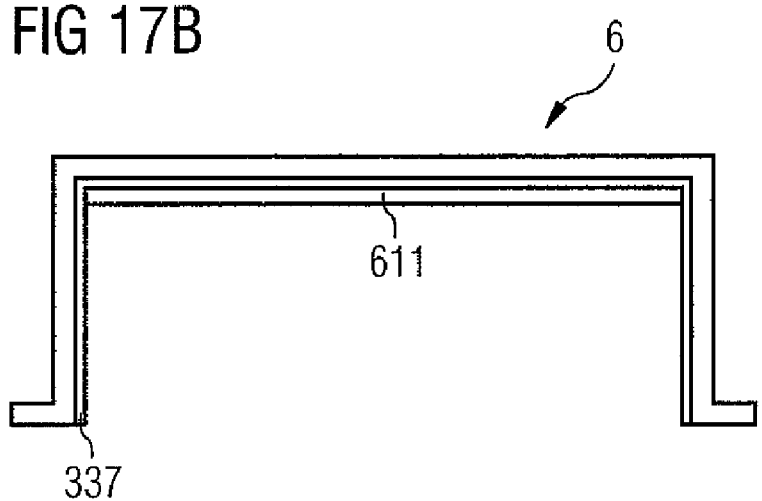
FIG. 17B shows a schematic sectional illustration of a reflective encapsulation in accordance with one exemplary embodiment.

FIG. 17B shows a schematic sectional illustration through a reflective encapsulation 6 in accordance with one exemplary embodiment. This involves a cap which has either already been embodied in reflective fashion, for example by being formed from a polished metal, or a cap which is not embodied in reflective fashion. A reflective element 337, for example a reflective layer, is applied to the inner side of the cap that faces the organic layer stack 4. The reflective layer on the inner side of the cap can be for example a metallic layer which for instance comprises silver or consists of silver. Furthermore, the reflective layer can also have a plurality of layers. Furthermore, a getter layer 611 composed of a getter material embodied as transmissive to visible light is applied on the reflective layer.

Figure 17C:
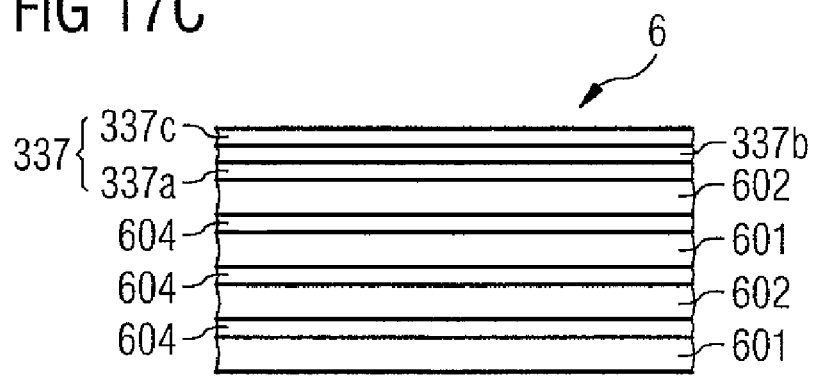
FIG. 17C shows a schematic sectional illustration through a thin-film encapsulation in accordance with a further exemplary embodiment.

FIG. 17C shows a schematic sectional illustration through a thin-film encapsulation 6 in accordance with a further exemplary embodiment. Like the thin-film encapsulation 6 in accordance with FIG. 17A, the thin-film encapsulation 6 has alternating barrier layers 601, 602 separated from one another by polymer interlayers 604. In contrast to the thin-film encapsulation 6 in accordance with FIG. 17A, the thin-film encapsulation 6 in accordance with FIG. 17C has a reflective element 337, for example a reflective layer sequence such as has already been described with reference FIG. 15. The reflective layer sequence comprises a silver layer 337*a* applied to the outermost barrier layer 602. A copper layer 337*b* is applied to the silver layer 337*a*, and a protective lacquer layer 337*c* is in turn arranged on said copper layer. On account of the reflective layer sequence, the thin-film encapsulation is embodied in reflective fashion and can be used as a reflective encapsulation.

A further possibility for embodying a luminous means 100 in which it is possible to switch back and forth between mirror function and illumination function consists in the substrate 1 being embodied in reflective fashion, while the other elements of the luminous means, through which the light generated in the organic layer stack 4 has to pass on the way to the light-emitting front side 100*a*, in particular the second electrode 3, the organic layer stack 4 and the encapsulation 6, are embodied as transmissive to visible light. A reflective substrate 1 can for example comprise metal or consist of a metal. By way of example, a metal film, such as a high-grade steel film, can be used as the reflective substrate 1. In particular, a mirror can be used as the substrate. Furthermore, a laminate composed of plastic films onto which a metal film—for example composed of aluminum—is laminated is suitable as a reflective substrate. Furthermore, the substrate can be a glass substrate coated in reflective fashion.

As an alternative or in addition to a reflective substrate 1, the first electrode 2 can also be embodied in reflective fashion. Such an electrode can for example comprise one of the following materials or consist thereof: aluminum, silver.

Furthermore, it is also possible for the thin-film encapsulation 6 per se to form a dielectric mirror or a Bragg mirror. The material of the first and the second barrier layers 601, 602 and also the thickness of these layers are then chosen accordingly.

FIG. 18A shows a perspective schematic illustration of a motor vehicle mirror 315 comprising a luminous means 100 in the case of which it is possible to change over between the illumination function and mirror function, as described for example in conjunction with FIGS. 15 to 17C. In the present case, the luminous means has a luminous surface embodied in accordance with the lettering "Info 1". For this purpose, one of the electrodes 2, 3 can be structured, as described with reference to FIG. 5B. In contrast to FIG. 5B, however, the luminous means 100 in accordance with FIG. 18A has a reflective element 337, for example an additional reflective layer sequence. Furthermore, one of the elements of the luminous means 100, for example one of the electrodes 2, 3, the substrate 1 or the encapsulation 6, can also be embodied in reflective fashion, as described above. In this way, logos, symbols or other information can be displayed in luminous fashion as desired against the background of a mirror surface. With the aid of these luminous means 100, for example warnings, such as distance messages when parking, for instance, could be inserted in the motor vehicle mirror 315.

FIG. 18B shows a schematic perspective illustration of the motor vehicle mirror 315 in accordance with FIG. 18A. A mirror is used as the substrate 1 in the case of the motor vehicle mirror. The substrate 1 is connected to a holder. A first electrode 2 is applied within an active region 5 on the substrate. The first electrode 2 is embodied as transmissive to visible light, for example by being formed from a TCO. Furthermore, the first electrode 2 is structured in accordance with the lettering "Info 1". An organic layer stack 4 is applied to the structured first electrode 2, said stack being transmissive to visible light. Furthermore, the second electrode 3 is applied to the organic layer stack 4, said second electrode likewise being embodied as transmissive to visible light. A glass plate is used as encapsulation 6, said glass plate being fitted above the second electrode. The organic layer stack 4 and the second electrode 3 are applied over the whole area within the active region 5. In order that the luminous means 100 has a luminous surface which is structured in accordance with a lettering, it is sufficient to structure the first electrode 2. The use of a mirror as the substrate 1 permits the luminous means to be integrated into the motor vehicle mirror 315 in a simple manner.

FIG. 19 shows a schematic perspective illustration of a multi-part mirror 345 in accordance with one exemplary embodiment. Such a mirror can be used for example as a bath or wardrobe mirror. The mirror 345 comprises a central part 345a and two pivotable side wings 345b (indicated by arrows in the figure) arranged laterally with respect to the central part. The side wings 345b each comprise a luminous means 100 in the case of which it is possible to change over between reflective and illuminating function and the luminous surface of which fills the surface of the side wing virtually over the whole area in each case. Under good light conditions, the side wings 345b can be used as normal mirrors. Under poor light conditions, for example in the dark or at twilight, one of the two side wings or both side wings 345b of the mirror can be switched on as an illumination source in order to illuminate the observer. Furthermore, the illuminated side wings 345b can serve as a decorative illumination element.

Like FIG. 19, FIG. 20 shows a schematic perspective illustration of a multi-part mirror 345 in accordance with a further exemplary embodiment. This mirror is likewise a three-part mirror comprising a central part 345a and two side wings 345b which are arranged laterally with respect to the central part and into which luminous means 100 are introduced in the case of which it is possible to switch back and forth between mirroring and illuminating function. Such a mirror can also be used for example as a bath or wardrobe mirror.

Figure 21:
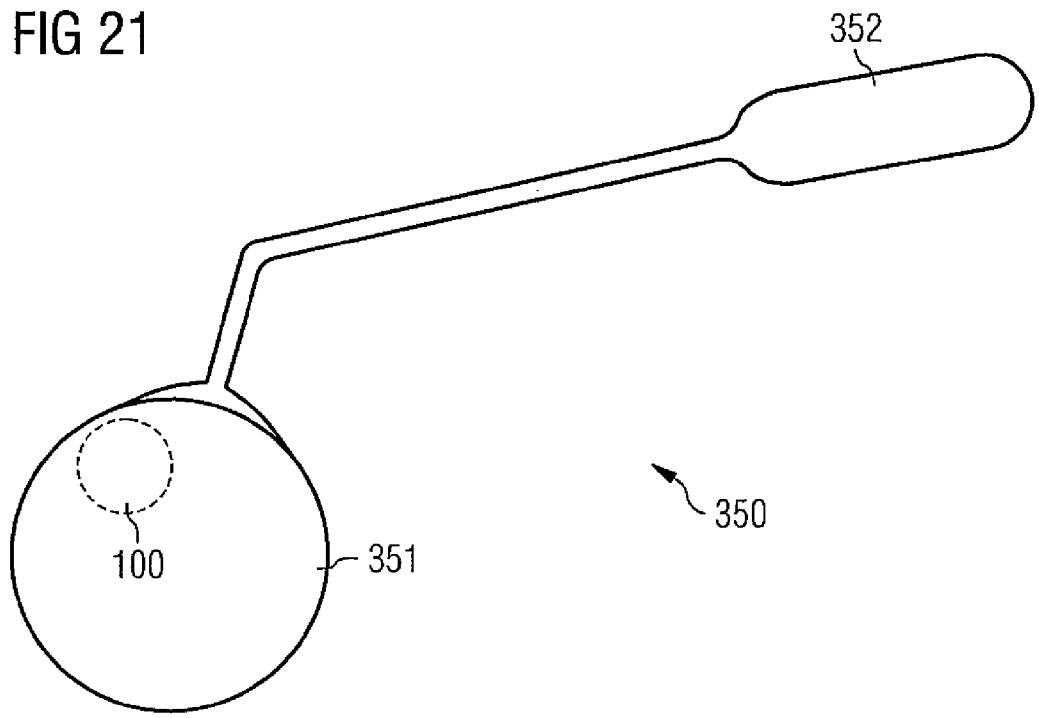
FIG. 21 shows a schematic perspective illustration of a search mirror in accordance with one exemplary embodiment.

FIG. 21 shows a schematic perspective illustration of a search mirror 350 in accordance with one exemplary embodiment. The search mirror 350 comprises a mirror element 351 and a holding element 352, to which the mirror element is fixed. In this case, the holding element 352 is embodied in bent fashion in order to be able to use the mirror element 351 to inspect locations that are difficult to access. Such a search mirror can be a dental mirror, for example.

The search mirror 350 comprises, on its mirror element 351, a luminous means 100 in the case of which it is possible to switch back and forth between reflective and illuminating function. The luminous means can comprise a part of the mirror surface or virtually the entire mirror surface. It therefore affords the possibility of simultaneously illuminating and inspecting locations that are difficult to access. Such a mirror can also be used in the domestic sector, for example for searching for lost articles behind/under furniture that is difficult to move.

Figure 22:
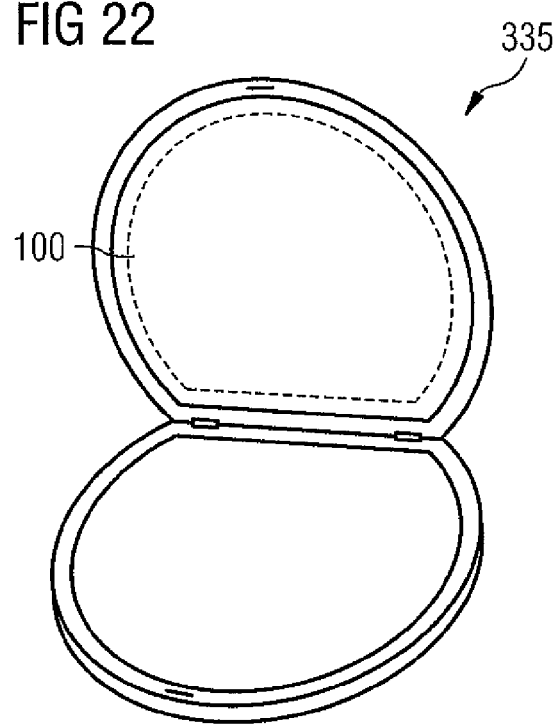
FIG. 22 shows a schematic perspective illustration of a make-up mirror in accordance with one exemplary embodiment.

FIG. 22 shows a schematic perspective illustration of a make-up mirror in accordance with one exemplary embodiment. In the present case, the make-up mirror is integrated into a cosmetic set, such as a powder contact. Furthermore, the make-up mirror comprises a luminous means in the case of which it is possible to switch back and forth between mirroring and illuminating function. Under poor visibility conditions, the luminous means can be activated. Under low light, therefore, the make-up mirror 355 can be used simultaneously as a cosmetic mirror and as face illumination. The luminous means 100 can comprise a part or virtually the entire mirror surface.

Figure 23:
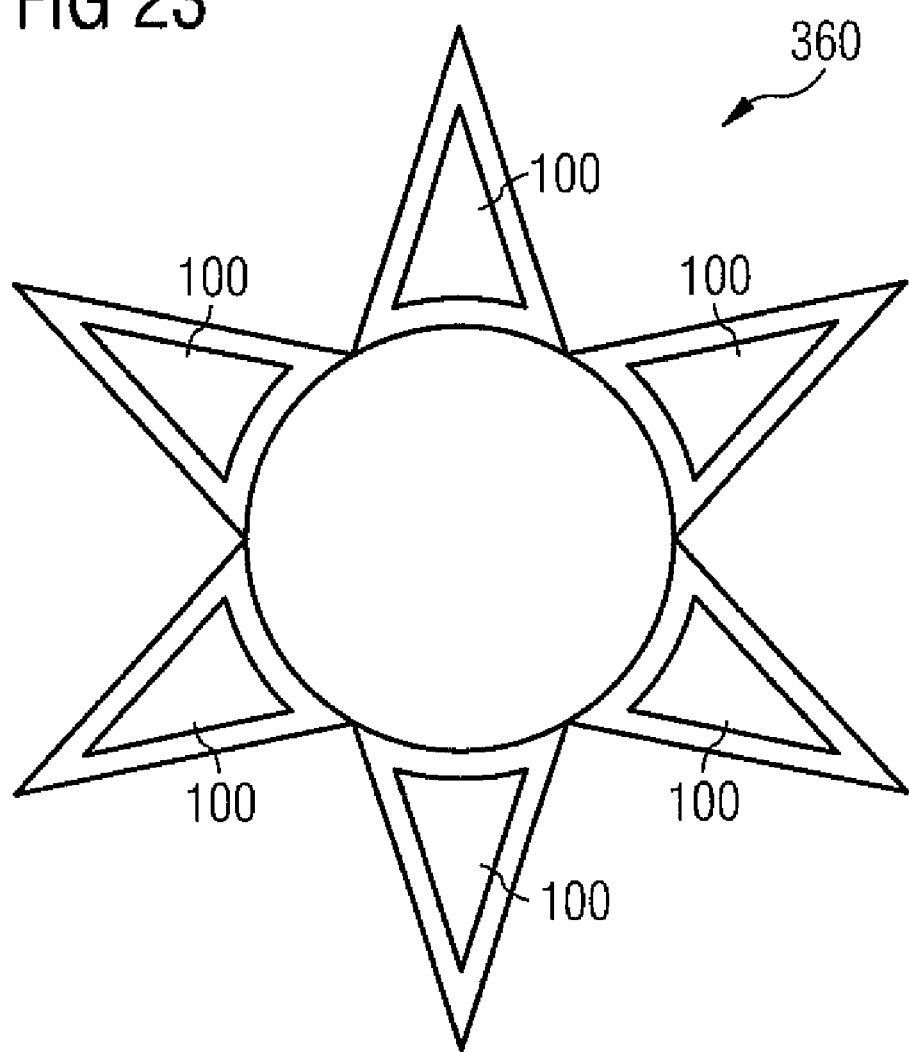
FIG. 23 shows a schematic plan view of a decorative element in accordance with one exemplary embodiment.

FIG. 23 shows a schematic plan view of a decorative element 360 in accordance with one exemplary embodiment. In the present case, the decorative element 360 is embodied as a flashing Christmas star. A basic surface of the star is embodied in mirroring fashion, wherein luminous means in the case of which it is possible to switch back and forth between reflective and illuminating function are introduced into partial regions of the star. These luminous means can for example also be embodied in colored fashion. In this case, multicolored luminous means 100 can also be involved, in particular, such as are described further below.

Figure 24:
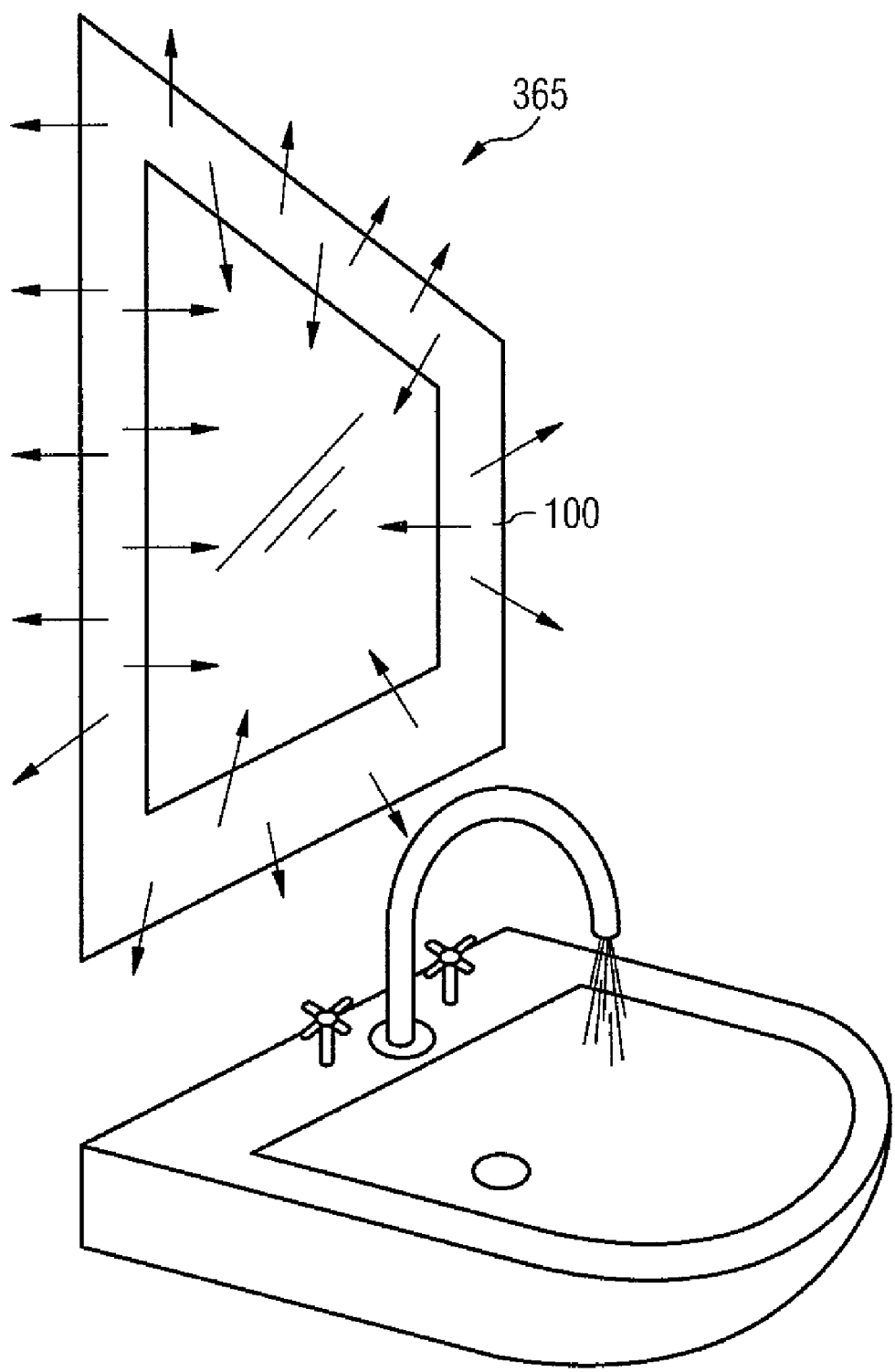
FIG. 24 shows a schematic perspective illustration of a mirror in accordance with a further exemplary embodiment.

FIG. 24 shows a schematic perspective illustration of a mirror 365 in accordance with a further exemplary embodiment. In the present case, the mirror 365 is provided for use in the domestic wet sector. In the present case, the mirror has an outer region provided with a luminous means 100 in the case of which it is possible to switch back and forth between illuminating and mirroring function.

Figure 25:
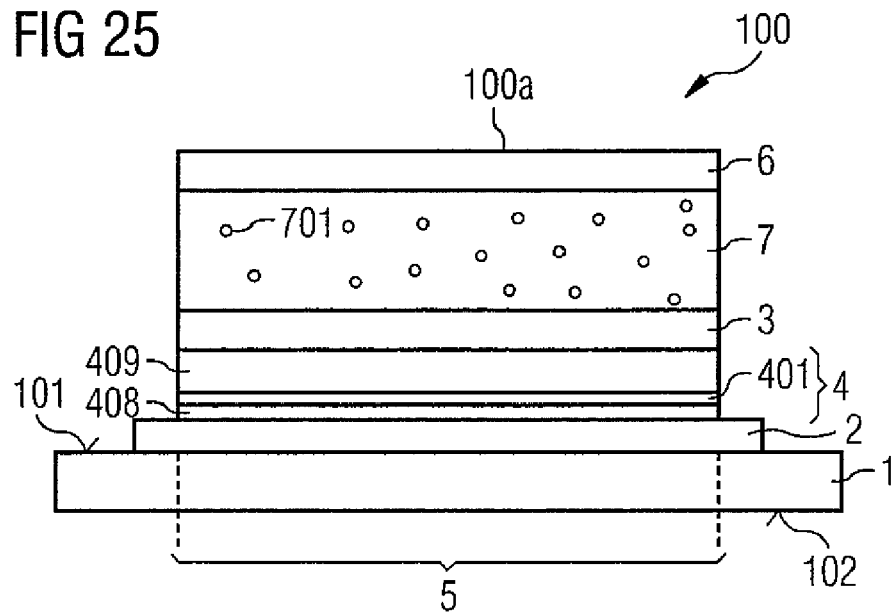
FIG. 25 shows a schematic sectional illustration of a flexible luminous means in accordance with one exemplary embodiment.

FIG. 25 shows, in a schematic sectional illustration, a luminous means 100 in accordance with one exemplary embodiment of a luminous means described here.

The luminous means 100 illustrated in FIG. 25 is a flexible luminous means. The luminous means 100 embodied in flexible fashion is distinguished, inter alia, by the fact that it can be bent to a certain degree without being damaged by the bending. Preferably, the luminous means embodied in flexible fashion can be bent repeatedly without being damaged in the process. The luminous means is then suitable, therefore, for withstanding a plurality of bending cycles without being damaged.

The luminous means 100 in FIG. 25 comprises a substrate 1. The substrate 1 is a flexible, metallic substrate 1. The metallic substrate 1 contains or consists of one of the following materials: aluminum, high-grade steel, gold, silver. Preferably, the substrate 1 is in this case embodied as a metal film having a thickness of at most 1 mm, particularly preferably at most 0.5 mm. It is furthermore possible for the flexible, metallic substrate 1 to be embodied as medium sheet metal having a thickness of at least 3 mm and at most 4.75 mm or as fine sheet metal having a thickness of at most 3 mm.

A first electrode 2 is applied directly to the first main surface 101 of the substrate 1. The first electrode 2 is a cathode of the luminous means 100, for example.

The cathode is suitable for impressing electrons into the organic layer stack that succeeds the cathode. For this purpose, the cathode comprises a material which is distinguished by a low work function for electrons. In this case, the cathode contains or consists preferably of alkali metals or alkaline earth metals. Furthermore, the cathode can comprise one or a plurality of layers which consist of silver, aluminum and/or platinum or contain at least one of these metals.

The organic layer stack 4 is preferably applied directly to the cathode. The organic layer stack 4 comprises at least one layer 401 which is suitable for generating light during operation of the luminous means 100.

The organic layer stack 4 can comprise further organic layers such as, for example, a hole conducting layer 409 or an electron conducting layer 408. The electron conducting layer preferably directly adjoins the cathode. The hole conducting layer is arranged on that side of the light-generating layer 401 of the layer stack 4 which is remote from the cathode, and preferably adjoins the anode of the luminous means 100.

A second electrode 3 is preferably arranged directly on the organic layer stack 4. The second electrode 3 is an anode of the luminous means 100, for example.

The anode is provided for injecting holes into the organic layer stack. The anode comprises a material which has a high work function for electrons. Indium tin oxide (ITO), for example, is a suitable material for forming the anode.

A planarization layer 7 is preferably applied directly to the second electrode 3. The planarization layer 7 consists of or contains an organic material.

In accordance with the exemplary embodiment described in conjunction with FIG. 25, additional scattering centers 701 are introduced into the planarization layer. The scattering centers 701 can be for example particles of at least one of the following materials: luminescence conversion material, color filter material, diffuser material. By way of example, the materials already mentioned in the general part of the description can serve as luminescence conversion materials.

Color pigments dispersed in a matrix material are suitable for example as color filter materials. The matrix material involves for example transparent plastics such as acrylate, polyacrylate or polyimide. A color filter material transmits only light of a specific color—for example green, red or blue light.

The diffuser material involves for example light-scattering particles such as titanium oxide, silicon oxide or particles of the above-described luminescence conversion materials which can be embedded into a matrix.

An encapsulation 6 is preferably applied directly to the planarization layer 7. The encapsulation 6 is formed by a plurality of barrier layers which preferably contain an inorganic material. The barrier layers, as part of a thin-film encapsulation, form the flexible encapsulation of the luminous means. By way of example, first and second barrier layers 601, 602 are applied alternately to the planarization layer 7. In this case, the first barrier layers 601 consist of a silicon oxide, and the second barrier layers 602 then consist of a silicon nitride; in this case, also see FIG. 3, in which such a thin-film encapsulation is elucidated in greater detail.

Overall, a flexible luminous means 100 comprising a metallic substrate 1 is described in conjunction with FIG. 25.

The luminous means in accordance with FIG. 25 is provided for emitting light from its top side 100*a*. For this purpose, the elements through which the light generated in the organic layer stack has to pass on its way to the top side 100*a*, in particular the organic layer stack 4 itself, the second electrode 3 and the encapsulation 6, are embodied as transmissive to visible light. Furthermore, the planarization layer 7 is likewise embodied as transmissive to visible light.

The first main surface 101 of the surface 1 of the luminous means 100 can be embodied such that it is reflective to the light generated in the organic layer stack 4, by polishing the main surface 101. The luminous means described in conjunction with FIG. 25 is then a flexible, reflective luminous means.

Figure 26:
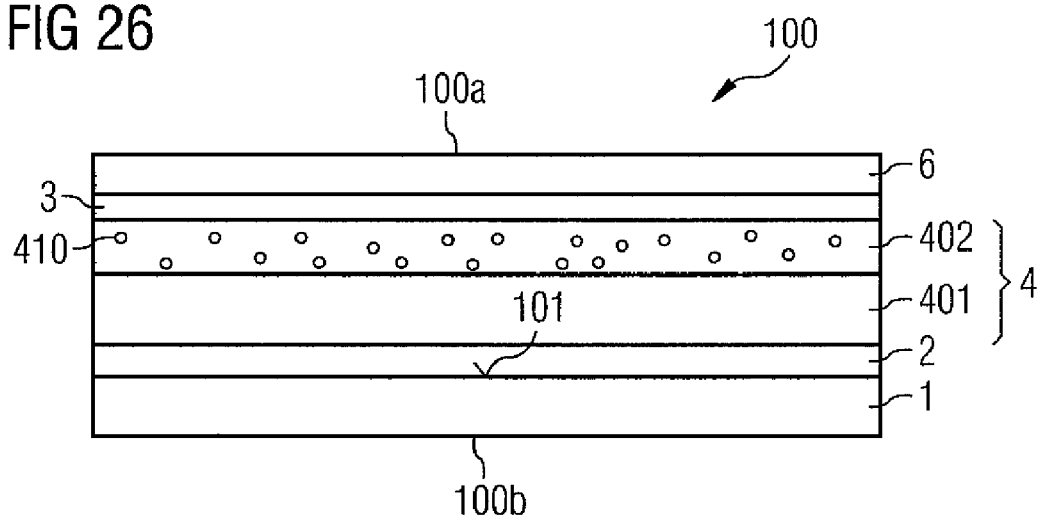
FIG. 26 shows a schematic sectional illustration of a flexible luminous means in accordance with a further exemplary embodiment.

FIG. 26 shows, in a schematic sectional illustration, an exemplary embodiment of a luminous means described here.

The luminous means 100 described in conjunction with FIG. 26 is a flexible luminous means. In this case, the flexible luminous means 100 is preferably embodied in flexible fashion in such a way that—without being damaged in the process—it can be rolled up onto a roll and can be unrolled from a roll.

The luminous means 100 comprises a substrate 1. The substrate 1 is embodied as a plastic film. That is to say that the substrate 1 has a thickness of at most 1 mm, preferably at most 0.5 mm, particularly preferably of between at least 50 and at most 500 µm, for example 250 µm, and contains or consists of a plastic. Suitable plastics include, inter alia, PE, polyimide and similar plastics.

A first electrode 2 is preferably applied directly to the first main surface 101 of the substrate 1, said first electrode preferably being transmissive to visible light. That is to say that the first electrode 2—as described further above—is embodied such that it is at least partly transmissive to the light generated by the luminous means during operation. For this purpose, the first electrode 2 can consist of a light-transmissive material and/or be embodied in grid-shaped fashion.

The organic layer stack 4 is preferably applied directly to the first electrode 2. The organic layer stack 4 comprises at least one light-generating organic layer 401. Furthermore, the organic layer stack 4 comprises an outermost organic layer 402, which for example directly adjoins the second electrode 3. The outermost organic layer is doped with a dopant 410. Preferably, the dopant 410 of the doped layer—as explained further above—involves the largest possible atoms or molecules which are suitable for releasing electrons—n-type dopant—or holes—p-type dopant. Furthermore, the dopant has a low diffusion constant within the organic layer stack 4. For this purpose, the dopant is formed from the largest possible atoms or molecules. Cesium, for example, proves to be a suitable dopant in this case.

The second electrode 3 is preferably applied directly to the organic layer stack 4. The second electrode 3—as described further above—is embodied in light-transmissive fashion. That is to say that the second electrode 3 is formed from a light-transmissive material and/or embodied in grid-shaped fashion.

A light-transmissive encapsulation 6 is preferably applied directly to the second electrode 3. The encapsulation 6 is preferably formed by a light-transmissive plastic film. In this case, the light-transmissive encapsulation 6 can be formed from the same material as the substrate 1. However, it is also conceivable for the encapsulation to be formed from one or a plurality of barrier layers such as have been described for example in conjunction with FIG. 3. In this case, the encapsulation 6 is embodied as a flexible thin-film encapsulation.

Overall, a light-transmissive, flexible luminous means 100 is described in conjunction with FIG. 26. In particular on account of the particularly flexible substrate 1 embodied as a plastic film, and the particularly flexible encapsulation 6 embodied as a plastic film or thin-film encapsulation, the luminous means 100 is so flexible that it can be rolled up onto a roll and can be unrolled from a roll, without being damaged in the process.

Figure 27:
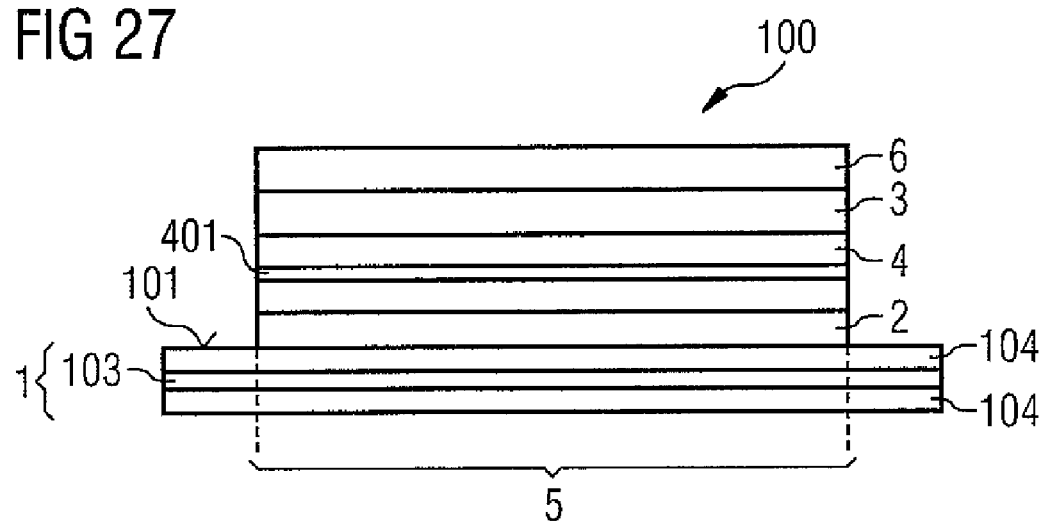
FIG. 27 shows a schematic sectional illustration of a luminous means in accordance with one exemplary embodiment.

FIG. 27 shows an exemplary embodiment of a luminous means 100 described here, in a schematic sectional illustration.

The luminous means 100 elucidated with the aid of FIG. 27 is a flexible luminous means. The flexible luminous means 100 in FIG. 27 is distinguished, inter alia, by the fact that it can be bent to a certain degree without being damaged in the process. Preferably, the luminous means embodied in flexible fashion can be bent repeatedly without being damaged in the process. The luminous means is then suitable, therefore, for withstanding a plurality of bending cycles without being damaged. In this case, the luminous means 100 can be embodied in flexible fashion in such a way that the luminous means—without experiencing a negative impairment in the process—can be rolled up onto a roll and can be unrolled from a roll.

The luminous means 100 comprises a substrate 1. The substrate 1 is a flexible laminate substrate. That is to say that the substrate 1 of the luminous means 100 is embodied as a laminate.

The laminate comprises a first layer 104, which is formed from a plastic. The laminate furthermore comprises a second layer 103, which is formed from a glass. The laminate furthermore comprises a third layer 104, which is in turn formed from a plastic. By way of example, the layers of the laminate are adhesively bonded to one another. However, it is also possible for the second layer 103 of the laminate, which is formed from a glass, to be coated with a plastic. The substrate 1 of the luminous means 100 described in conjunction with FIG. 27 is embodied in flexible fashion and can furthermore also be light-transmissive. By comparison with a simple plastic film, a laminate is for example particularly well suited to keeping moisture away from the electrodes and the organic layer stack 4.

A first electrode 2 is preferably applied directly to the first main surface 101 of the substrate 1. The organic layer stack 4 succeeds the first electrode 2, said stack comprising at least one light-generating organic layer 4.

The second electrode 3 is applied directly to the organic layer stack.

The encapsulation 6 of the luminous means 100 succeeds the second electrode 3. The encapsulation can be a thin-film encapsulation, which, as described further above, comprises one or a plurality of barrier layers. Furthermore, the encapsulation can be a film—for example a plastic or metal film. Furthermore, it is possible for the encapsulation to be embodied as a laminate in the same way as the substrate 1 of the luminous means 100.

FIG. 28A shows a window 20 covered by a louver 22, in a schematic plan view in accordance with one exemplary embodiment.

FIG. 28B shows a schematic sectional illustration through a slat 21 of the louver 22 as illustrated in FIG. 28A. The slat 21 of the louver 22 is embodied as a flexible luminous means 100, in a manner similar to that described for example in conjunction with FIG. 25.

Preferably, this luminous means 100 comprises a substrate 1 embodied in light-opaque fashion. The substrate 1 can be for example a metallic substrate 1 or a plastic substrate. In particular the slat of a conventional louver can be used as the substrate 1 in this case.

A layer sequence comprising at least a first electrode 2, an organic layer stack 4, a second electrode 3 and an encapsulation 6 is then applied to the slat as the substrate 1 of the luminous means 100. The encapsulation is preferably embodied in light-transmissive fashion.

With the louver 22 closed, the slats 21 of the louver 22 are preferably oriented relative to the window 20 in such a way that the light-opaque substrate 1 is directed outward and the light-transmissive encapsulation is directed inward—that is to say into the room. In this way, the louver embodied in such a manner can be used as an illumination device for the room.

For this purpose, the organic layer stack 4 is preferably suitable for generating white light similar to daylight. The organic layer stack 4 can be constructed for example as explained in conjunction with FIG. 1. An illumination which is similar to daylight in terms of emission direction, emission characteristic and light impression is advantageously realized in this way. The room darkened by the louver 22 can in this way be illuminated with a light having a particularly natural appearance. With the aid of such a louver, therefore, a room can for example be outwardly protected from inquisitive looks and at the same be illuminated. Furthermore, it is also possible for the organic layer stack 4 to be suitable for generating colored light. Such a louver can also have a decorative function for example in addition to the darkening function.

Figure 29A:
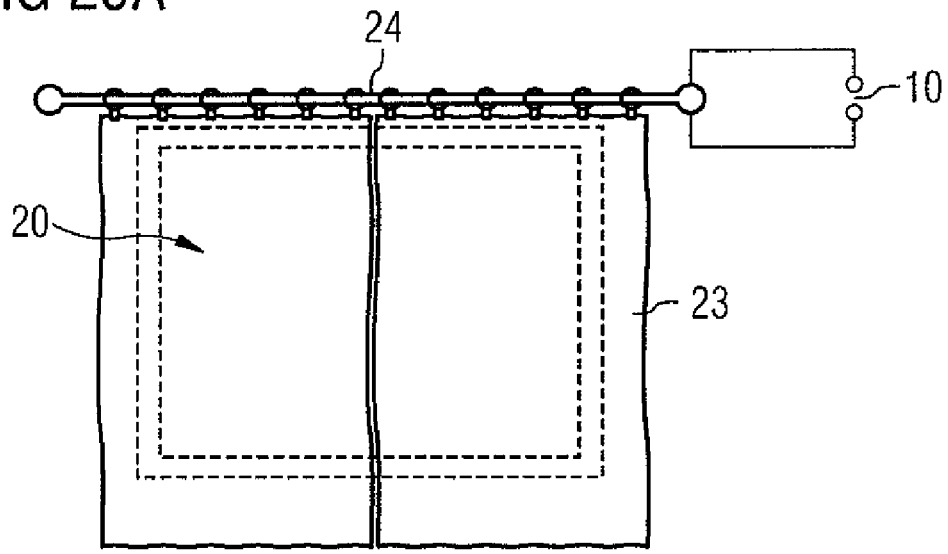
FIG. 29A shows a schematic view of a window covered by a curtain in accordance with one exemplary embodiment.

FIG. 29A shows, in a schematic plan view, a window 20 covered by a curtain 23 in accordance with one exemplary embodiment.

Figure 29B:
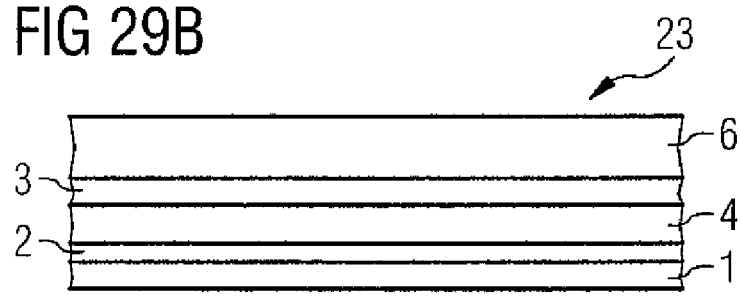
FIG. 29B shows the curtain in accordance with FIG. 29A in a schematic sectional illustration.

FIG. 29B shows the curtain 23 in a schematic sectional illustration.

The curtain is embodied for example as a flexible luminous means 100 such as has been described in conjunction with FIG. 26 or FIG. 27. That is to say that the curtain 23 comprises a flexible substrate 1 formed by a plastic film or a laminate. The substrate 1 is preferably embodied in light-opaque fashion.

The encapsulation of the luminous means 100 is embodied as a light-transmissive film, as a light-transmissive laminate or as a light-transmissive thin-film encapsulation. In this case, the light-opaque substrate is directed toward the window. The light-transmissive encapsulation 6 is directed into the room, away from the window 20.

The curtain 23 can be connected to a power supply 10 for example by a rod 24 or a cable and can be energized by said power supply. A curtain 23 formed in this way enables a room to be illuminated with light which can be very similar to daylight with regard to emission direction, emission characteristic and color.

Figure 29C:
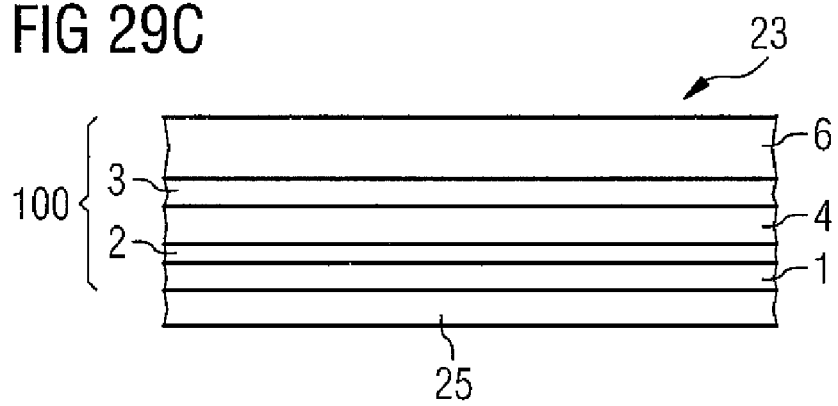
FIG. 29C shows a schematic sectional illustration of a curtain in accordance with a further exemplary embodiment.

A further exemplary embodiment of a curtain 23 is described in a schematic sectional illustration in conjunction with FIG. 29C. In this exemplary embodiment, a luminous means 100 is applied to a textile carrier, for example a conventional textile curtain 25. In this case, the luminous means 100 is preferably embodied as a flexible and, if appropriate, light-transmissive luminous means 100 such as has been described for example in conjunction with FIG. 26 or FIG. 27. In this case, the textile material of the curtain 25 faces the window 20, and the luminous means 100 is remote from the window 20.

The luminous means 100 is fixed on the curtain 25 preferably by means of a hook-and-loop connection. For this purpose, a hook-and-loop fastening is for example adhesively bonded on the second main surface 102 of the substrate 1 of the luminous means 100—in this respect also cf. the exemplary embodiment of a luminous means 100 described here that is described in conjunction with FIG. 49. In this way, the luminous means 100 can readily be detached from the textile curtain 25 in order, for example, to wash the textile curtain or to replace a defective luminous means 100 in a particularly simple manner. For the case where the luminous means is embodied in light-transmissive fashion, it advantageously emerges that the curtain remains visible through the luminous means.

Figure 30:
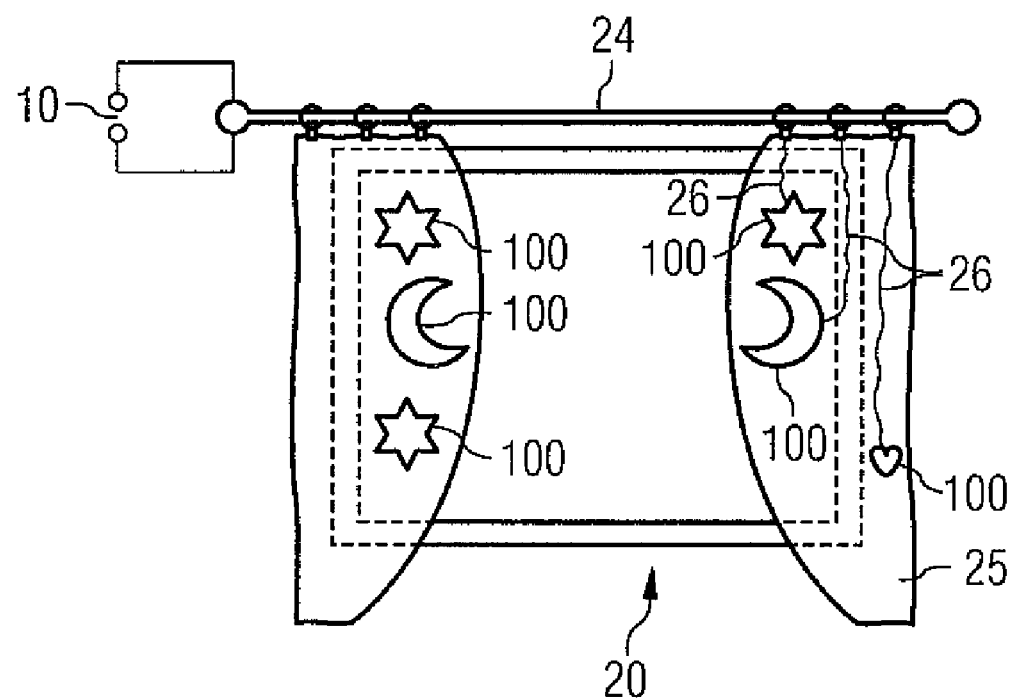
FIG. 30 shows a schematic view of a window with a curtain in accordance with a further exemplary embodiment.

FIG. 30 shows, in a schematic plan view, a window 20 covered by a textile curtain 25.

In contrast to the exemplary embodiment in FIG. 29C, the luminous means 100 in this exemplary embodiment do not completely cover the textile material, but rather are applied to the curtain in the form of individual smaller applications. In this way, it is possible, for example, to apply luminous means 100 of predeterminable size and form to the textile curtain 25. In this case, the luminous means can form for example stylized stars, moons, hearts or else letterings. A curtain 25 formed in this way is particularly well suited as a nightlight in a child's/children's room, as Christmas lighting or for advertising purposes in a display window. The luminous means 100 is preferably a flexible luminous means embodied in reflective and/or multicolored fashion.

Contact can be made with the individual luminous means 100 via conductor tracks 26. For this purpose, the conductor tracks 26 are fixed to the textile curtain 25 or woven into the curtain 25. The luminous means 100 can in turn be energized via a cable or a rod 24 which is connected to a power supply 10. Furthermore, it is possible for the luminous means 100 each to bear an autonomous power supply such as a battery, for example.

Figure 31:
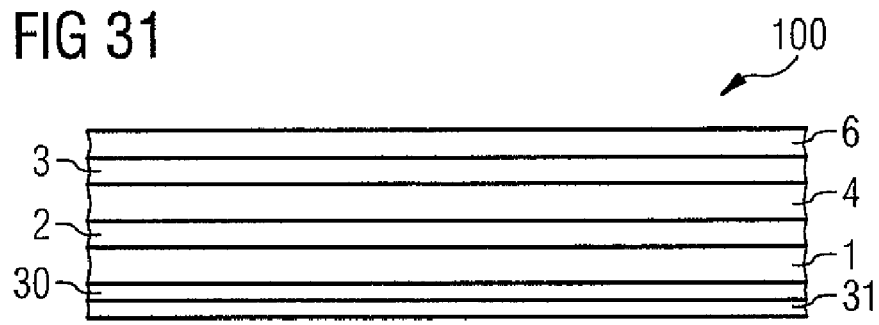
FIG. 31 shows a schematic sectional illustration of a luminous means in accordance with one exemplary embodiment.

FIG. 31 shows, in a schematic sectional illustration, an exemplary embodiment of a luminous means described here. The luminous means 100 is for example a flexible luminous means 100 such as has been described in greater detail in conjunction with FIGS. 25, 26 and 27.

An adhesive layer 30 is applied to the second main surface 102 of the substrate 1, remote from the first main surface 101 of the substrate 1. The adhesive layer is covered by a protective film 31. The protective film can be stripped from the adhesive layer 30, such that the adhesive layer 30 can be uncovered by stripping away the protective film 31. As a result, a luminous means 100 is realized which, after simple stripping away of the protective film 31, can be fixed to a predetermined location by being stuck on in the sense of a transfer.

Figure 32:
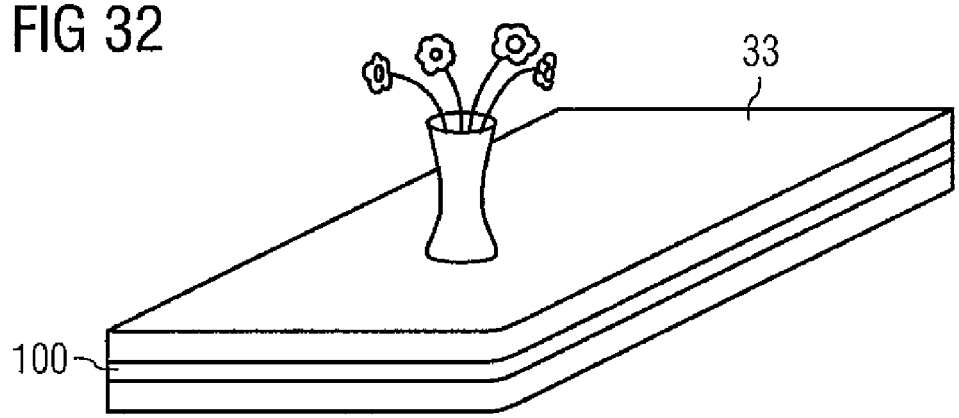
FIG. 32 shows a schematic perspective illustration of an item of furniture in accordance with one exemplary embodiment.

FIG. 32 shows, in a schematic perspective illustration, an item of furniture 33, for example a table, shelving, or generally storage furniture, to which a self-adhesive luminous means 100 in accordance with FIG. 31 is adhesively attached.

On account of the flexibility of the luminous means 100, the luminous means 100 can also be adhesively bonded around edges, rounded portions or rims of the item of furniture 33. As a result of the flexible, self-adhesive luminous means 100 being adhesively attached to the item of furniture 33, an item of furniture is realized which functions as an illumination device 1000.

Figure 33:
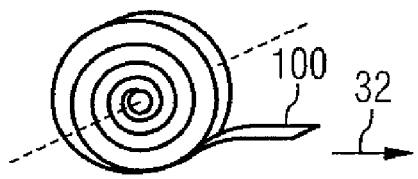
FIG. 33 shows a schematic perspective illustration of a flexible luminous means in accordance with one exemplary embodiment in a rolled-up state.

A flexible luminous means as illustrated in FIG. 31, for example, is shown in the rolled-up state in the schematic perspective illustration in FIG. 33. That is to say that the luminous means 100 is embodied in flexible fashion in such a way that it can be rolled up to form a roll and can be unrolled from a roll 32 in the direction of the arrow 32. This enables, in addition to particularly space-saving storage of the luminous means 100, a particularly simple use of the luminous means 100 for example for adhesive attachment to items of furniture, stair landings, walls, tiles, flags or sanitary fixtures.

Figure 34A:
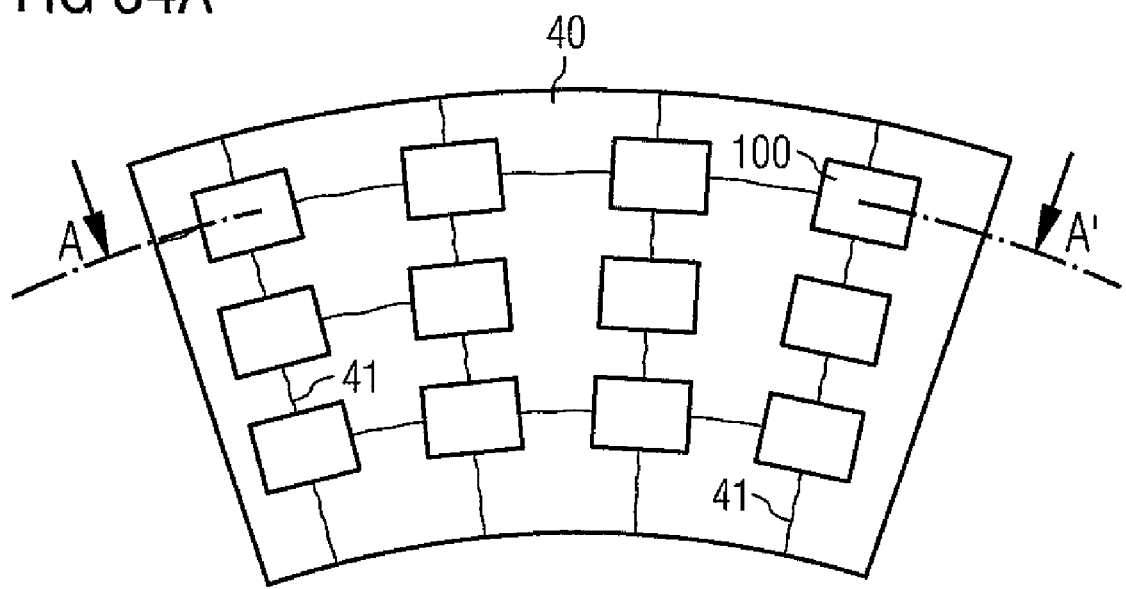
FIG. 34A shows a schematic sectional illustration of an illumination device in accordance with one exemplary embodiment.

FIG. 34A shows an exemplary embodiment of an illumination device 1000 described here, in a schematic plan view.

Figure 34B:
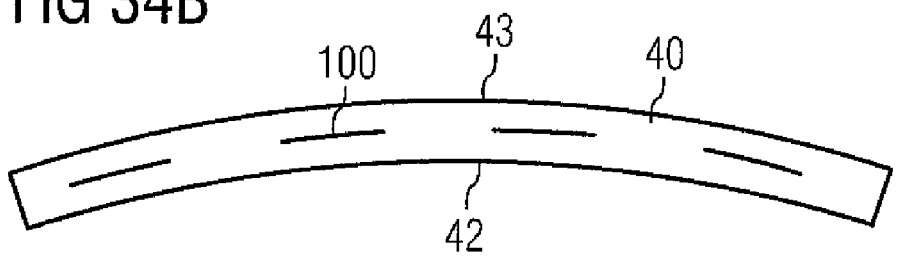
FIG. 34B shows a schematic sectional illustration of the illumination device in FIG. 34A along the sectional line A-A'.

FIG. 34B shows the illumination-device 1000 in a schematic sectional illustration along the sectional line AA'.

The illumination device 1000 in accordance with FIGS. 34A and 34B is a flexible illumination device. In this case, the flexibility of the illumination device 1000 is achieved by virtue of the fact that rigid luminous means 100, that is to say luminous means 100 which have no flexibility per se since they have for example a rigid substrate 1 and/or a rigid encapsulation 6, are embedded into a flexible matrix 40.

The illumination device 1000 comprises two flexible carriers 42, 43, between which the rigid luminous means 100 and the material of the matrix 40 are arranged. At least the carrier 43, through which the luminous means 100 emit the light generated during operation, is light-transmissive. The other carrier 42 can be formed from a light-opaque material, embodied for example in reflective fashion, for instance of a metal film.

The space between the two carriers 42, 43 is filled with the rigid luminous means 100 and a flexible matrix material 40. The light-transmissive matrix material can contain particles of at least one of the following materials: luminescence conversion material, color filter material, diffuser material.

Suitable matrix material includes for example zeonex, polystyrene, polycarbonate or other plastics which can preferably be processed by means of injection molding.

The flexible carrier 42, 43 is for example a plexiglass plate, a plastic film or a plastic-glass-plastic laminate.

In this case, the rigid luminous means 100 can be arranged so close together that—if appropriate through diffuser particles contained in the matrix material—a homogeneous light impression of the illumination device 1000 results. That is to say that individual luminous means 100 are then no longer perceptible by the observer, rather the illumination device 1000 has a single, homogeneous luminous surface.

As an alternative, it is possible for the luminous means 100 to be arranged in a manner spaced far apart from one another such that webs are perceptible between the luminous means. In this case, the space between individual luminous means can be filled with a matrix material comprising light-absorbing particles. The light-absorbing particles can be for example carbon black or particles of dyes.

The conductor tracks 41 connecting the individual luminous means 100 of the illumination device 1000 to one another are arranged in the matrix material. This ensures the flexibility of the illumination device. The conductor tracks 41 are formed by thin, metallic springs or thin wires laid in meanders.

The carriers 42, 43 of the illumination device 1000 can be chosen to be load-bearing such that the illumination device 1000 withstands loadings by weights of up to a few hundred kilograms without being damaged. A use of the illumination device 1000 as a floor covering is possible in this way.

In a further exemplary embodiment of the illumination device 1000 as described in conjunction with FIGS. 34A and 34B, at least one of the two carriers of the illumination device 1000 is embodied in rigid fashion. The rigid carrier can have a predeterminable curvature, for example, thus resulting in a three-dimensionally shaped illumination device 1000 which is invariable in its form, that is to say rigid.

All of the luminous means 100 described here can be used for the luminous means 100 of the illumination device 1000 as described in conjunction with FIGS. 34A and 34B. In this way, colored, light-transmissive, reflective or multicolored, flexible illumination devices can be produced particularly simply and cost-effectively.

Figure 35A:
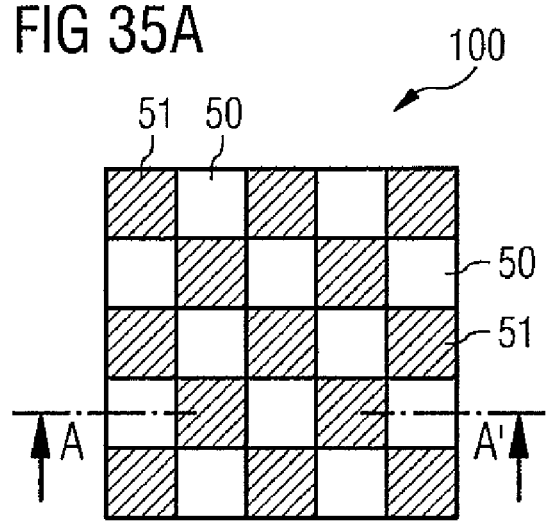
FIG. 35A shows a schematic plan view of a luminous means in accordance with one exemplary embodiment.

FIG. 35A shows a schematic plan view of a luminous means 100 in accordance with one exemplary embodiment of a luminous means 100 described here.

Figure 35B:
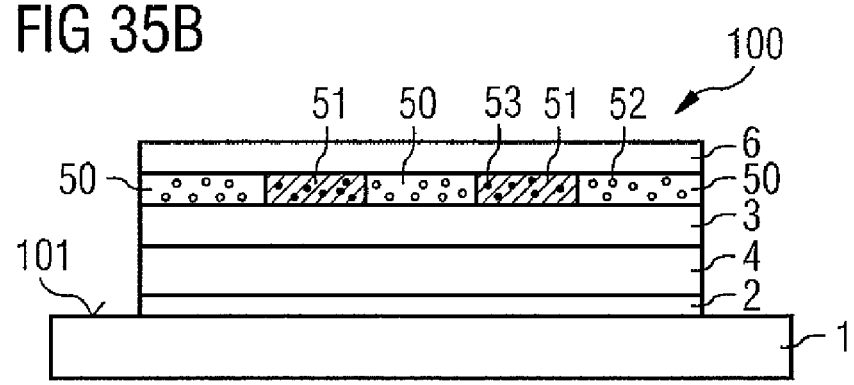
FIG. 35B shows a schematic sectional illustration of the luminous means in accordance with FIG. 35A along the sectional line A-A'.

FIG. 35B shows a schematic sectional illustration of the luminous means 100 in FIG. 35A along the sectional line AA'.

The luminous means described in conjunction with FIGS. 35A and 35B is a multicolored luminous means.

As illustrated schematically in the plan view in FIG. 35A, the luminous means comprises first and second color subregions arranged laterally alongside one another. The first 50 and second 51 color subregions are suitable for emitting light of different colors. The first color subregion 50 is suitable for emitting light of a first color. The second color subregion 51 is suitable for emitting light of a second color. The first color differs from the second color in this case.

In the exemplary embodiment of the luminous means as described in conjunction with FIG. 35A, the first and second color subregions 50, 51 are arranged in a checkered pattern with respect to one another. That is to say that the first and second color subregions 50, 51 are arranged at the grid points of a square grid in such a way that each first color subregion 50 which is not arranged at the edge of the luminous means 100 has four second color subregions 51 as closest neighbors which laterally adjoin the first color subregion 50. The same correspondingly holds true for the second color subregions 51.

In this case, the color subregions 50, 51 are formed in the manner of pixels of a display. The size of each color subregion is preferably at least 1 mm$^2$.

As is illustrated in the schematic sectional illustration in FIG. 35B, first and second color subregions 50, 51 can comprise different luminescence conversion materials or different color filter materials which are responsible for the different color impression of the first and second color subregions. Thus, the first color subregions 50 comprise for example a first luminescence conversion material and/or a first color filter material 52. The second color subregions 51 then comprise a second luminescence conversion material and/or a second color filter material 53.

In this case, the luminescence conversion materials and/or the color filter materials can be arranged in a layer of the luminous means which runs parallel to the first main surface 101 of the substrate 1 of the luminous means 100 and which is arranged in such a way that at least a large part of the electromagnetic radiation generated in the organic layer stack 4 during operation passes through said layer.

In the exemplary embodiment described in conjunction with FIG. 35B, the luminous means 100 comprises a substrate 1, to which a first electrode is applied. The organic layer stack 4 is applied to that side of the first electrode 2 which is remote from the substrate, said stack comprising at least one organic layer provided for generating light. A second electrode 3 succeeds the organic layer stack 4 on its side remote from the first electrode 2.

The layer comprising the first 52 and second 53 luminescence conversion materials and/or the first and second color filter materials is arranged on that side of the second electrode 3 which is remote from the organic layer stack 4. The luminous means 100 is hermetically encapsulated from the surroundings by an encapsulation 6.

By means of corresponding structuring of the first electrode 2 and/or second electrode 3, it is possible that the color subregions can be driven independently of one another.

The luminous means 100 can be constructed in particular as in one of the other exemplary embodiments described. Flexible, light-transmissive and/or reflective luminous means which have at least two color subregions can thereby be realized in a particularly simple manner.

The materials described further above are suitable for example as first and/or second luminescence conversion materials.

The materials described further above are suitable for example as first and second color filter materials.

For reasons of a simplified illustration, only two different color subregions are illustrated in the exemplary embodiment described in conjunction with FIGS. 35A and 35B. It is possible, however, for the luminous means 100 to have a larger number of different color subregions which are suitable for generating light of different colors in pairs.

Figure 35C:
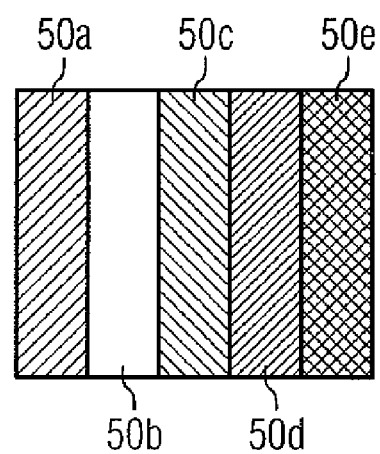
FIG. 35C shows a schematic plan view of a multicolored luminous means in accordance with one exemplary embodiment.

In the extreme case, the color of the light of each color subregion differs from the color of the light of any other color subregion of the luminous means. This is illustrated schematically in FIG. 35C, which elucidates a further exemplary embodiment of a multicolored luminous means 100 described here, on the basis of a schematic plan view. In this exemplary embodiment, the luminous means has five different color subregions 50a to 50e which each generate light of different colors in pairs.

Figure 36:
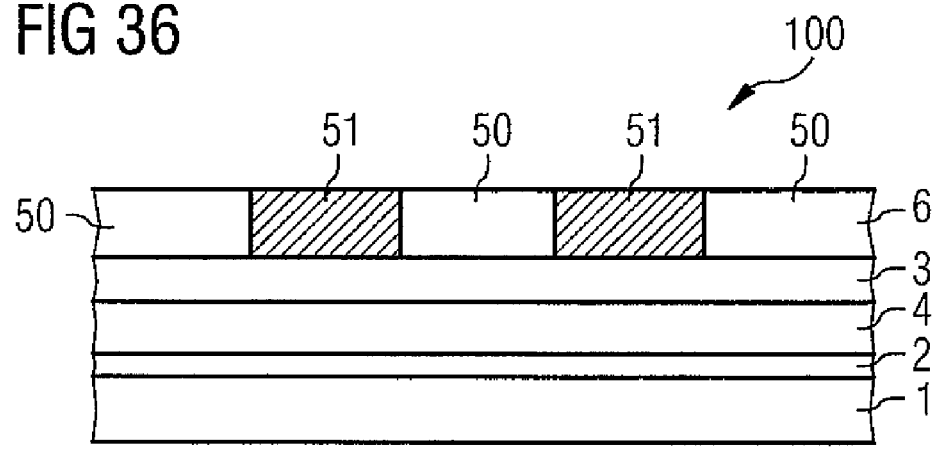
FIG. 36 shows a schematic sectional illustration of a luminous means in accordance with a further exemplary embodiment.

FIG. 36 shows a schematic sectional illustration through a luminous means 100 in accordance with a further exemplary embodiment of a luminous means 100 as illustrated for example in the schematic plan view in FIG. 35A.

The luminous means described in conjunction with FIG. 36 is a multicolored luminous means.

In the exemplary embodiment of the luminous means 100 in FIG. 36, the materials—that is to say the first 52 and second 53 luminescence conversion materials and/or the first and second color filter materials—are arranged in the encapsulation 6 of the luminous means 100. By way of example, the encapsulation 6 of the luminous means 100 can be formed by a plate or flexible film into which the materials are embedded.

This enables a luminous means 100 in the case of which the desired color impression of the luminous means 100 can be set by the choice of the encapsulation 6. With regard to the remaining elements of the luminous means, the luminous means 100 can be constructed as in one of the exemplary embodiments discussed further above or further below. Flexible, light-transmissive and/or reflective luminous means which have at least two color subregions can thereby be realized in a particularly simple manner. The functional components of the luminous means such as, for example, the first electrode 2 and second electrode 3 and also the organic layer stack 4 can be produced independently of the encapsulation 6.

Figure 37:
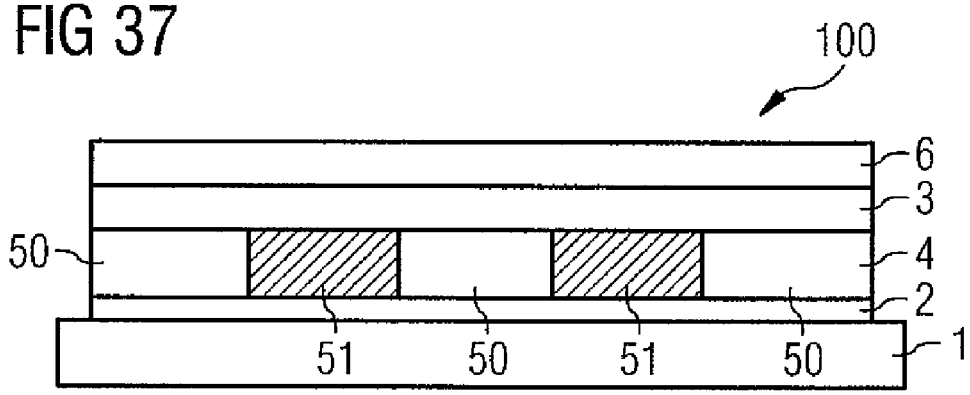
FIG. 37 shows a further schematic sectional illustration of a multicolored luminous means in accordance with a further exemplary embodiment.

FIG. 37 shows a schematic sectional illustration of a further exemplary embodiment of a multicolored luminous means 100 described here. In the present case, the active region of the substrate comprises subregions which each correspond to a color subregion. In this exemplary embodiment, the different color subregions 50, 51 of the luminous means 100 are realized by different emitter materials in the organic layer stack. That is to say that the organic layer stack is structured in a lateral direction. First and second color subregions differ at least with regard to an organic layer provided for generating light. The first color subregion 50 comprises a first emitter material, for example, and the second color subregion 51 then comprises a second emitter material, which differs from the first emitter material. With regard to the remaining elements of the luminous means, the luminous means 100 can then be constructed as in one of the other exemplary embodiments. Flexible, light-transmissive and/or reflective luminous means which have at least two color subregions can thereby be realized in a particularly simple manner.

Figure 38:
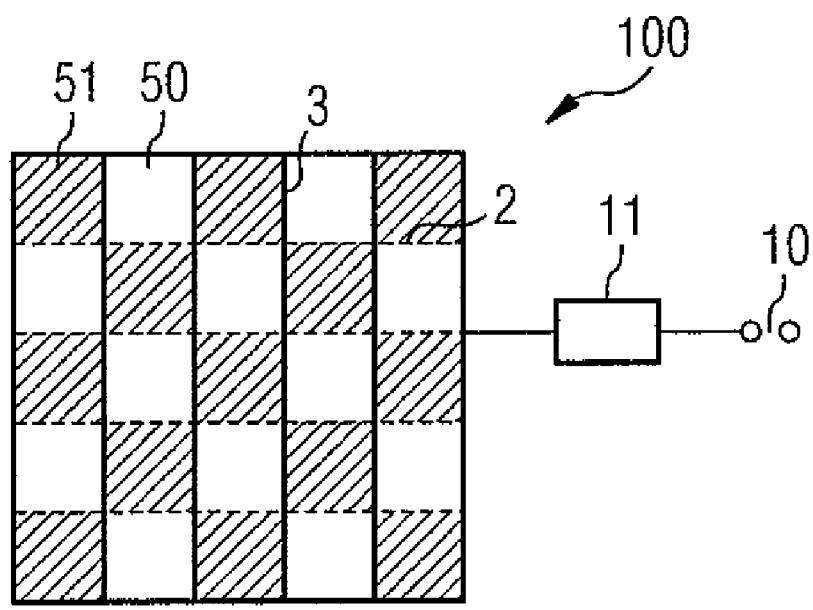
FIG. 38 shows a schematic plan view of first and second electrodes in accordance with a further exemplary embodiment of a multicolored luminous means.

FIG. 38 shows, in a schematic plan view, the first and second electrodes 2, 3 for a further exemplary embodiment of a multicolored luminous means 100. As can be gathered from FIG. 38, the first and second electrodes 2, 3 are each embodied in strip-shaped fashion. In this way, the individual color subregions 50, 51 can be driven independently of one another. In this case, the luminous means 100 is constructed in the manner of a passive matrix display apparatus. The individual color subregions 50, 51 are driven by means of a controller 11, which can be arranged outside the luminous means 100 or is integrated into the luminous means 100. The luminous means 100 is energized by the power supply 10 via the controller 11.

Figure 39:
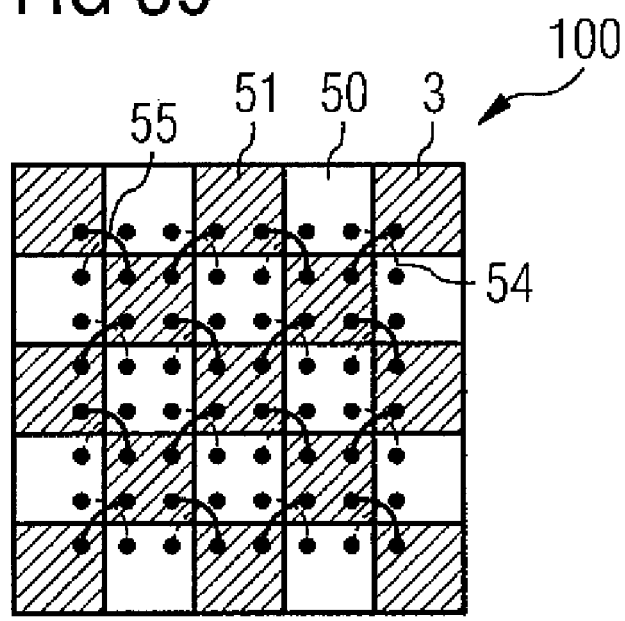
FIG. 39 shows a schematic plan view of a multicolored luminous means in accordance with a further exemplary embodiment.

FIG. 39 shows a further exemplary embodiment of a multicolored luminous means 100 described here, in a schematic plan view. In this exemplary embodiment, all the first color subregions 50 and all the second color subregions 51 are in each case connected to one another by electrical connections 54 and 55, respectively. That is to say that, by way of example, all the first color subregions 50 can be driven jointly and simultaneously in this way. Likewise, all the second color subregions 51 can be driven jointly and simultaneously. By contrast, the first and the second color subregions 50, 51 can be driven separately from one another. A luminous means 100 embodied in this way therefore has four operating states:

the luminous means can be switched off, such that none of the color subregions generates light, that is to say that none of the color subregions is luminous;

all the first color subregions 50 of the luminous means 100 are luminous, and the second color subregions 51 are not luminous, all the second color subregions 51 of the luminous means 100 are luminous, and the first color subregions 50 are not luminous, and the first and the second color subregions 50, 51 are luminous, such that the luminous means 100 emits light of the first and of the second color.

Figure 40A:
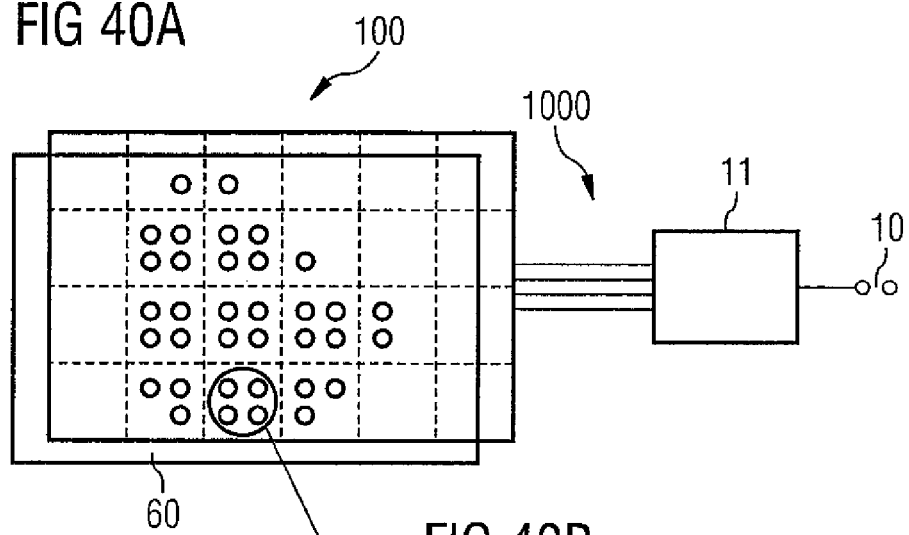
FIG. 40A shows a schematic plan view of an illumination device in accordance with one exemplary embodiment.

FIG. 40A shows, in a schematic plan view, an exemplary embodiment of an illumination device 1000 described here. The illumination device 1000 comprises a plurality of multicolored luminous means 100 as described for example in conjunction with FIG. 35A, 35B, 35C, 36, 37 or 39.

Figure 40B:
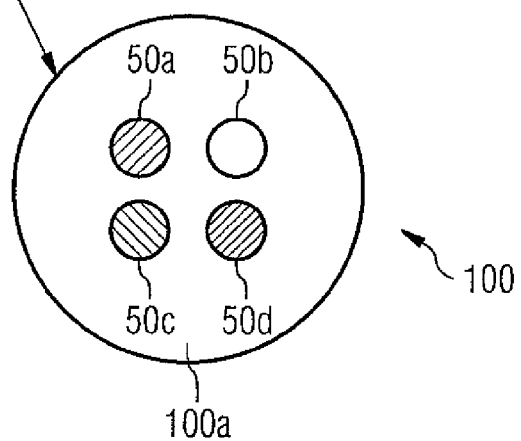
FIG. 40B shows a schematic enlargement of an excerpt from FIG. 40A.

As can be gathered from the enlargement of the excerpt in FIG. 40B, each luminous means of the illumination device 1000 comprises four color subregions 50a, 50b, 50c and 50d:

The first color subregion 50a is suitable for example for emitting light of green color during the operation of the illumination device 1000.

The second color subregion 50b is suitable for emitting light of red color during the operation of the illumination device 1000.

The third color subregion 50c is suitable for emitting light of blue color during the operation of the illumination device 1000.

The fourth color subregion 50d is suitable for emitting white light during the operation of the illumination device 1000.

In this case, the color subregions of each luminous means 100 of the illumination device 1000 can be driven separately and independently of one another. For this purpose, the illumination device 1000 comprises a controller 11, which can contain a microcontroller, for example. The controller 11 is energized by means of the power supply 10.

Optionally, an optical element 60 is disposed downstream of the luminous means 100 of the illumination device 1000 at their light-emitting front side 100a. The optical element 60 is preferably a diffuser plate. That is to say that light which radiates through the optical element 60 is scattered by the optical element 60. In this way, during the operation of the illumination device 1000, the individual color subregions are no longer perceptible as separate elements by the observer, rather the illumination device 1000 appears as though it has a single, homogeneous luminous surface. In this case, the luminous surface of the illumination device 1000 is composed of the light-emitting front sides of the luminous means of the illumination device.

The optical element 60 is furthermore preferably suitable for mixing the light generated by the color subregions 50a, 50b, 50c, 50d of the individual luminous means 100. In this way, the illumination device 1000 is suitable for generating not only light of the colors of the individual subregions but also mixed light composed of two or more of these colors. Overall, an illumination device which can be used in a particularly flexible manner and which is suitable in a simple manner for generating light of a multiplicity of different colors is realized in this way.

If the luminous means 100 of the illumination device 1000 additionally have at least one color subregion 50d which is suitable for generating white light, then the brightness of the light emitted by the illumination device 1000 can also be set in a particularly simple manner by the energization of this color subregion.

Figure 41:
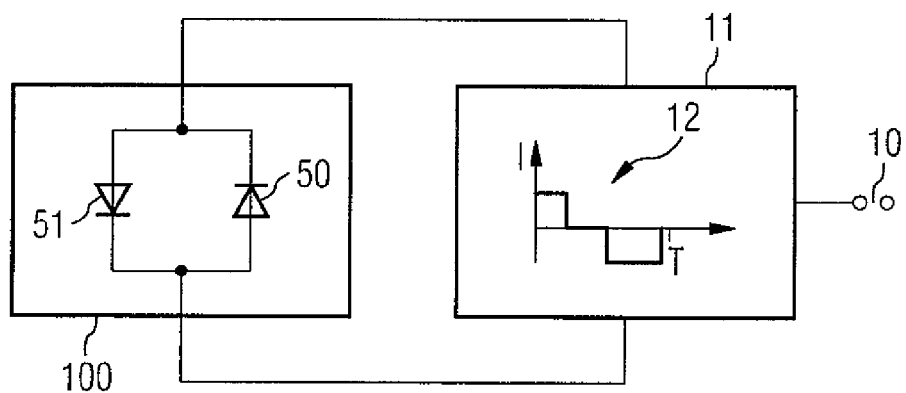
FIG. 41 shows a schematic plan view of a luminous means in accordance with a further exemplary embodiment.

FIG. 41 shows, in a schematic plan view, a further exemplary embodiment of a luminous means 100 described here. The luminous means 100 has at least two color subregions 51 and 50. The color subregions can be arranged for example in a manner corresponding to the color subregions of the multicolored luminous means described in conjunction with FIGS. 35A, 35B, 35C, 36, 37, 38, 39, 40A, 40B.

In the case of the luminous means 100 described in conjunction with FIG. 41, the first and second color subregions 50, 51 are reverse-connected in parallel with one another. That is to say that if the luminous means 100 is energized in a first direction, for example the first color subregions 50 are connected in the forward direction, such that they generate light of the first color. The second color subregions 51 are then connected in the reverse direction, such that no light is generated in the second color subregions.

By simple reversal of the current direction, in a next time step the second color subregions 51 can be energized in the forward direction, such that light of the second color is generated. The first color subregions 50 are then connected in the reverse direction, such that no light is generated in the first color subregions 50.

In this case, the color subregions 50 can be integrated onto a common substrate. Furthermore, it is also possible for the color subregions to be individual, small luminous means that are reverse-connected in parallel with one another.

Such a luminous means 100 is preferably driven by means of a controller 11 into which a pulse width modulation circuit 12 is integrated. The pulse width modulation circuit 12 is suitable for generating for first time periods current which has a first current direction. For second time periods, the pulse width modulation circuit 12 is suitable for generating current which has a second current direction, which is directed opposite to the first current direction.

The controller 11 of the luminous means 100 can either be integrated into the luminous means 100 or it is arranged outside the luminous means. The luminous means 100 is energized by a power supply 10 via the controller 11.

Figure 42:
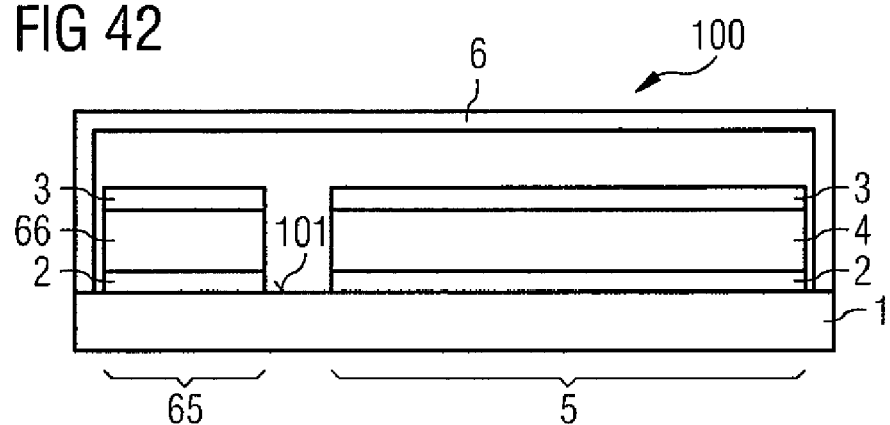
FIG. 42 shows a schematic sectional illustration of a luminous means in accordance with a further exemplary embodiment.

FIG. 42 shows, in a schematic sectional illustration, a luminous means 100 in accordance with a further exemplary embodiment of a luminous means 100 described here.

The substrate of the luminous means 100 comprises an active region 5. The active region comprises at least a first electrode 2, an organic layer stack 4 and a second electrode 3.

A photodetector 65 is arranged on the substrate at a distance from the organic layer stack.

The photodetector 65 can be produced for example jointly with the organic layer stack and the electrodes on the active region 5. The photodetector 65 comprises at least a first electrode, a second electrode 3 and a photodetecting layer sequence 66 arranged between the two electrodes. The photodetecting layer sequence 66 comprises an organic material. The photodetecting layer sequence 66 therefore comprises at least one layer which contains an organic material.

In this case, it is possible, in particular, for the photodetector 65 to be constructed in just the same way as the organic layer stack between the two electrodes of the luminous means 100.

The photodetector 65 is provided for detecting the brightness and/or the color locus of the light generated by the active region 5. For, this purpose, the photodetector 65 can be connected to a controller 11 comprising a corresponding evaluation circuit. The controller 11 is preferably likewise arranged on the first main surface 101 of the substrate 1 of the luminous means 100. As an alternative, it is possible for the controller 11 to be arranged outside the luminous means 100.

As illustrated in the schematic sectional illustration in FIG. 42, the photodetector 65 and the organic layer stack can be encapsulated by a common encapsulation 6. The encapsulation is one of the encapsulations presented in connection with the luminous means 100 described further above. That is to say that the encapsulation 6 is formed for example by a glass, a plastic film, a plastic-glass-plastic laminate, a metal film, a metallic sheet, a cap or a thin-film encapsulation. The encapsulation 6 and/or the substrate 1 of the luminous means 100 are embodied in light-transmissive fashion.

Figure 43:
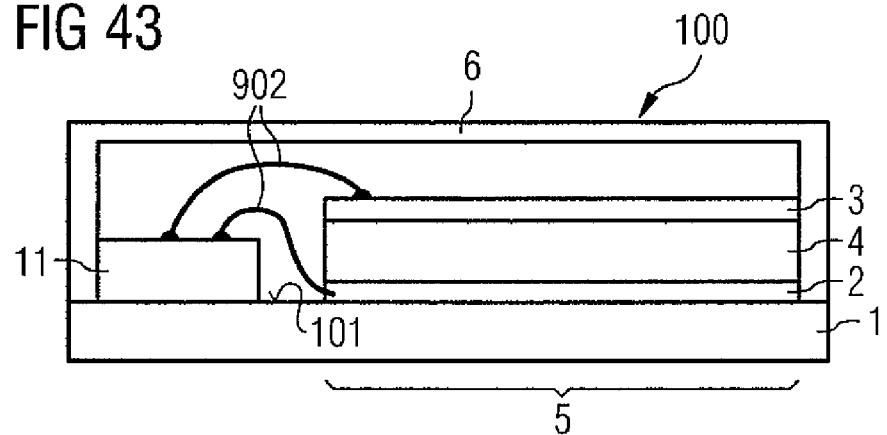
FIG. 43 shows a schematic sectional illustration of a further luminous means in accordance with a further exemplary embodiment.

In conjunction with FIG. 43, a further exemplary embodiment of a luminous means described here is explained with reference to a schematic sectional illustration.

In this exemplary embodiment, a controller 11 is arranged jointly with the organic layer stack of the luminous means 100 on the first main surface 101 of the substrate 1. In this case, the controller 11 can contain an organic material, for example. The controller can then advantageously be produced by means of the same production methods as the active region 5. This enables the luminous means 100 to be produced in a particularly cost-effective manner. The controller 11 is electrically conductively connected to the organic layer stack of the luminous means 100 either via additional electrical leads 9 such as, for example bonding wires 902 or by means of the first and second electrodes 2, 3. The controller 11 is suitable for energizing the active region 5 of the luminous means 100 in a predeterminable manner.

In particular, it is also possible that the controller 11 can be set externally—for example by a user of the luminous means 100. That is to say that a user can set a specific operating state of the luminous means 100 via the controller 11. As is furthermore shown in FIG. 43, the controller 11 and the organic layer stack of the luminous means 100 are encapsulated by a common encapsulation 6. The encapsulation 6 is one of the encapsulations 6 presented in connection with the luminous means 100 described further above. That is to say that the encapsulation 6 is formed for example by a glass, a plastic film, a plastic-glass-plastic laminate, a metal film, a metallic sheet, a cap or a thin-film encapsulation. The encapsulation 6 and/or the substrate 1 of the luminous means 100 are embodied in light-transmissive fashion.

Figure 44:
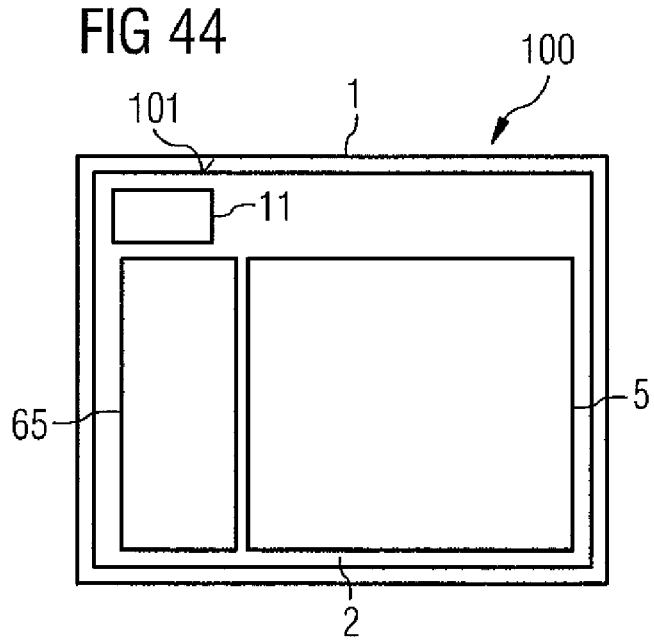
FIG. 44 shows a further exemplary embodiment of a luminous means in a schematic plan view.

FIG. 44 shows a further exemplary embodiment of a luminous means 100 described here, in a schematic plan view. In this exemplary embodiment of the luminous means, both a photodetector 65, such as was explained in conjunction with FIG. 42, and a controller 11, such as was described in greater detail in conjunction with FIG. 43, are arranged jointly on the first main surface 101 of the substrate 1 of the luminous means 100. This enables a particularly compact and autonomous luminous means 100. The photodetector is preferably connected to the controller 11, which is suitable for energizing the organic layer stack of the luminous means 100 depending on measured values determined by the photodetector 65. The measured values can be for example the brightness and/or the color locus of the light generated by the organic layer stack 4 of the luminous means 100. Furthermore, it is possible for the photodetector 65 additionally or alternatively to be provided for detection of the ambient light. In this case, the organic layer stack is also energized in a manner dependent on the ambient brightness.

In the exemplary embodiment of the luminous means 100 described in conjunction with FIG. 44, it is possible, in particular, for the organic layer stack, the photodetector 65 and the controller 11 to contain at least one organic material in each case. These elements of the luminous means 100 can be produced by the same production methods. This enables the luminous means 100 to be produced in a particularly simple and cost-effective manner.

Figure 45:
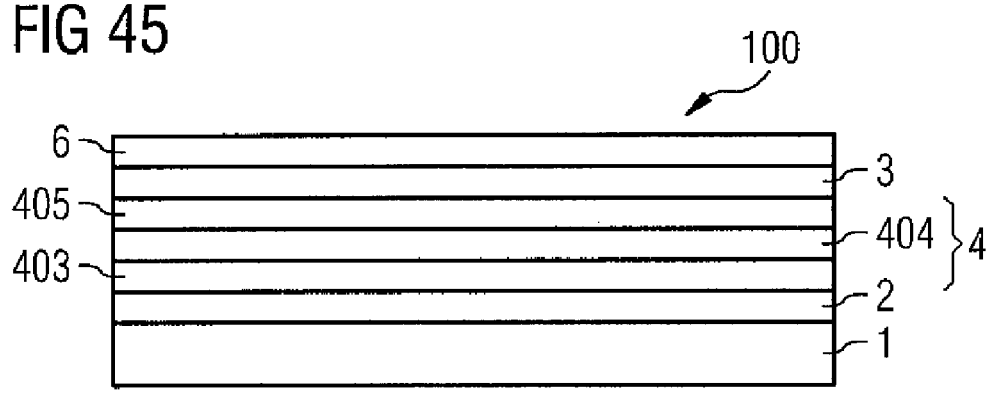
FIG. 45 shows a schematic sectional illustration of a luminous means in accordance with a further exemplary embodiment.

A further exemplary embodiment of a luminous means 100 described here is explained in conjunction with the schematic sectional illustration in FIG. 45.

In accordance with the exemplary embodiment described in conjunction with FIG. 45, the organic layer stack 4 comprises—in contrast to some of the exemplary embodiments of the luminous means described further above—a plurality of layers 403, 404, 405 provided for generating light.

Each of these layers provided for generating light forms a color subregion of the luminous means 100. That is to say that the color subregions of the luminous means are arranged vertically one above another in this exemplary embodiment. The different layers provided for generating light preferably differ with regard to their emitter material. The layers are therefore suitable for generating light of mutually different colors during operation of the luminous means. By way of example, the first layer 403 provided for generating light is suitable for generating red light. The second layer 404 is then suitable for generating green light. The fourth layer 405 provided for generating light is suitable for generating blue light.

The following emitter materials are suitable for example for generating light of the specified color:
blue: DPVBi 4,4'-bis(2,2-diphenylethen-1-yl)-diphenyl
blue: SEB-020
green: Irppy=fac-tris(2-phenylpyridyl)iridiuxn complex
red: TER-012
red: DCM2: 4-(dicyanomethylene)-2-methyl-6-(julolidine-4-ylvinyl)-4H-pyran The remaining elements of the luminous means 100 such as, for example, the substrate 1, the first electrode 2, the second electrode 3 and the encapsulation 6 are embodied in accordance with one of the other exemplary embodiments of luminous means 100.

Figure 46:
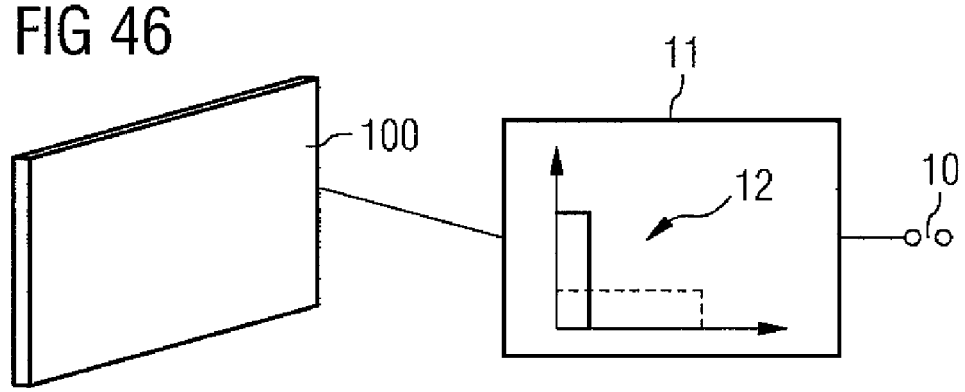
FIG. 46 shows the luminous means in accordance with FIG. 45 in a schematic perspective illustration.

FIG. 46 shows the luminous means 100 illustrated in conjunction with FIG. 45, in a schematic perspective diagram. The luminous means is connected to a controller 11 suitable for setting the color of the light generated by the luminous means 100. For this purpose, the controller 100 preferably comprises a pulse width modulation circuit 12. Depending on the electric field strength established upon energization of the luminous means 100 between the first electrode 2 and the second electrode 3 in the layer stack 4, it is possible to control the recombination of the charge carriers in the organic layer stack 4 in such a way that the recombination predominantly takes place in a specific, predeterminable layer provided for generating light. That is to say that in this way it is possible for example to effect a setting that the recombination takes place principally in the layer 404 provided for generating light. In this way, predominantly green light is then generated by the luminous means 100.

In this case, the field strength in the organic layer stack 4 can be set by the pulse width modulation circuit 12 of the controller 11. The electric field strength can be regulated for example by means of the pulse duration and the pulse height of the pulse-width-modulated signal.

Figure 47:
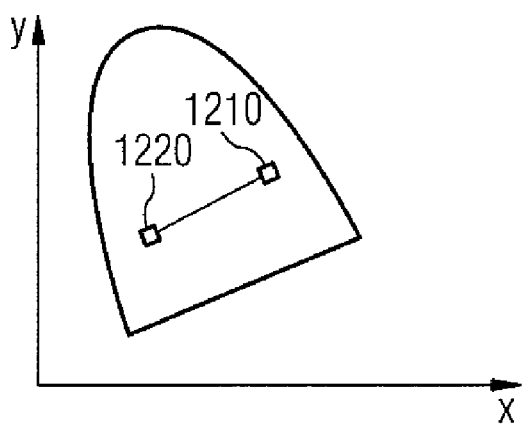
FIG. 47 shows a schematic illustration of the CIE standard chromaticity diagram.

As illustrated schematically in FIG. 47, the color in the CIE standard chromaticity diagram of the light generated by the luminous means 100 is dependent on whether the pulse width modulation circuit 12 generates a pulse-width-modulated signal having a short pulse duration 20 or the luminous means 100 is energized by means of a continuous current 1210.

In this case, the pulse height of the pulse-width-modulated signal essentially determines the brightness of the light generated by the luminous means 100. That is to say, in summary, that the color and brightness of the light generated by the luminous means 100 can be set by means of the pulse width modulated circuit 12.

The controller 11 can additionally be connected to a photodetector 65. The photodetector 65 is suitable for example, as described in conjunction with FIGS. 42 and 43, for detecting the color locus and/or the brightness of the light generated by the luminous means 100. The setting of a specific color locus of the light generated by the luminous means 100 is then possible by regulation in a manner dependent on the values determined by the photodetector 65. That is to say that the controller 11 comprises a regulating circuit that can set a specific color locus of the light generated by the luminous means 100. In this case, the desired color locus can preferably be predetermined by a user from outside the luminous means.

Figure 48A:
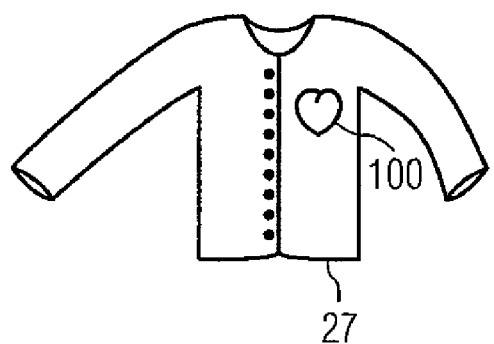
FIG. 48A shows a schematic illustration of a flirtation indicator in accordance with one exemplary embodiment having a multicolored luminous means.

In conjunction with FIG. 48A, one possibility for use of a multicolored luminous means 100 such as has been described in conjunction with one of the previous exemplary embodiments is explained with reference to a schematic plan view.

In this exemplary embodiment, the luminous means 100 is applied to a textile garment 27. The luminous means 100 is fixed to the garment 27 for example by means of a hook-and-loop fastening 34 arranged at the second main surface 102 of the substrate of the luminous means; in this respect, also see FIG. 49.

Figure 48B:
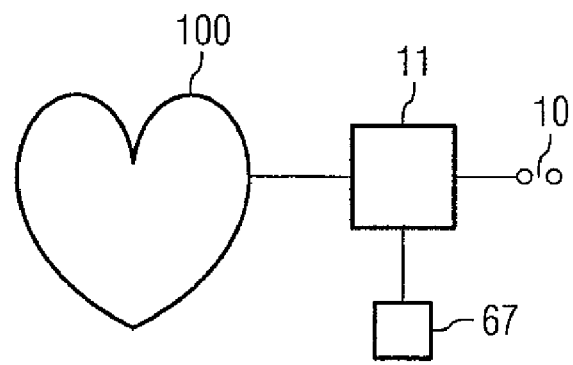
FIG. 48B shows a schematic illustration of the luminous means in accordance with FIG. 48A together with a controller.

As illustrated in a schematic illustration in FIG. 48B, the luminous means 100 is connected to a controller 11, which can comprise a pulse width modulation circuit, for example. The wearer of the garment 27 can set the brightness and color of the light generated by the luminous means 100 by means of the controller 11. Furthermore, it is possible for the controller 11 to be provided for setting the brightness and/or color of the light generated by the luminous means 100 in a manner dependent on measured values determined by the sensor 67.

The sensor 67 can be for example a sensor suitable for determining body temperature, pulse rate and/or skin resistance of the wearer of the garment 27.

An increased body temperature can be signaled for example by the generation of red light by the luminous means 100. A low temperature can be signaled by the generation of blue light by the luminous means 100.

Overall, the garment 27 together with the luminous means 100 forms an illumination device in the case of which the garment 27 is provided as the carrier. The power supply 10 of the luminous means 100 can be effected for example by a battery integrated into the garment 27 or the luminous means 100.

The luminous means 100 is used for example as a flirtation indicator. The wearer of the garment 27 comprising the luminous means 100 can then signal his/her willingness to flirt via the setting of the color of the light generated by the luminous means 100.

Furthermore, a use of such a garment 27 comprising luminous means 100 in medical or military applications is also conceivable. The luminous means 100 enables a simple monitoring of specific body functions such as body temperature, skin resistance and pulse rate of the wearer of the garment 27.

Figure 49:
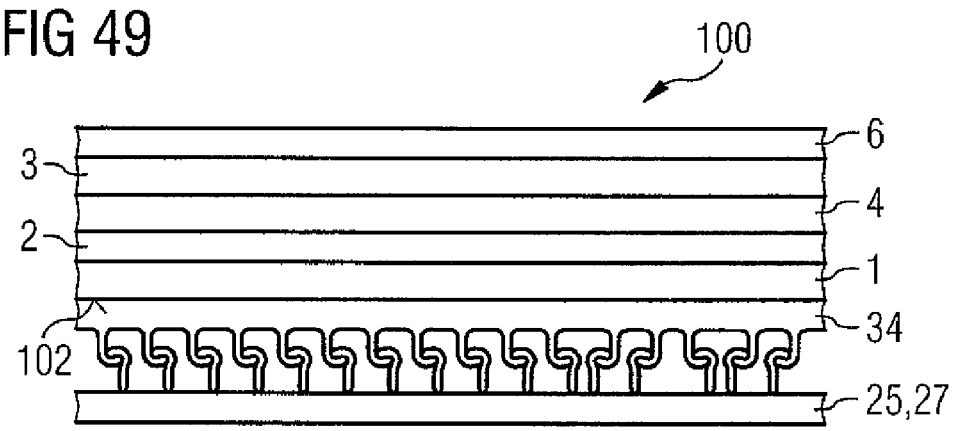
FIG. 49 shows a schematic sectional illustration of a luminous means in accordance with one exemplary embodiment, FIG. 50 schematically shows a further possibility for the use of a multicolored luminous means.

FIG. 49 shows, in a schematic sectional illustration, an exemplary embodiment of a luminous means described here. The luminous means 100 is for example a flexible and/or multicolored luminous means 100 such as has been described in conjunction with exemplary embodiments explained further above.

A hook-and-loop fastening 34 is applied to the second main surface 102 of the substrate 1, remote from the first main surface of the substrate 1. The hook-and-loop fastening 34 is for example adhesively bonded onto the second main surface 102 of the substrate 1, remote from the first main surface of the substrate 1. With the hook-and-loop fastening 34, the luminous means 100 is mechanically connected to a textile material, for example a garment 27 or a curtain 25.

Figure 50:
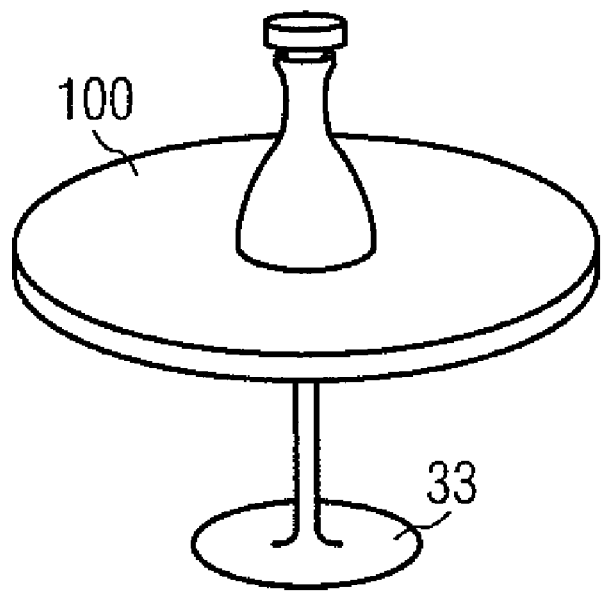

In conjunction with FIG. 50, a further possibility for use of a multicolored luminous means such as has been described for example in connection with one of the above figures is explained with reference to a schematic perspective diagram. In this case, the luminous means 100 is fixed to an item 33 of furniture, for example on a table top. The fixing of the luminous means 100 can be effected by means of an adhesive layer for example as explained in conjunction with FIG. 32. The color of the light emitted by the luminous means 100 can be set depending on the user's desire. Such an item 33 of furniture can be used not only for use domestically but also for product presentations.

Figure 51:
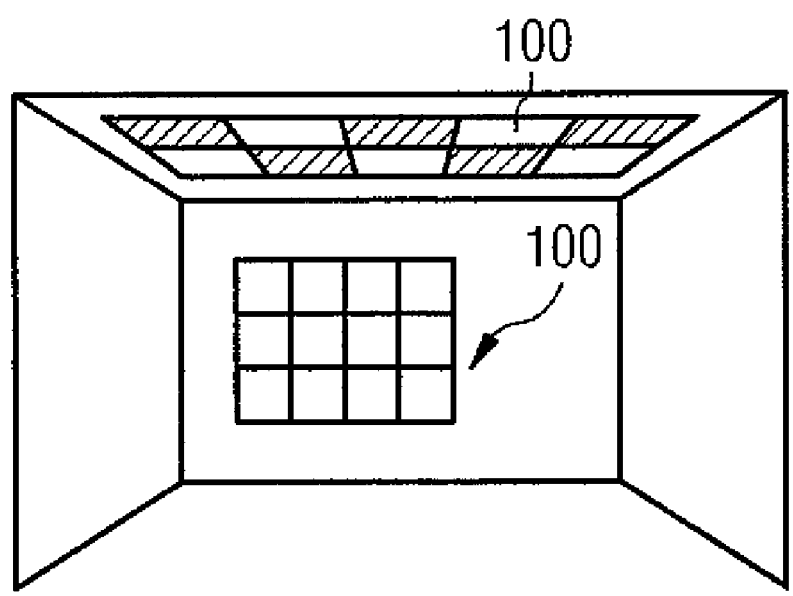
FIG. 51 shows a schematic perspective illustration of the use of multicolored luminous means.

FIG. 51 shows, in a schematic perspective diagram, the use of multicolored luminous means 100 as room lighting, for example as ceiling or wall luminaries.

Depending on the user's desire, in this way the room can be illuminated with light of a specific color and/or a specific color temperature. In this case, it is possible, in particular, for the multicolored luminous means 100 to be a flexible, light-transmissive and/or reflective luminous means 100.

Figure 52:
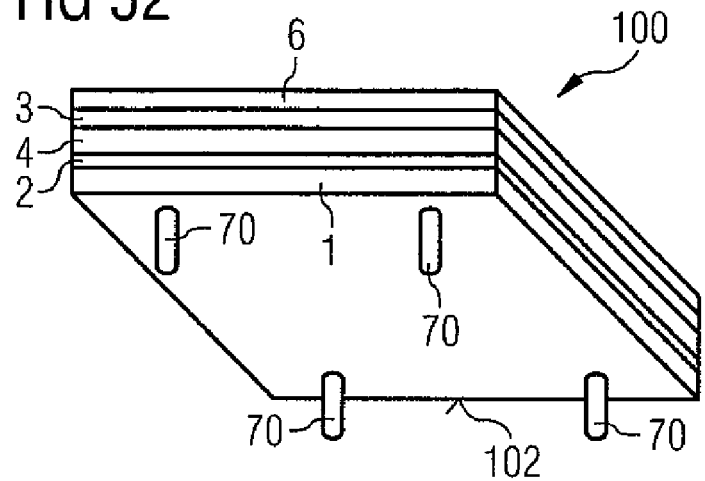
FIG. 52 shows a schematic perspective illustration of a luminous means in accordance with one exemplary embodiment.

FIG. 52 shows a schematic perspective illustration of an exemplary embodiment of a luminous means 100 described here.

Substrate 1, electrodes 2, 3, organic layer stack 4 and encapsulation 6 of the luminous means 100 are embodied in accordance with any other luminous means described here.

In the exemplary embodiment in FIG. 52, electrical connection locations 70 are formed at the second main surface 102 of the substrate 1 of the luminous means 100. In the exemplary embodiment described in conjunction with FIG. 42, the connection locations 70 are embodied as connection locations which project from the substrate. The connection locations 70 are connected to the first electrode 2 and the second electrode 3 of the substrate for example by means of the electrical leads described further above and serve for making electrical contact with the luminous means 100 from outside the luminous means 100.

Furthermore, the connection locations 70 of the luminous means 100 described in conjunction with FIG. 52 serve for mechanical fixing of the luminous means 100 to another luminous means 100 or on a carrier.

Figure 53:
FIG. 53 shows a schematic illustration of a connection location in accordance with one exemplary embodiment, such as can be used for instance in the case of the luminous means in FIG. 52.

FIG. 53 shows a first possibility for the embodiment of the connection locations 70 in the exemplary embodiment of the luminous means 100 as described in conjunction with FIG. 52. In this case, the connection locations 70 of the luminous means 100 are embodied as connection pins 71. The connection pins are embodied in cylindrical fashion, for example. The connection pins are pressed into corresponding connection holes for the contact-connection and fixing of the luminous means 100. Preferably, in this case in addition to the electrical contact-connection, a mechanical fixing of the luminous means 100 also takes place by means of an interference fit.

Figure 54:
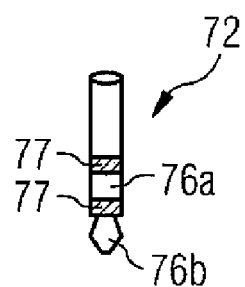
FIG. 54 shows a further schematic perspective illustration of a connection location in accordance with one exemplary embodiment, such as can be used in the case of FIG. 52.

In conjunction with FIG. 54, a further possibility of the configuration of the connection locations 70 of the luminous means 100 in FIG. 52 is shown in a schematic perspective diagram. In this case, the connection locations 70 are embodied as connection plugs 72. The connection plug in FIG. 54 is embodied in the manner of a jack plug. The connection plug 72 has a first electrically conductive region 76*a*, which is electrically conductively connected for example to the first electrode 2 of the luminous means 100. Furthermore, the connection plug 72 has a second electrically conductive region 76*b*, which is electrically conductively connected to the second electrode 3 of the luminous means 100. Electrically insulating regions 77 isolate the two electrically conductive regions 76*a*, 76*b* from one another.

Figure 55:
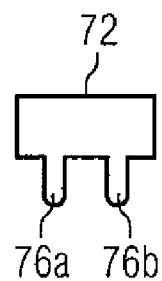
FIG. 55 shows a schematic plan view of a connection location such as can be used in the case of the luminous means of the exemplary embodiment in FIG. 52.

In conjunction with FIG. 55, a further possibility of configuration for the connection locations 70 of the luminous means 100 as illustrated in FIG. 52 is shown in a schematic plan view. In this case, the connection location 70 is embodied as a connection plug 72, wherein the electrically conductive regions 76*a*, 76*b* are arranged laterally alongside one another. In this case, the conductive regions 76*a*, 76*b* are embodied in cylindrical fashion.

An exemplary embodiment of a luminous means 100 described here is explained in greater detail with reference to the schematic perspective diagram in FIG. 56.

In contrast to the exemplary embodiment in FIG. 52, in this exemplary embodiment the connection locations 70 are arranged at the side surfaces 105 of the substrate 1 of the luminous means 100. In this case, the connection locations 70 can be embodied as explained in conjunction with FIGS. 53, 54 and 55. That is to say that the connection locations are embodied as connection pins or connection plugs.

Figure 56:
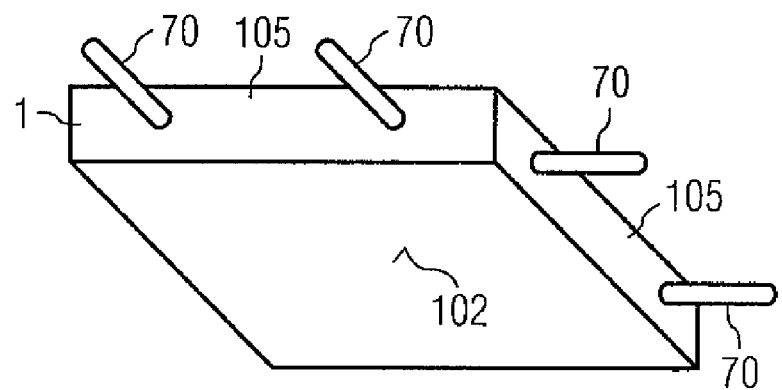
FIG. 56 shows a schematic perspective illustration of a luminous means in accordance with a further exemplary embodiment.

The arrangement of the connection locations 70 at the side surfaces 105 of the luminous means as shown in FIG. 56 enables, in a particularly simple manner, the connection and electrical contact-connection of a plurality of luminous means 100 embodied in the same way to form an illumination device having an extended luminous surface. In this case, the luminous surface of the illumination device is composed of the light-emitting front sides of the luminous means of the illumination device.

Figure 57:
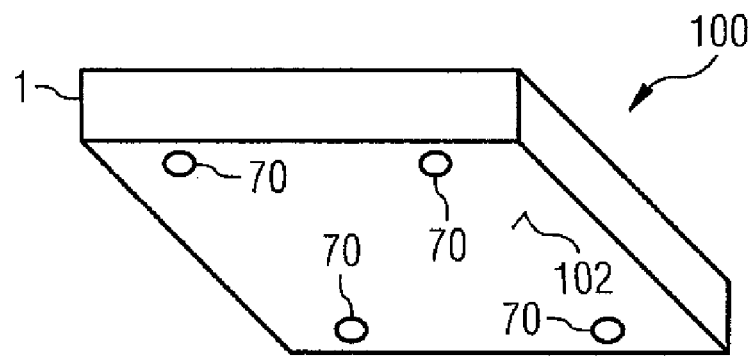
FIG. 57 shows a schematic perspective illustration of a luminous means in accordance with a further exemplary embodiment.

A further exemplary embodiment of a luminous means 100 is described in conjunction with the schematic perspective diagram in FIG. 57. In this exemplary embodiment, the connection locations 70 are formed at the second main surface 102 of the substrate 1 of the luminous means 100. In this case, the connection locations 70 are formed by cutouts or perforations in the substrate 1.

Figure 58:
FIG. 58 shows a schematic plan view of a connection location in accordance with one exemplary embodiment such as can be used in the case of the luminous means in FIG. 57.

FIG. 58 shows, in a schematic plan view, a first possibility for the configuration of the connection locations 70 of the luminous means 100 in FIG. 57. In this case, the connection location 70 is embodied as an electrically conductive cutout 73 or contact hole. By pressing in a connection pin as shown in FIG. 53, for example, the luminous means 100 can be electrically contact-connected and mechanically fixed via the electrically conductive cutout.

Figure 59:
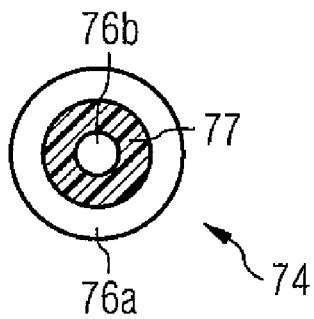
FIG. 59 shows a further schematic plan view of a connection location in accordance with one exemplary embodiment such as can be used in the case of the luminous means in FIG. 57.

The schematic plan view in FIG. 59 shows a further exemplary embodiment for the connection locations 70 of the luminous means 100 described in conjunction with FIG. 57. In this case, the connection locations 70 are embodied as connection sockets 74. Each connection socket 74 has two electrically conductive regions 76*a*, 76*b* which are connected to a respective electrode 2, 3 of the luminous means 100. By way of example, such a connection socket 74 can be electrically contact-connected by means of a connection plug 72 as shown in FIG. 54.

Figure 60:
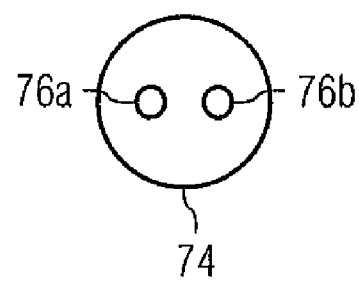
FIG. 60 shows a schematic plan view of a further embodiment of the connection location such as can be used in the case of the luminous means in FIG. 55.

FIG. 60 shows, in a schematic plan view, a further embodiment of the connection locations 70 of the luminous means 100 in FIG. 57. In this case, the electrically conductive regions 76*a*, 76*b* are embodied as electrically conductive—for example metallic—coatings of a connection socket which are arranged in the substrate 1 of the luminous means 100. In this case, the electrically conductive regions 76*a* and 76*b* are arranged laterally alongside one another. By way of example, such a connection socket 74 can be electrically contact-connected by means of a connection plug 72 as shown in FIG. 55.

Figure 61:
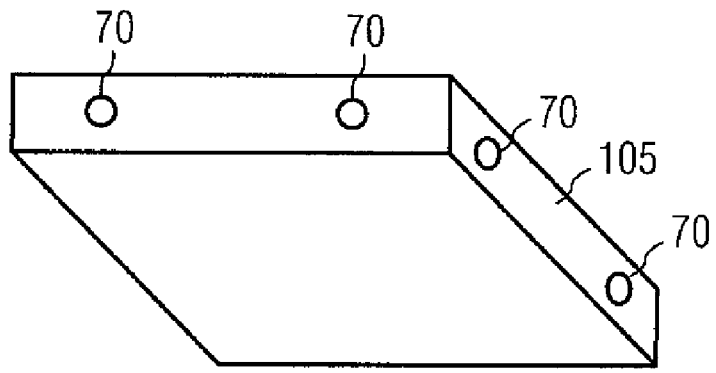
FIG. 61 shows a schematic perspective illustration of a luminous means in accordance with a further exemplary embodiment.

The schematic perspective diagram in FIG. 61 shows a further exemplary embodiment of a luminous means 100 described here. In contrast to the luminous means described in conjunction with FIG. 57, the connection locations are embodied as cutouts in the side surfaces 105 of the substrate 1 of the luminous means 100. In this case, the concrete configuration of the connection locations 70 can be effected in accordance with the connection locations 70 described in conjunction with FIGS. 58, 59 and 60.

FIG. 62A shows, in a schematic perspective diagram, a further exemplary embodiment of a luminous means 100 described here. In this exemplary embodiment, the electrical contact-connection and the mechanical fixing of the luminous means are realized by mutually separate elements. The mechanical fixing of the luminous means is effected by means of mechanical connectors 78. In the exemplary embodiment in FIG. 62A, the mechanical connectors are arranged at the second main surface 102 of the substrate 1 of the luminous means 100. The mechanical connectors 78 are embodied as clips which engage into corresponding cutouts in order to fix the luminous means 100.

FIG. 62B shows, in a schematic perspective illustration, a pin connection 75 in an excerpt enlargement.

For the electrical contact-connection of the luminous means, the luminous means 100 has a pin connection 75, which is likewise arranged at the second main surface 102 of the substrate 1. The pin connection 75 comprises a plurality of pins 75*a*. At least one of the pins 75*a* makes contact with the first electrode 2, and at least one second pin 75*b* makes contact with the second electrode 3. Further pins 75*c* can be provided for example for making contact with a controller 11 integrated into the luminous means 100.

In conjunction with FIG. 63A, a further exemplary embodiment of a luminous means 100 described here is elucidated in a schematic plan view. In this exemplary embodiment, too, the mechanical connectors 78 are arranged separately with respect to the electrical connection locations 70 of the luminous means 100. Both the mechanical connectors 78 and the electrical connection locations 70 are arranged at the side surfaces 105 of the substrate 1 of the luminous means 100. The excerpt enlargement in FIG. 63B shows a connection location 70. The connection location has for example an electrically conductive cutout 73—for example a contact hole—and also a connection pin 71 such as had been explained in greater detail in conjunction with FIGS. 58 and 53, respectively.

FIG. 64 shows a schematic plan view of an exemplary embodiment of an illumination device 1000 described here. The illumination device 1000 comprises at least two luminous means 100. The luminous means 100 have connection locations which are arranged at the side surfaces 105 of the substrate 1 and which are embodied alternately as electrically conductive cutouts 73 and contact pins 71. The contact pins 71 of a first luminous means engage into corresponding electrically conductive cutouts 73 of a second luminous means. The connection of contact pins 71 and electrically conductive cutouts 73 produces both an electrical and a mechanical connection between the luminous means 100 of the illumination device 1000.

The mechanical connection between two respective luminous means 100 is imparted by an interference fit, for example. For this purpose, the diameter of each contact pin 71 is chosen to be equal to or greater than or equal to the diameter of each electrically conductive cutout 73. By press-fitting the contact pin 71 into the corresponding electrically conductive cutout 73, a mechanical connection is imparted which can be released again only by a large mechanical force being applied.

As an alternative, the connection locations can be embodied as contact plugs—such as have been described in conjunction with FIGS. 54 and 55—and as corresponding connection sockets—such as have been described in conjunction with FIGS. 59 and 60. This enables an electrical and mechanical connection of the luminous means 100. In this case, the mechanical connection of the luminous means 100 can be released by a relatively low mechanical force being applied. This permits a particularly simple replacement of a defective luminous means 100 from the illumination device 1000.

In conjunction with FIGS. 66 and 65, a further exemplary embodiment of the illumination device 1000 is described with reference to schematic perspective diagrams. In this exemplary embodiment, the luminous means 100 are applied to a carrier embodied as a carrier grid 81. The carrier grid 81 has connection locations 82 embodied as contact holes, for example, such as have been described in greater detail in conjunction with FIG. 58. As an alternative, the contact locations 82 can be embodied as connection sockets such as have been explained in greater detail in conjunction with FIGS. 59 and 60.

Contact pins 71 or contact plugs 72 such as have been described in conjunction with FIGS. 53, 54 and 55 form the connection locations 70 of the luminous means 100. The connection locations 70 engage into corresponding connection locations 82 of the carrier grid 81. Preferably, a multiplicity of luminous means 100 are electrically contact-connected and mechanically fixed on the carrier grid 81. The illumination device 1000 is supplied with the operating current required for operation of the luminous means 100 by a power supply 10.

Figure 65:
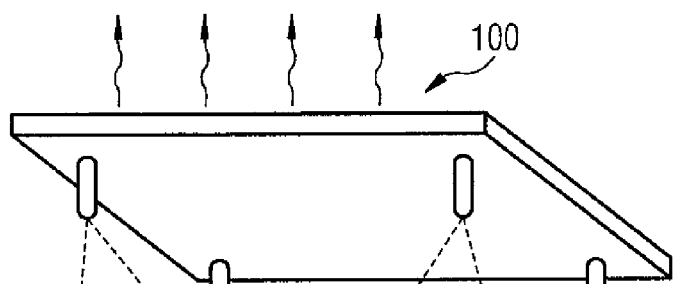
FIGS. 65 and 66 shows schematic perspective illustrations of an illumination device in accordance with a further exemplary embodiment.
Figure 66:
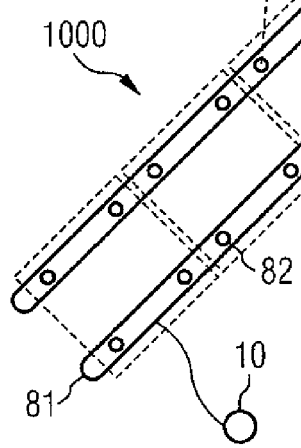
Figure 69:
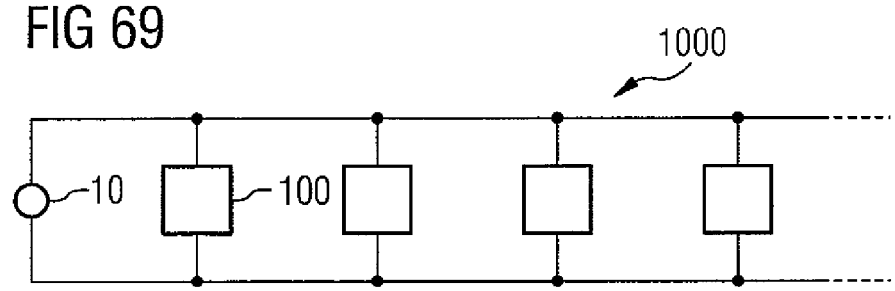
FIG. 69 shows a schematic illustration of a schematic circuit diagram in accordance with one exemplary embodiment.

A further exemplary embodiment of an illumination device 1000 described here is explained in conjunction with FIGS. 69 and 65. In this exemplary embodiment, the illumination device 1000 has a carrier plate 80 comprising a multiplicity of connection locations 82. Corresponding connection locations 70 of the luminous means 100 engage into the connection locations 82 of the carrier plate 80. For the case where the connection locations 70 of the luminous means are embodied as connection pins 71 or connection plugs 72, the connection locations 82 of the carrier plate are embodied as electrically conductive cutouts 73 or connection sockets 74. For the case where the connection locations 70 of the luminous means 100 are embodied as electrically conductive cutouts 73 or connection sockets 74, the connection locations 82 of the carrier plate 80 are embodied as connection pins 71 or connection plugs 72.

Figure 67:
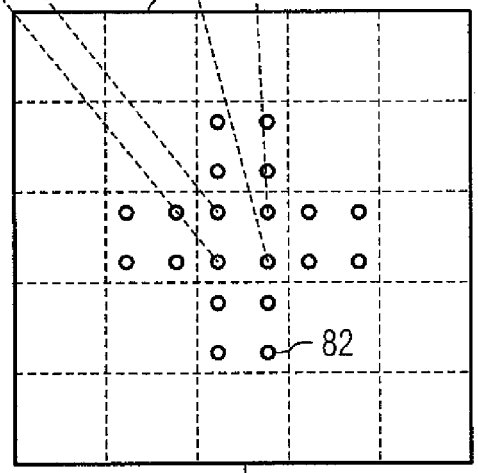

The illumination device 1000 such as has been described in conjunction with FIGS. 67 and 65 is energized by a power supply 10.

Figure 68:
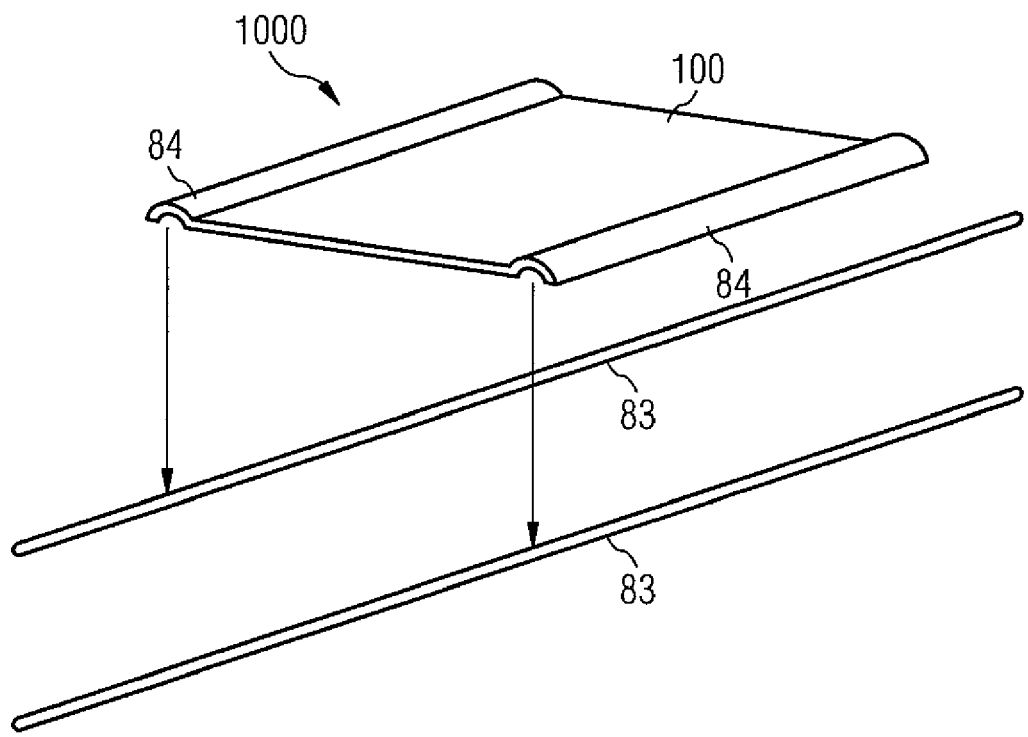
FIG. 68 shows a schematic perspective illustration of an illumination device in accordance with a further exemplary embodiment.

In conjunction with FIG. 68, a further exemplary embodiment of an illumination device 1000 described here is elucidated in a schematic perspective illustration. The illumination device 1000 has a carrier embodied in the form of a cable or rod system. The cable or rod system comprises at least two cables or rods 83 which are composed of an electrically conductive material and which run substantially parallel to one another. The luminous means 100 of the illumination device 1000 are energized via the cables or rods 83.

For the mechanical fixing and electrical contact-connection at the cables or rods 83, the luminous means 100 has two connection locations embodied as connection rails 84, which are arranged at mutually opposite side surfaces 105 of the substrate 1 of the luminous means 100.

The connection rails 84 are embodied in the manner of cut-open cylinders. The connection rails 84 extend over the entire length of the side surface 105 of the substrate 1 to which they are fixed.

The connection rails 84 engage into the cables or rods 83 of the carrier of the illumination device 1000 preferably so loosely that the luminous means 100 of the illumination device 1000 can be displaced along the cables or the rods 83 by application of a relatively low mechanical force. A particularly simple positioning of the luminous means 100 along the cables or rods 83 is possible in this way. The luminous means 100 can even be displaced along the cables or rods 83 during operation of the illumination device 1000. Overall, this permits an illumination device 1000 which can be used particularly flexibly.

In conjunction with FIG. 69, an exemplary embodiment for the interconnection of luminous means 100 of an illumination device 1000 described here is explained with reference to a schematic circuit diagram. In this exemplary embodiment, the luminous means 100 are connected in parallel with one another. The luminous means 100 are supplied with operating voltage for example by a voltage source 10. In this case, it is possible for the luminous means 100 each to comprise an integrated controller 11.

Figure 70:
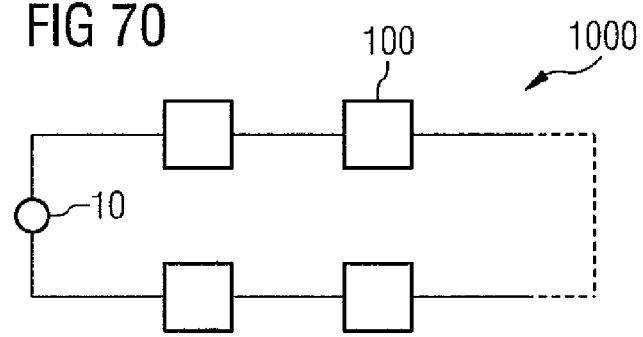
FIG. 70 shows a further schematic circuit diagram in accordance with a further exemplary embodiment.

In conjunction with FIG. 70, a further exemplary embodiment of an illumination device 1000 described here is explained with reference to a schematic circuit diagram. In this case, the luminous means 100 of the illumination device 1000 are connected in series with one another. In this case, the luminous means 100 are supplied with the necessary operating current by a current source 10. In this case, it is possible for the current source 10 to be suitable for the self-identification of the number of luminous means 100 of the illumination device 1000. The luminous means 100 can furthermore comprise an integrated controller 11 such as has been described further above.

The identification of the luminous means 100 can be effected for example by a measurement of the current intensity or voltage. In this case, the possible failure of one or a plurality of luminous means 100 can also be detected during operation.

Figure 71:
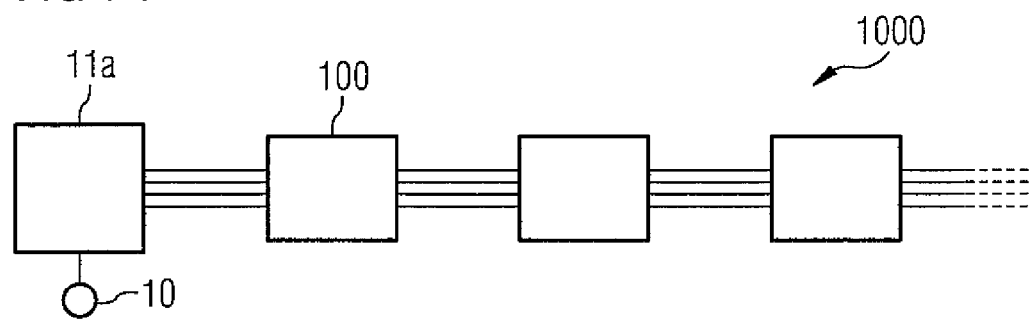
FIG. 71 shows a schematic illustration of an illumination device in accordance with a further exemplary embodiment.

A further exemplary embodiment of an illumination device 1000 described here is explained in conjunction with FIG. 71. In this case, the luminous means 100 are equipped with a controller 11 such as has been described further above. A further controller 11a of the illumination device 1000 supplies the luminous means 100 with the required operating current and also control signals for the controllers 11 of the luminous means 100.

Figure 72:
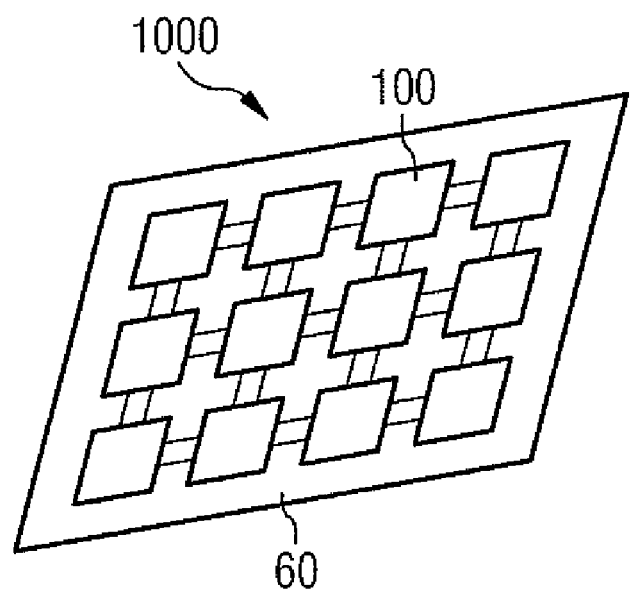
FIG. 72 shows a schematic perspective illustration of an illumination device in accordance with a further exemplary embodiment.

In conjunction with FIG. 72, a further exemplary embodiment of an illumination device 1000 described here is explained with reference to a schematic perspective illustration. The illumination device 1000 has a multiplicity of luminous means 100 which are either directly connected to one another by means of the connection and connecting techniques described above or which are applied to a carrier in the manner described above and are electrically connected thereto.

An optical element 60 is disposed downstream of the luminous means 100 at their light-emitting front side, said optical element being formed by a diffuser plate, for example. The optical element can be formed for example by a light-transmissive plate—for example a glass plate—into which light-scattering particles are introduced. As an alternative, it is possible for the surface of the radiation-transmissive plate to be roughened, such that a diffuse scattering of the light passing through takes place on account of light refraction in the course of passing through the plate. The light from the luminous means 100 is scattered by the diffuser plate in such a way that the individual luminous means are no longer separately perceptible by the observer. A large-area illumination device 1000 having a particularly large, homogeneous luminous surface is realized in this way. In this case, the luminous surface of the illumination device is composed of the light-emitting front sides of the luminous means of the illumination device.

Figure 73:
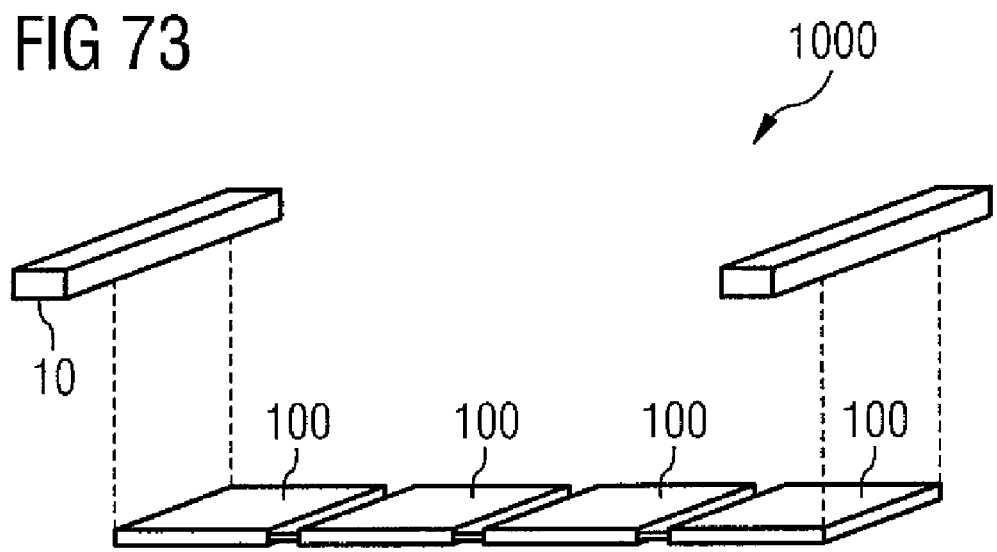
FIG. 73 shows a schematic perspective illustration of an illumination device in accordance with a further exemplary embodiment.

In conjunction with FIG. 73, a further exemplary embodiment of an illumination device 1000 is illustrated with reference to a schematic perspective diagram. The illumination device 1000 can be used for example as a sealing luminaire. The illumination device 1000 comprises a plurality of luminous means 100, which either are electrically and mechanically connected to one another by connection locations at the side surfaces 105 of the substrates 1 of the luminous means 100 as described above or which are fixed and electrically contact-connected by means of rods or cables 83.

Figure 74:
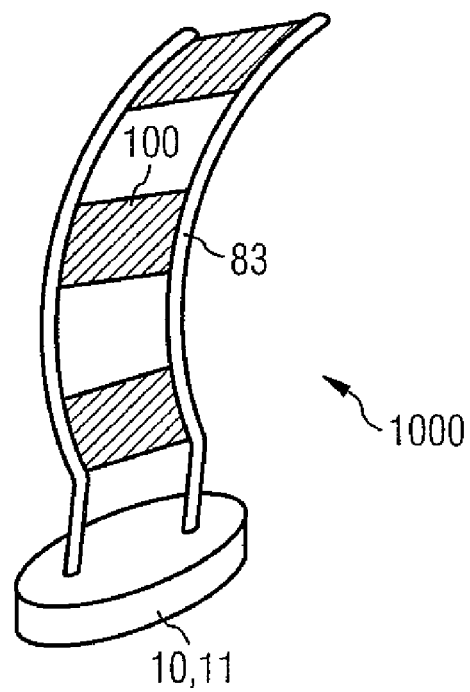
FIG. 74 shows a schematic perspective illustration of an illumination device in accordance with a further exemplary embodiment.

A further exemplary embodiment of an illumination device 1000 is described in conjunction with the schematic perspective illustration in FIG. 74. The illumination device 1000 comprises a base in which the power supply 10 and also a driving apparatus 11 are integrated. The luminous means 100 of the illumination device 1000 are mechanically fixed and electrically contact-connected by means of rods 83. The luminous means described in conjunction with the exemplary embodiments above can once again be used as luminous means 100.

The illumination device 1000 described in conjunction with FIG. 74 is particularly well suited as a standard or table lamp.

Figure 75:
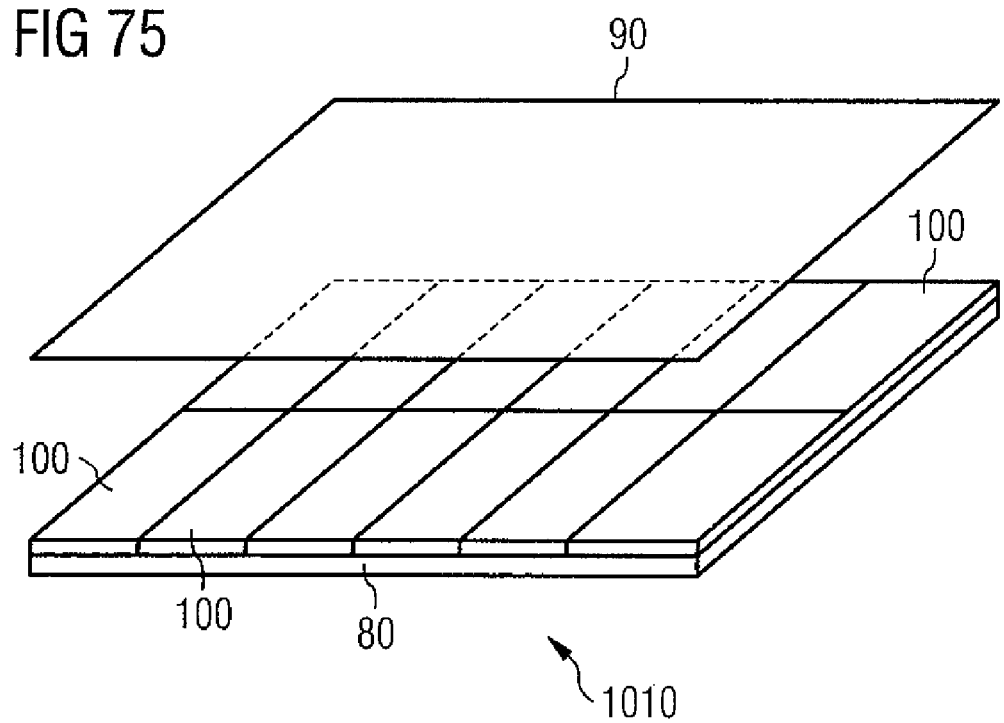
FIG. 75 shows a schematic perspective illustration of a display apparatus in accordance with one exemplary embodiment.

In conjunction with FIG. 75, a display apparatus 1010 is explained in greater detail with reference to a schematic perspective illustration. The display apparatus 1010 comprises an illumination device 1000 as backlighting for an imaging element 90. The imaging element 90 is an LCD panel, for example. The LCD panel is backlit directly by the illumination device 1000. That is to say that the imaging element 90 is disposed downstream of the illumination device 1000 in such a way that a large part of the light generated by the illumination device 1000 during operation impinges on the imaging element 90 and backlights the latter.

The illumination device 1000 used here as a backlighting apparatus is embodied for example in accordance with one of the other exemplary embodiments described here. In this case, the illumination device comprises at least two luminous means 100 as described here.

For homogenizing the light provided for backlighting, it is furthermore possible for an optical element 60 to be arranged between the imaging element 90 and the light-emitting front side of the luminous means 100 of the illumination device 1000, said optical element then preferably being embodied as a diffuser plate. The optical element can be formed for example by a light-transmissive plate—for example a glass plate—into which light-scattering particles are introduced. As an alternative, it is possible for the surface of the radiation-transmissive plate to be roughened, such that a diffuse scattering of the light passing through takes place on account of light refraction in the course of passing through the plate. The light from the luminous means 100 of the illumination device is scattered by the diffuser plate in such a way that the individual luminous means are no longer imaged separately onto the imaging element 90. A large-area illumination device 1000 having a particularly large, homogeneous luminous surface for backlighting the imaging element 90 is realized in this way.

Figure 76:
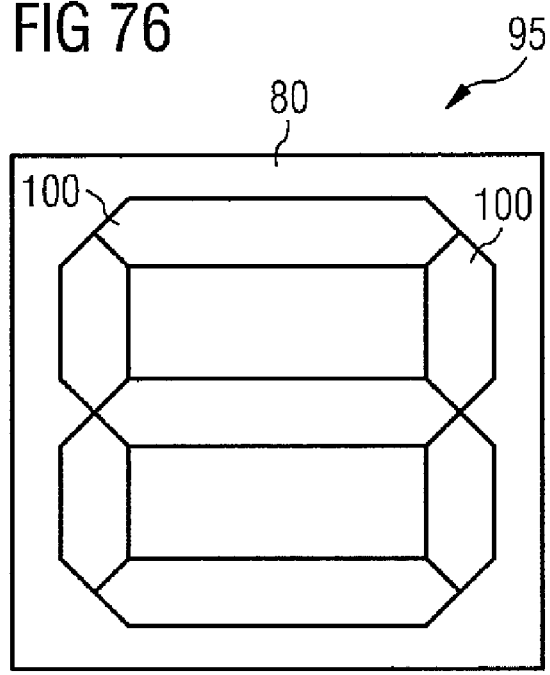
FIG. 76 shows a schematic plan view of a coarse-grained display in accordance with one exemplary embodiment.

In conjunction with FIG. 76, an exemplary embodiment of a coarse-grained display 95 is explained in greater detail with reference to a schematic plan view. The coarse-grained display is embodied as an illumination device comprising a carrier plate 80, to which a plurality of luminous means 100 are applied. The luminous means 100 are arranged for example in the manner of a seven-segment display. By energizing specific luminous means 100, a coarse-grained display 95 suitable for representing numerals is realized in this way.

Figure 77:
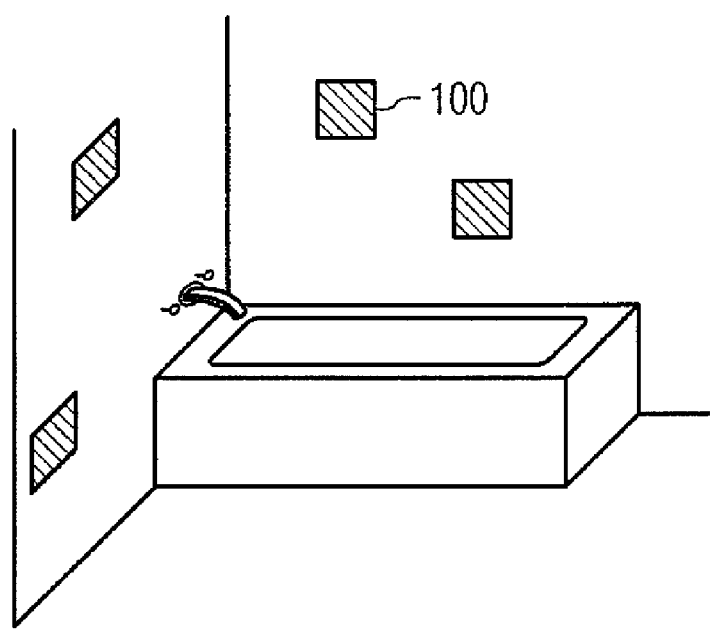
FIG. 77 shows a schematic view of a bathroom in accordance with one exemplary embodiment.

FIG. 77 shows a bathroom with luminous means 100 embodied as tiles. The luminous means 100 are embodied for example in accordance with one of the exemplary embodiments described further above. They are adhesively bonded by the second main surface 102 of the substrate 1 onto conventional sanitary tiles, by way of example. A power supply of these luminous means can be effected by means of induction, for example. In this case, it is possible to dispense with electrical conductor tracks for the connection of the luminous means 100. Therefore, these luminous means are particularly well suited to use in the sanitary sector since the risk of a short circuit on account of moisture is reduced.

A luminous means which is energized by means of induction is disclosed for example in the document DE 102006025115, the disclosure content of which with regard to the construction of such a luminous means is hereby incorporated by reference.

Figure 78:
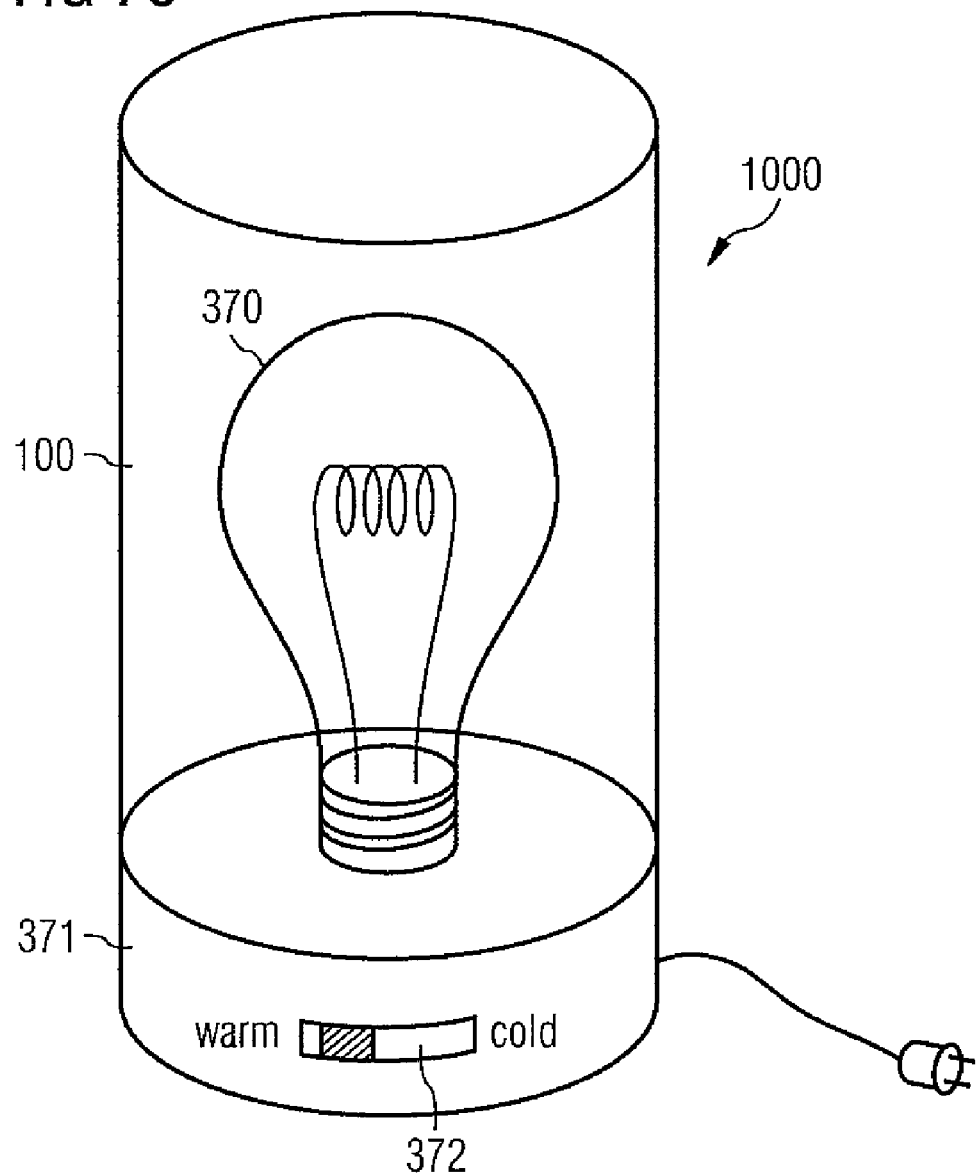
FIG. 78 shows a schematic perspective illustration of an illumination device comprising a luminous means and a second light source in accordance with one exemplary embodiment.

FIG. 78 shows a schematic perspective illustration of an illumination device 1000 comprising a luminous means 100 and a second light source 370 in accordance with one exemplary embodiment. In the present case, the second light source 370 used is an incandescent lamp that is introduced into a mount of a carrier 371. A halogen lamp, for example, could also be used instead of an incandescent lamp as the second light source 370. The incandescent lamp is embodied in such a way that it emits white light having a color locus in the warm white region of the CIE standard chromaticity diagram during operation. By contrast, the luminous means is embodied in such a way that it emits light from the cold white region of the CIE standard chromaticity diagram during operation. In the present case, the luminous means 100 is embodied such that it is flexible and transmissive to visible light. The luminous means 100 is arranged as a cylindrical lampshade around the incandescent lamp in such a way that a large part of the light emitted by the second light source passes through the luminous means. In this way, mixed-colored light comprising light from the luminous means 100 and light from the second light source 370 is emitted during operation of the illumination device.

Furthermore, the luminous means 100 and the second light source 370 are embodied in dimmable fashion, such that the proportion of the light from the incandescent lamp and the proportion of the light from the luminous means 100 in the mixed-colored light can be varied. Depending on the proportion of the light from the incandescent lamp and of the light from the luminous means, the color locus can be regulated from cold white to warm white by means of a regulator 372 in the mount of the illumination device. The illumination device in accordance with FIG. 78 is therefore a color-variable illumination device.

Figure 79:
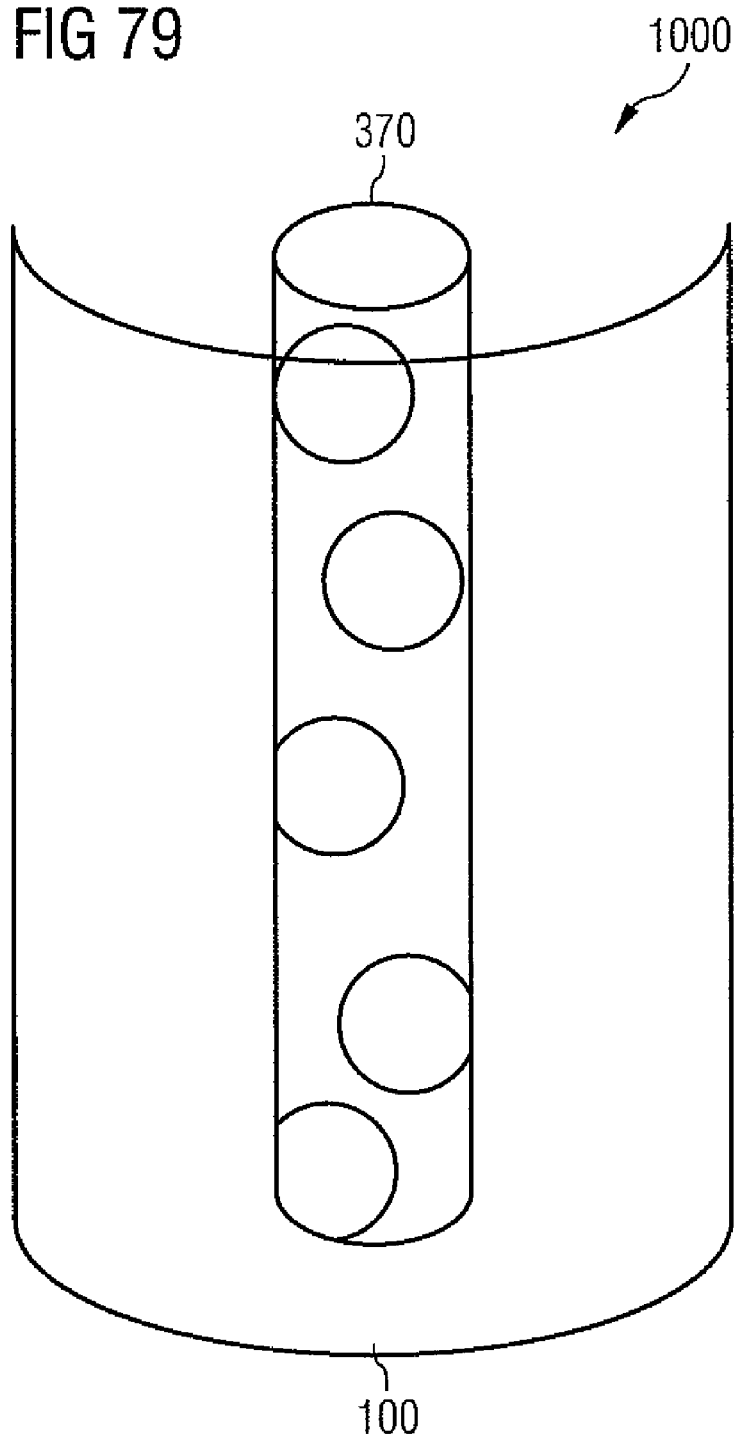
FIG. 79 shows a schematic perspective illustration of an illumination device comprising a luminous means and a second light source in accordance with a further exemplary embodiment.

FIG. 79 shows a schematic perspective illustration of a further exemplary embodiment of an illumination device 1000 comprising a luminous means 100 and a second light source 370. The illumination device is provided for being fixed to the wall. The second light source 370 is a lava lamp. The lava lamp comprises wax introduced into a carrier liquid. During operation of the lava lamp, wax and carrier liquid are heated from one side, generally from below, such that the carrier liquid circulates in the lamp on account of convection. Furthermore, the wax forms decorative shapes within the carrier liquid on account of the heating. The carrier liquid generally has a different color than the wax, such that the lava lamp emits mixed-colored light comprising components of the color of the wax and components of the color of the carrier liquid.

In the present case, the lava lamp is embodied in substantially cylindrical fashion and is fixed to the wall. The luminous means 100 is embodied in flexible fashion and is arranged as a half cylinder jacket around the lava lamp in such a way that the light which is emitted by the lava lamp and which does not radiate to the wall essentially passes through the luminous means. The luminous means 100 furthermore preferably emits light of a color which is not comprised by the light from the lava lamp. The luminous means can furthermore be embodied in dimmable fashion, for example, such that the hue of the light which is emitted by the illumination device can be altered in color by dimming the luminous means. In this way, a color-variable illumination device is obtained which can bring about particularly impressive color effects. Furthermore, it is possible for the lava lamp also to be dimmable.

Figure 80A:
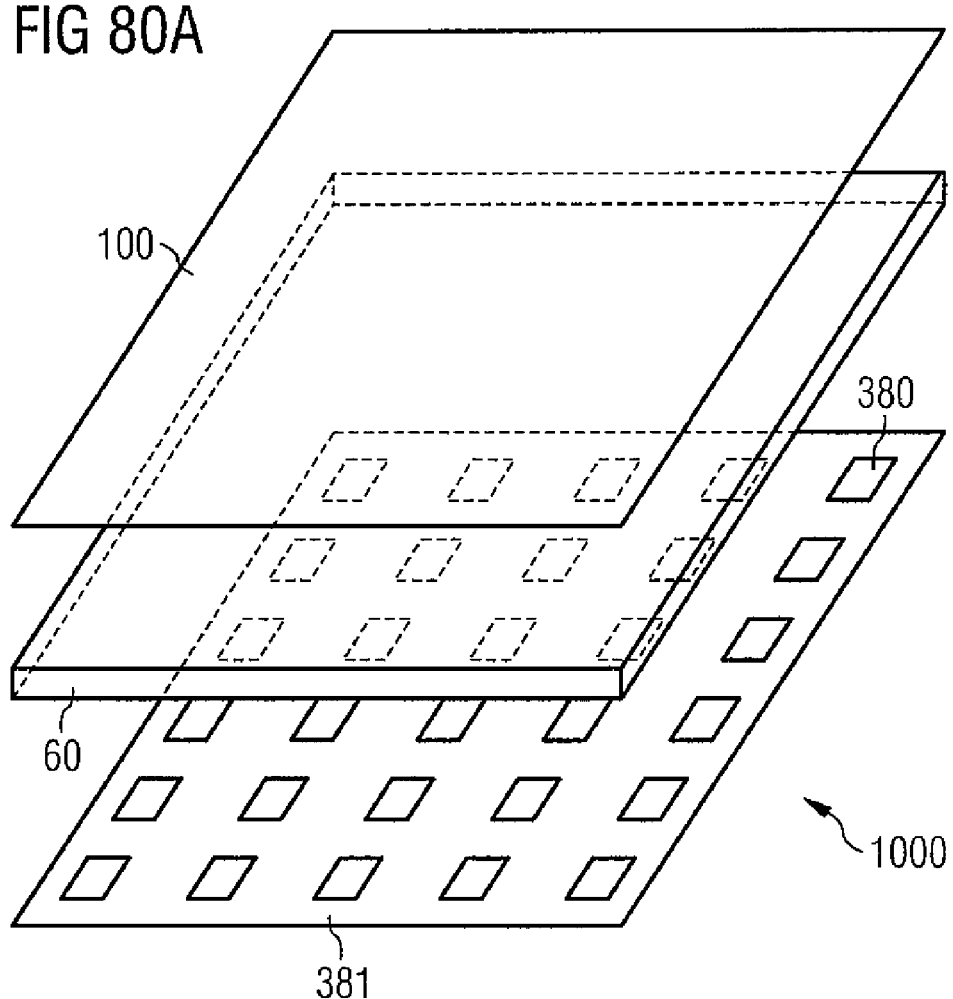
FIG. 80A shows a schematic perspective illustration of an illumination device in accordance with a further exemplary embodiment.
Figure 80B:
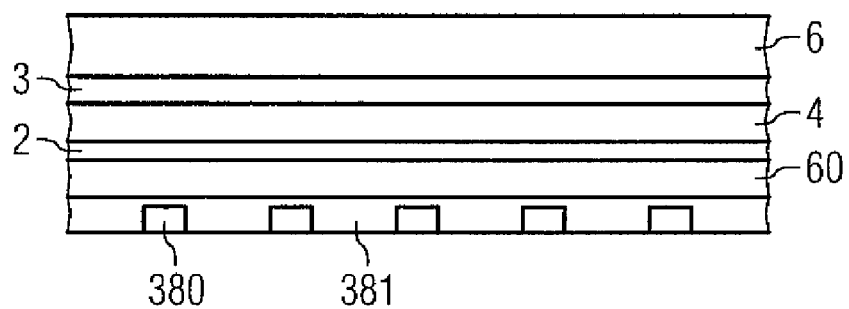
FIG. 80B shows a schematic sectional illustration of the illumination device in FIG. 80A.

FIG. 80A shows a schematic perspective illustration of an illumination device in accordance with a further exemplary embodiment. FIG. 80B shows a sectional illustration of the illumination device in FIG. 80A.

The illumination device in accordance with FIGS. 80A and 80B is likewise a color-variable illumination device 1000. The latter comprises a plurality of LEDs 380, mounted onto a carrier 381, as further, second light sources 370. The LEDs 380 emit light of a first color. Arranged above the LEDs is a milky glass pane as optical element 60, through which the light from the LEDs passes during the operation of the illumination device in such a way that the milky glass pane emits colored scattered light of the first color from its front side. Preferably, the milky glass pane scatters the light from the LEDs in such a way that an observer positioned in front of the glass pane perceives a uniform luminous surface.

The milky glass pane furthermore serves as a substrate 1 for a luminous means 100 which emits light of a further, second color, which is different from the first color, and is embodied as transmissive to visible light. The milky glass pane has an active region, to which is applied a first electrode, which is transmissive to visible light.

The organic layer stack 4, which is likewise embodied as transmissive to visible light, is applied to the first electrode 2. The organic layer stack 4 emits light of a second color, which is different from the first color. A second electrode 3, which is likewise transmissive to visible light, is applied on the organic layer stack 4. First and second electrodes 2, 3, which are transmissive to visible light, have been described for example with reference to FIG. 2A. A glass pane as encapsulation 6 is applied to the second electrode 3, for example by adhesive bonding. The glass pane serving as encapsulation 6 is embodied in clear fashion, in contrast to the glass pane serving as substrate 1.

An illumination device in accordance with FIGS. 80A and 80B can be used for example as floor lighting in bars or of dance floors. Furthermore, such color-variable illumination devices embodied as color-variable light tiles can also be used for medical purposes in light therapy.

FIG. 81 shows a further exemplary embodiment of an illumination device 1000, in the case of which at least one further light source is used alongside a luminous means 100. In the present case, the luminous means 100 is embodied in rigid and planar fashion. Two cold cathode lamps are arranged as second light sources 370 centrally within the front side of the luminous means. Such an element can be used as a ceiling element, for example.

Figure 82:
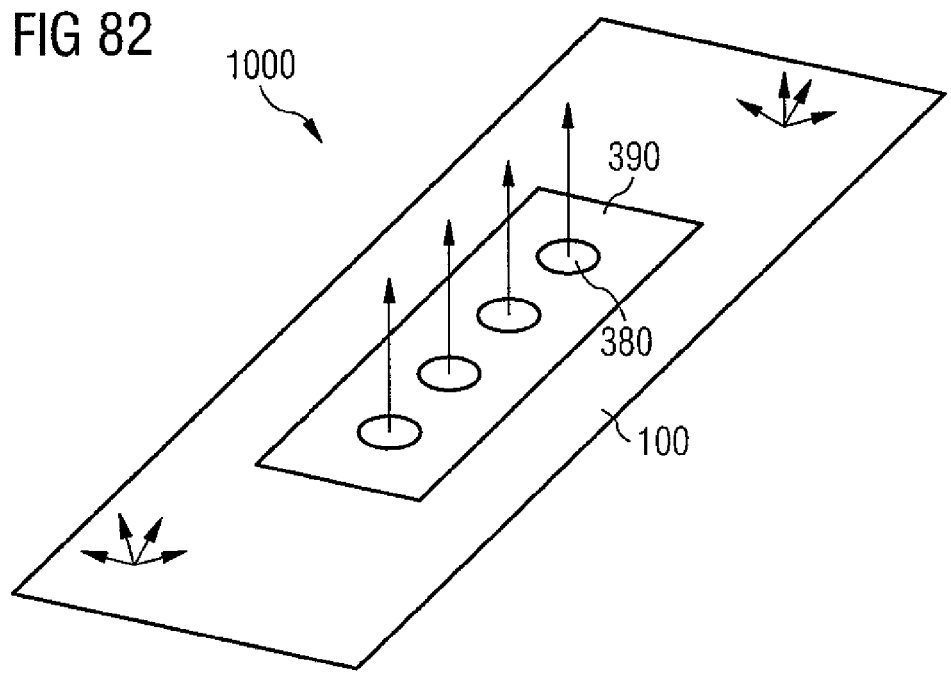
FIG. 82 shows a schematic perspective illustration of an illumination device comprising a luminous means and a second light source in accordance with a further exemplary embodiment.

FIG. 82 shows a further exemplary embodiment of an illumination device 1000 comprising a luminous means and a second light source. In the present case, the luminous means 100 is embodied in rigid fashion like the luminous means in accordance with FIG. 81. An LED module 390 is arranged centrally in the front side of the luminous means, said LED module comprising a carrier element, on which four light-emitting diodes 380 are arranged. Advantageously, in the case of the illumination device 1000, point light sources—namely the LEDs of the LED module 390—are combined with a planar light source—the luminous means 100. In this way, the user of the illumination device 1000 can choose between different operating states and combine them with one another.

Figure 83:
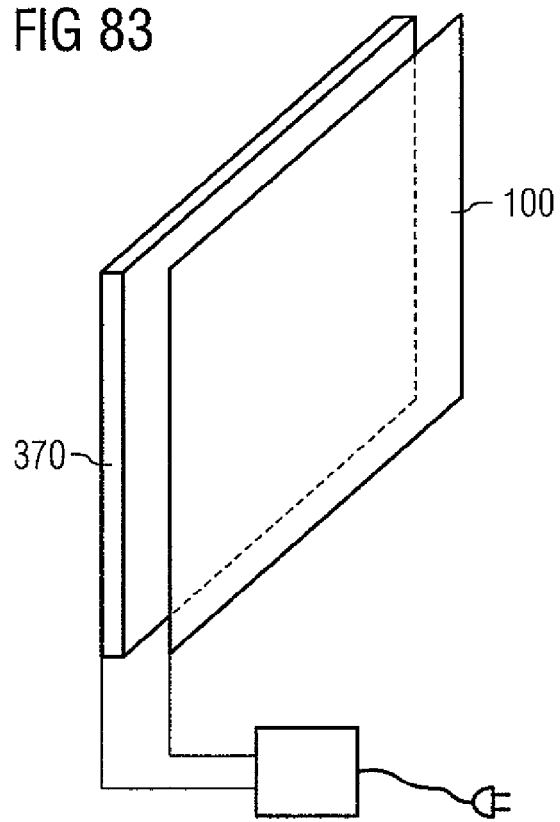
FIG. 83 shows a schematic perspective illustration of an illumination device comprising a luminous means and a second light source in accordance with one exemplary embodiment.

FIG. 83 shows a schematic perspective illustration of an illumination device 1000 comprising a luminous means 100 and a second luminous source. In the present case, the luminous means 100 is embodied as transmissive to visible light and emits light of a first color. An organic light-emitting diode, which emits light of a second color, is used as the second light source 370. The organic light-emitting diode has a radiation-emitting front side, on which the luminous means is arranged. During the operation of the illumination device, the light from the organic light-emitting diode penetrates through the luminous means 100, such that the illumination device 1000 emits mixed-color light comprising light from the luminous means and light from the second light source. In the present case, the luminous means 100 and the organic light-emitting diode are controlled by a common controller 11.

Figure 84A:
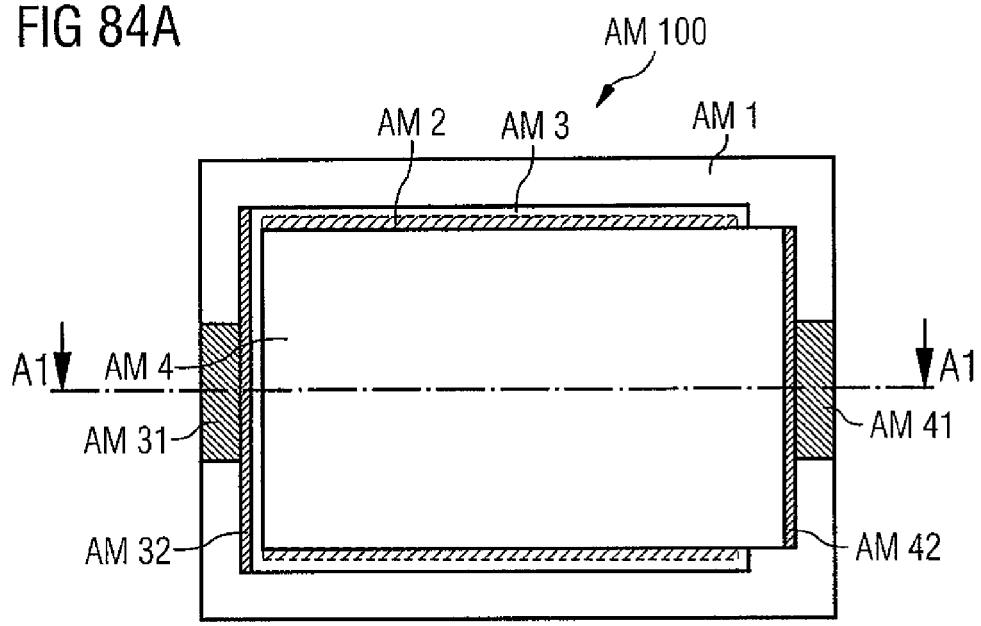
FIGS. 84A to 84C shows schematic illustrations of a storage element and storage furniture in accordance with one exemplary embodiment.
Figure 84B:
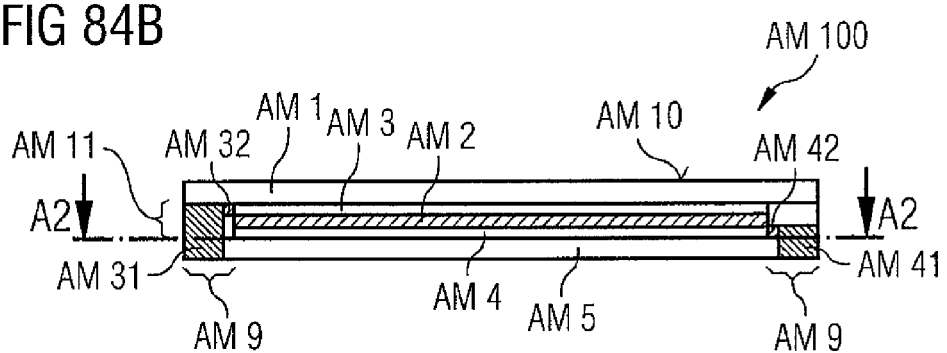
Figure 84C:
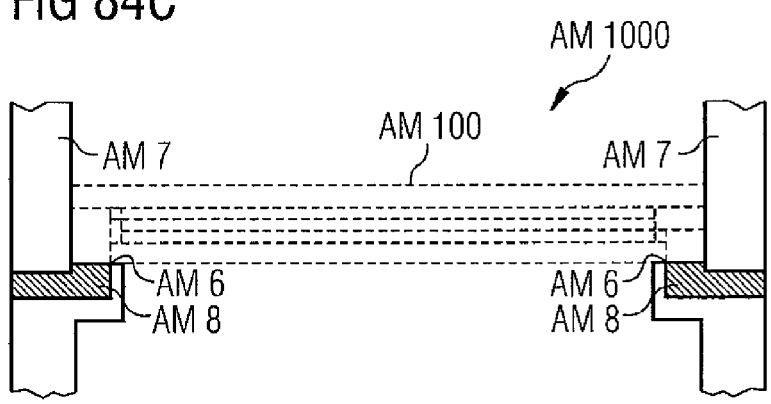

FIGS. 84A and 84B show an exemplary embodiment of a storage element AM100 and FIG. 84C shows an exemplary embodiment of storage furniture AM1000 comprising the storage element AM100. In this case, FIGS. 84A and 84B show two schematic sectional illustrations of the storage element AM100. In this case, the illustration in FIG. 84A is a sectional illustration of the storage element AM100 along the sectional plane A2 in FIG. 84B, as seen from the side having the layer AM5, while the illustration in FIG. 84B is a sectional illustration of the storage element AM100 along the sectional plane A1 in FIG. 84A. FIG. 84C shows a schematic sectional illustration of the storage furniture AM1000, wherein the sectional plane shown in the illustration corresponds to that sectional plane in FIG. 84B. For the sake of a better overview, the arrangement of the storage element AM100 in the storage furniture AM1000 is identified by the dashed region in FIG. 84C. The following description relates equally to all the FIGS. 84A to 84C.

In accordance with the exemplary embodiment shown, the storage element AM100 of the storage furniture AM1000 can have a substrate AM1, on which a radiation-emitting component embodied as an organic light-emitting diode (OLED) AM11 is applied. The radiation-emitting component can also be, in particular, a luminous means according to at least one of the exemplary embodiments described here.

On the side lying opposite the OLED AM11, the substrate has a storage surface AM10. For this purpose, it is particularly advantageous if the substrate AM1 has a sufficient thickness and strength, such that the storage element AM100 has a sufficient stability and strength when articles are arranged on the storage surface AM10. For this purpose, it may additionally be advantageous if the substrate AM1 furthermore comprises supporting structures that can be used to achieve an increase in the stability and strength.

The OLED AM11 has a first electrode AM3 on the substrate AM1. A layer sequence AM2 comprising at least one organic layer can be formed on the first electrode AM3, wherein the layer sequence AM2 has an active region suitable for emitting electromagnetic radiation by means of electroluminescence during operation. A second electrode AM4 is applied above the layer sequence AM2. By way of example, in this case the first electrode AM3 can be embodied as an anode and the second electrode AM4 as a cathode. A further layer AM5 can be applied above the second electrode, which further layer can serve as encapsulation of the OLED AM11, for example. In particular, the substrate AM1 and the layer AM5 can ensure protection of the OLED AM11 against damaging influences from outside such as, for instance, moisture or oxygen or mechanical impairments. As an alternative, in the case of this and also in the case of the following exemplary embodiments, the radiation-emitting component can be embodied as an inorganic electroluminescent film.

The substrate AM1 and the first electrode AM3 can preferably be embodied in transparent fashion, such that the electromagnetic radiation generated by the active region of the layer sequence AM2 can be emitted via the storage surface AM10. For this purpose, the substrate AM1 can preferably comprise glass or be composed of glass. As an alternative or in addition, the substrate AM10 can comprise a transparent plastic or be composed of transparent plastic or comprise or be a layer sequence or a laminate composed of glass and/or transparent plastic layers. The transparency of the substrate AM1 and of the first electrode AM3 enables articles placed on the storage surface AM10 to be illuminated from below, that is to say from the storage surface AM10.

As an alternative or in addition, the second electrode AM4 and the layer AM5 can also be embodied in transparent fashion, such that that side of the layer AM5 which is remote from the OLED AM11 can be embodied as an exit surface for the electromagnetic radiation. As a result, it can be possible, for example, for articles which are arranged below the storage element AM100 to be illuminated from above, for example articles which are situated on a further storage element arranged below this storage element AM100. In this case, as shown in the exemplary embodiment, the first electrode AM3 and the second electrode AM4 can be embodied in planar fashion, such that a large-area emission of the electromagnetic radiation can be made possible. For this purpose, the layer AM5 can preferably comprise glass and/or transparent plastic or be composed of glass or transparent plastic and can furthermore also be embodied as a laminate or layer sequence comprising glass and/or transparent plastic layers.

Furthermore, the storage element AM100 has electrical contacts AM31, AM41, which can be electrically conductively connected respectively to the first and second electrodes AM3, AM4 respectively by means of electrical lines AM32, AM42. Furthermore, the regions AM9 can be embodied as holding elements in the form of bearing surfaces which, as shown here, comprise the electrical contacts AM31, AM41.

The storage furniture AM1000 furthermore has holding apparatuses AM7, which can have holding parts AM6 embodied as backing surfaces. The holding parts AM6, together with the holding elements AM9 of the storage element AM100, said holding elements being embodied as bearing surfaces, for example, can enable a mountability of the storage element AM100 at the holding apparatus AM7. In this case, the holding apparatus AM7 can be embodied for example as cupboard or shelving walls, supporting posts, or struts, or as parts thereof, which have suitable holding parts AM6. In particular, the holding parts AM6 can comprise electrical lead contacts AM8, which are electrically conductively connected to the electrical contacts AM31, AM41 of the storage element AM100. The electrically conductive connection between the electrical contacts AM31, AM41 and the electrical lead contacts AM8 can be made possible for example by the mechanical contact of the electrical contacts AM31, AM41—embodied as plane surfaces in each case—and electrical lead contacts AM8. As an alternative or in addition, the electrical contacts AM31, AM41 and/or the electrical lead contacts AM8 can be embodied for example as spring elements or plug connections in order to enable an improved electrically conductive connection. The storage element AM10 and the holding apparatuses AM7 can additionally have still further holding elements and holding parts, respectively, such as, for instance, screw connections or clamps (not shown), for example, in order to ensure an increased stability of the storage furniture AM1000.

By means of the electrical lead contacts AM8 integrated into the holding parts AM6, the first electrical contacts AM31, AM41 can be connected to a current and/or voltage supply. Further electronic or electrotechnical elements for the start-up and control of the OLED AM11 can be integrated in the holding apparatuses 7, for example.

By means of the integration of the OLED AM11 into the storage element AM100 by means of the arrangement of the OLED AM11 between the substrate AM11, which simultaneously has the storage surface AM10, and the layer AM5, it is thus possible to realize storage furniture AM1000 comprising a storage element AM100 which, in conjunction with a compact design, enables a large-area emission surface via the storage surface AM10 and/or via that side of the layer AM5 which lies opposite the OLED.

As an alternative or in addition, the OLED AM11 can comprise further layers such as, for instance, a suitable carrier substrate. As a result, it can be possible, for example, that the OLED AM11 with the first and second electrodes AM3, AM4 and the layer sequence AM2 is applied on the carrier substrate and can be arranged together with the carrier substrate on the substrate AM1.

As an alternative, the layer AM5 can also comprise a carrier substrate, to which the OLED is applied.

Figure 85:
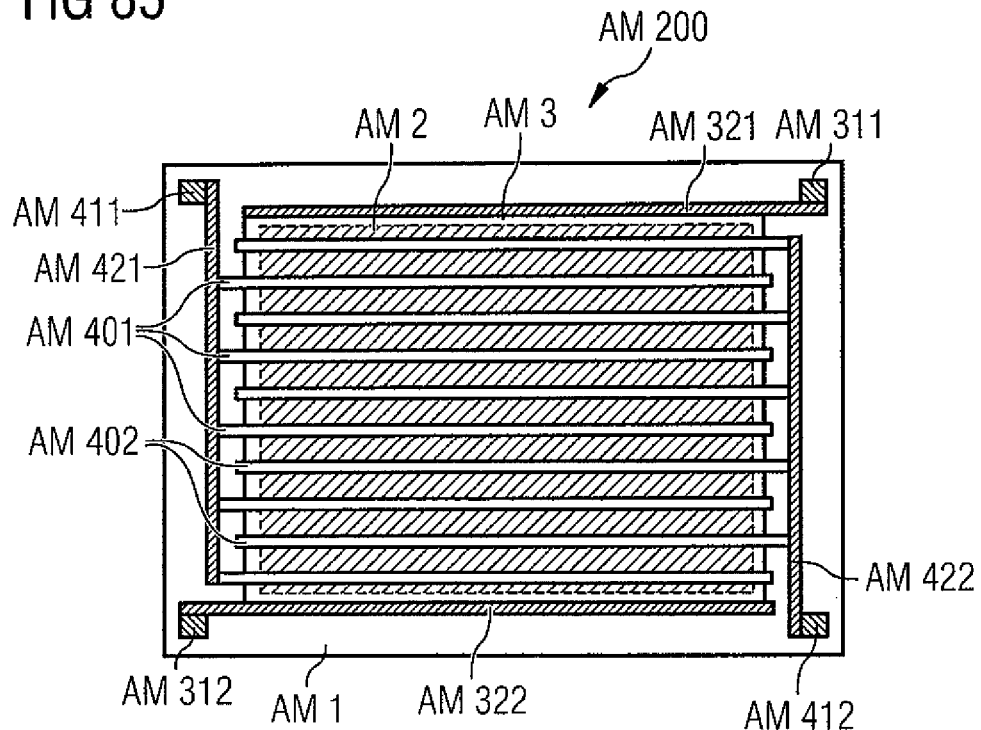
FIG. 85 shows a schematic illustration of a storage element in accordance with a further exemplary embodiment.

The exemplary embodiment of a storage element AM200 as shown in FIG. 85 represents a modification of the exemplary embodiment in accordance with the preceding figures and shows an organic light-emitting component in the storage element AM200 comprising a first electrode AM3 embodied in planar fashion with two electrical contacts AM311, AM312, which are electrically conductively connected to the first electrode AM3 by means of electrical lines AM321, AM322. Furthermore, the second electrode is structured as parallel strips AM401, AM402 arranged alternately above the active layer sequence AM2, wherein the parallel strips AM401 are electrically conductively connected to the electrical contact AM411 by means of the electrical line AM421 and the parallel strips AM402 are connected to the electrical contact AM412 by means of the electrical line AM422. The second electrode can thus have partial regions AM401 and AM402 with which contact can be made independently of one another. In particular, it can thereby be made possible that the regions of the active region of the layer sequence AM2 of the OLED AM11 which are respectively arranged between the partial regions AM401, AM402 of the second electrode and of the first electrode AM3 can emit electromagnetic radiation independently of one another. In this case, by way of example, the active region of the OLED AM11 can also be structured, such that that partial region of the OLED AM11 which is arranged between the partial region AM401 of the second electrode and the first electrode AM3 can emit an electromagnetic radiation having a first spectrum and that partial region of the OLED which is arranged between the partial region AM402 of the second electrode AM4 and the first electrode AM3 can emit an electromagnetic radiation having a second spectrum, wherein the first and the second spectrum can be different. By applying a current and/or a voltage between at least one of the electrical contacts AM311, AM312 and in each case one of the electrical contacts AM411 and AM412 or both, three different operating states with different luminous impressions can thus be made possible for an observer. By way of example, the first spectrum can have one or a plurality of wavelengths in the blue spectral range and the second spectrum can have one or a plurality of wavelengths in the yellow or orange spectral range, such that by means of the three operating states for example a blue, a yellow or orange and also, upon superimposition of the blue with the yellow or orange luminous impression, a white-colored luminous impression can be made possible for an observer.

As an alternative, the first electrode can also be structured while the second electrode can be embodied in planar fashion, or both electrodes are shaped as large-area electrode surfaces. In particular, an electrode can have any desired and suitable structuring, for example also in the form of pictograms, in order to enable not only the luminous impression but also a pictorial impression for an observer.

Particularly preferably, the storage element AM200 has holding elements (not shown) comprising the electrical contacts AM311, AM312, AM411, AM412. Such holding elements can be for example bearing surfaces, openings, holes and parts of screw, plug, or clamping connections. A suitable holding apparatus can then have corresponding holding parts which, in particular, can also advantageously have electrical lead contacts.

Figure 86:
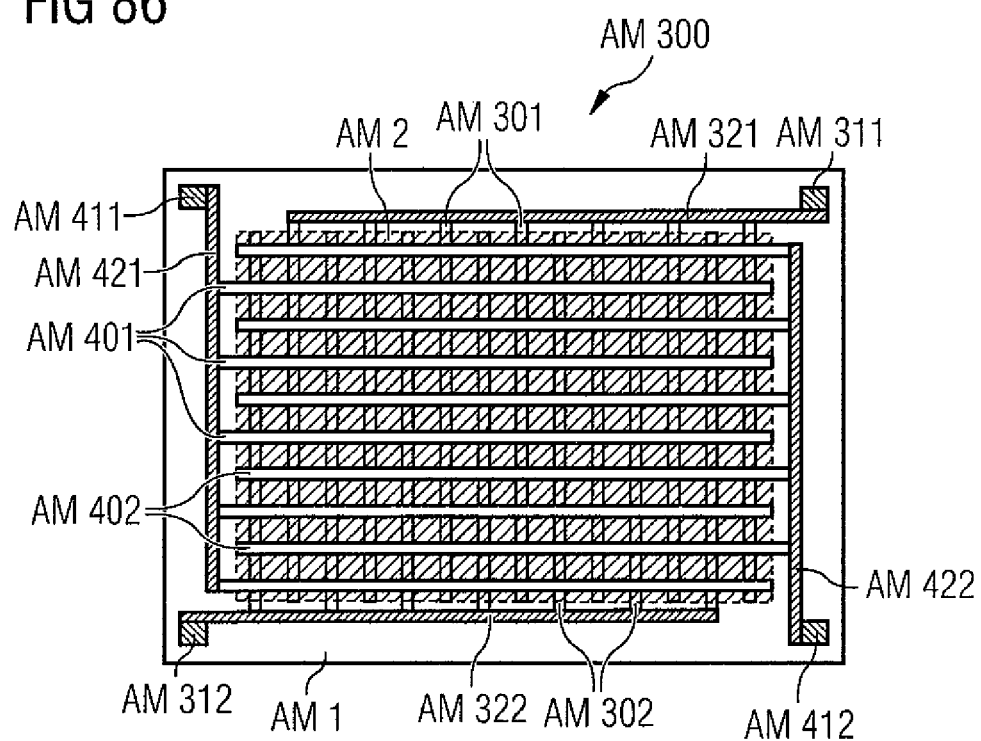
FIG. 86 shows a schematic illustration of a storage element in accordance with a further exemplary embodiment.

The exemplary embodiment of a storage element AM300 as shown in FIG. 86 shows as further modification with respect to the preceding exemplary embodiments for a storage element not only the second electrode structured into partial regions AM401, AM402 comprising parallel strips but also the first electrode structured into partial regions AM301, AM302 comprising parallel strips. In this case, the partial regions AM301, AM302 can respectively be electrically conductively connected to electrical contacts AM311, AM312 by means of electrical lines AM321, AM322. In this case, the first electrode can have parallel strips AM301, AM302, which are for example perpendicular to the parallel strips AM401, AM402 of the second electrode. The OLED can thus have for example pixel-like partial regions which are given by parallel-connected crossover points of the electrode partial regions AM301, AM302 and AM401, AM402. In particular, in the case of this exemplary embodiment, the layer sequence AM2 or at least the active region of the layer sequence AM2 of the OLED can be structured such that, by applying a current and/or a voltage between one or both partial regions AM301, AM302 of the first electrode and one or both partial regions AM401, AM402 of the second electrode, by means of different emission spectra and the mixed spectra thereof, different operating states with different luminous impressions can be realized for an observer. By way of example, by applying a voltage and/or a current respectively between the electrical contacts AM311 and AM411, AM312 and AM411, AM311 and AM412 and AM312 and AM412, a checkered luminous impression can respectively be made possible for an observer, whereas by applying a voltage and/or current between the electrical contacts AM311 and AM312 and one of the electrical contacts AM411 and AM412 and between one of the electrical contacts AM311 or AM312 and the electrical contacts AM411 and AM412, an observer can be given in each case a luminous impression of pixel-like partial regions arranged in a line-like manner. By applying a voltage and/or a current between all the contacts of the first and second electrodes, a planar luminous impression can be made possible for an observer.

Furthermore, by way of example, a diffuser plate can also be disposed downstream of the organic radiation-emitting component in the beam path of the emitted electromagnetic radiation, such that a more homogeneous and more planar luminous impression of the different operating states described above can be made possible for an observer.

In particular the form, the size and the distance between the structured partial regions of the first and second electrodes in each case can be chosen in accordance with the desired luminous impression and is shown purely by way of example in the exemplary embodiments above.

Figure 87:
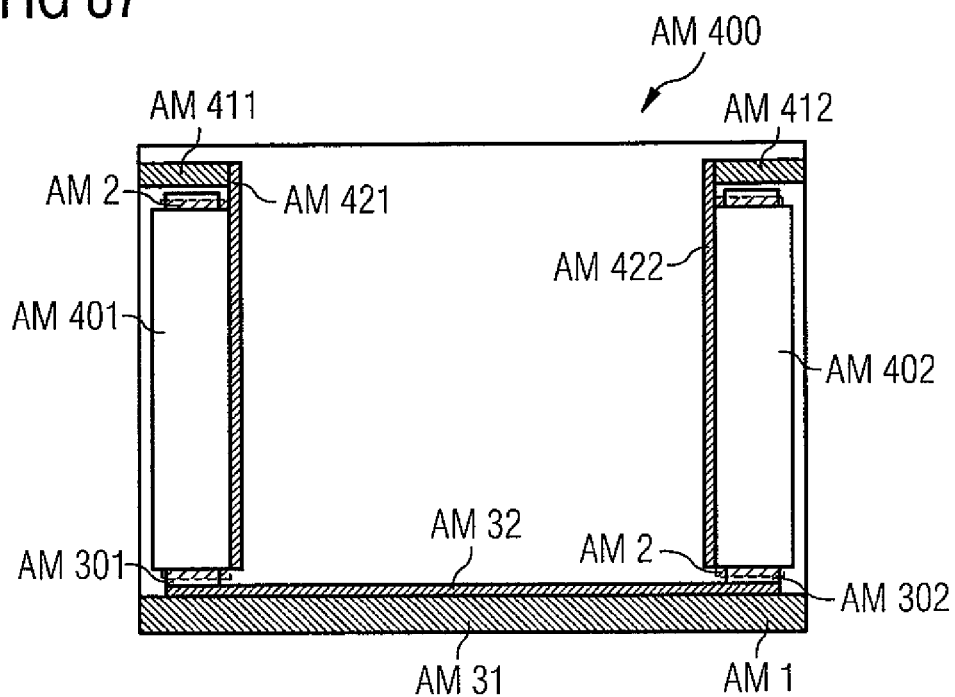
FIG. 87 shows a schematic illustration of a storage element in accordance with a further exemplary embodiment.

The exemplary embodiment of a storage element AM400 in accordance with FIG. 87 shows for example a plan view of the storage element comprising an organic radiation-emitting component comprising first electrodes AM301, AM302 and second electrodes AM401, AM402 and a layer sequence AM2 having an active region, which are arranged only in edge regions of the substrate AM1. As a result, by way of example, articles which are arranged on the storage surface AM10 and/or below the storage element AM400 can be illuminated from the side. In particular, an emission surface for this purpose can additionally have optical structures by means of which the electromagnetic radiation can preferably be emitted into the spatial region between the partial regions AM301, AM401 and AM302, AM402 of the first and second electrodes.

The exemplary embodiments of a structuring of the first and/or of the second electrode which are shown in the preceding figures, in particular those in FIGS. 85 to 87, should be understood to be purely by way of example and non-limiting. In particular, the first and/or the second electrode can comprise more than two partial regions AM301, AM302 and/or AM401, AM402, respectively, and accordingly also more than two electrical contacts AM311, AM312 and/or AM411, AM412, respectively. In particular, the form and arrangement of the electrical contacts and/or of the holding elements can also deviate from the forms and arrangements shown.

Figure 88:
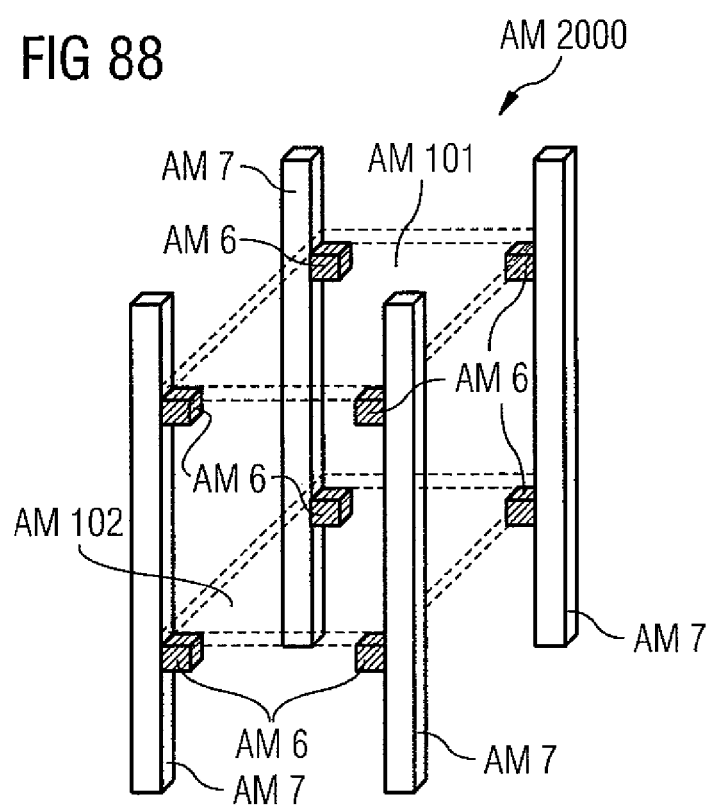
FIG. 88 shows a schematic illustration of storage furniture in accordance with a further exemplary embodiment.

FIG. 88 shows an exemplary embodiment of storage furniture AM2000 comprising storage elements AM101, AM102. In this case, for the sake of an overview, the storage elements AM101, AM102 are only indicated by the dashed regions and can be embodied for example in accordance with one of the preceding exemplary embodiments.

The storage furniture AM2000 has four holding apparatuses AM7 embodied as vertical posts or struts. Furthermore, in further exemplary embodiments of the invention, the holding apparatuses AM7 can also be parts of furniture walls. The holding apparatuses AM7 can have holding parts AM6 suitable for mounting the storage elements AM101, AM102 onto the holding apparatuses AM7. In this regard, the storage elements AM101, AM102 can have holding elements suitable for this purpose (not shown in FIG. 88). Furthermore, it can be advantageous if the holding parts AM6 comprise electrical lead contacts (not shown in FIG. 88) which enable electrical contact to be made with the organic radiation-emitting components of the storage elements AM101, AM102 by means of the electrical contacts AM311, AM312, AM411, AM412 thereof (not shown in FIG. 88).

The exemplary embodiments illustrated in FIGS. 89A to 89E show, in a plan view, examples of the number and arrangement of electrical contacts and/or holding elements on storage elements AM101 and of electrical lead contacts and/or holding parts in holding apparatuses AM7 for storage furniture. In this case, the arrows identify the type of arrangement of the storage elements AM101 in the holding apparatuses AM7, which, for the sake of clarity, are illustrated as spatially separated from one another. By way of example, the arrows can represent the fact that the storage element is pushed into the relevant holding apparatus, in which case, if appropriate, a fixed mounting can then additionally be effected. In this case, the reference symbols AM51 to AM55 can identify both electrical contacts, holding elements and also holding elements which comprise electrical contacts. Likewise, the reference symbols AM711 to AM715 can identify both electrical leads, holding parts and also holding parts which comprise electrical leads. Furthermore, sizes, distances, positions and number of the electrical contacts and/or holding elements AM51 to AM55 and of the electrical lead contacts and/or holding parts AM711 to AM715 are shown purely by way of example.

A holding apparatus AM7 can be for example one or a plurality of furniture walls, a frame, vertical or horizontal struts, wall-mountable struts, wall-mountable holding frames, or parts thereof, which can be suitable for holding a storage element AM101 in such a way that the storage surface of the storage element AM101 is substantially parallel to a floor on which the holding apparatus AM7 can be installed, or substantially perpendicular to a wall at which the holding apparatus can be fitted or mounted.

Figure 89A:
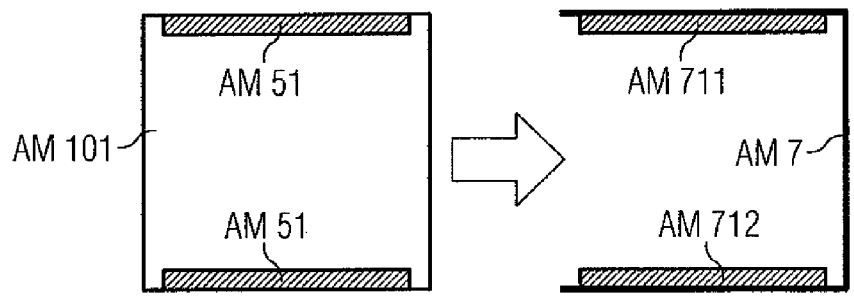
FIGS. 89A to 89E shows schematic illustrations of storage furniture in accordance with further exemplary embodiments.
Figure 89B:
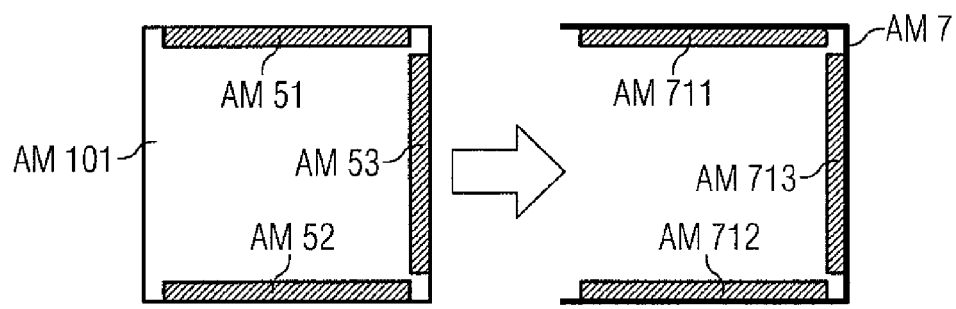
Figure 89C:
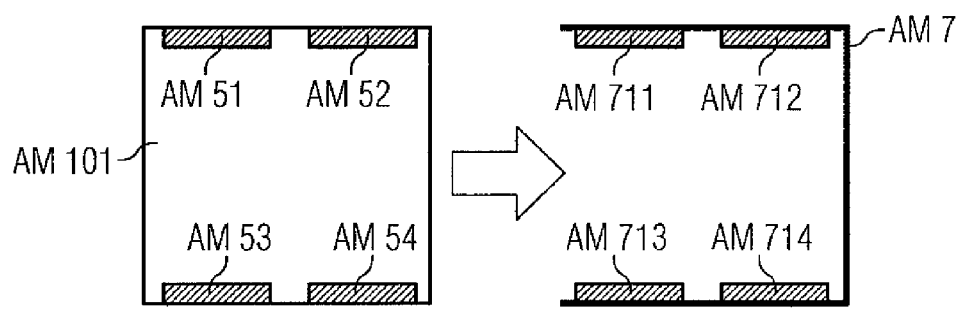
Figure 89D:
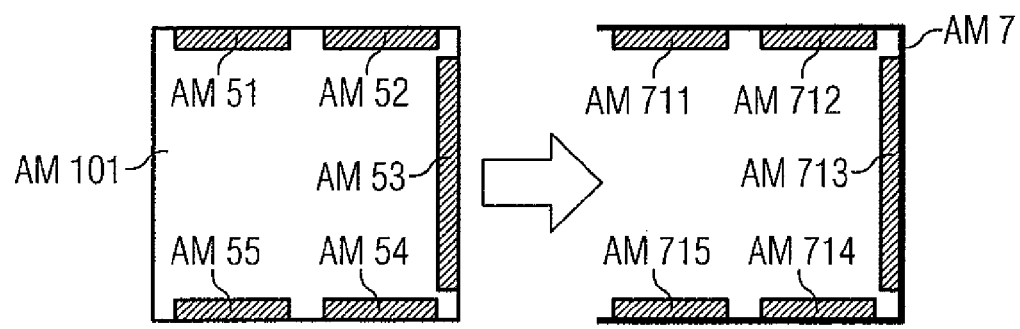
Figure 89E:
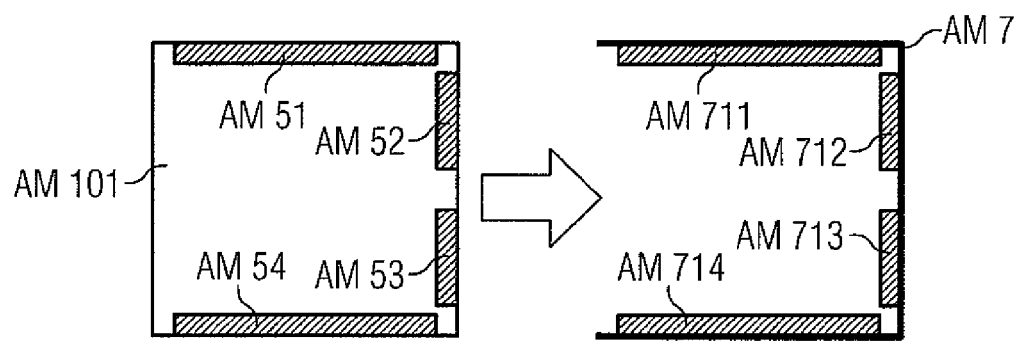

By way of example, holding elements AM51, AM52 and/or holding parts AM711, AM712 can be embodied as rails or parts of a rail system, as shown in FIG. 89A. Furthermore, as shown in FIG. 89B, by way of example, a further holding element AM53 can be embodied as a bearing surface and a further holding part AM713 can be embodied as a backing surface. If the holding elements AM51, AM52, AM53 comprise electrical contacts and the holding parts AM711, AM712, AM713 comprise electrical lead contacts, the exemplary embodiment shown can be suitable for example for a storage element AM400 in accordance with FIG. 87. The further exemplary embodiments in accordance with FIGS. 89C to 89E show further possibilities comprising at least four holding elements/electrical contacts and/or at least four holding parts/electrical lead contacts.

In particular, it is possible for some holding parts and/or holding elements to have electrical contacts and/or electrical lead contacts, respectively, and for others not to have them.

The invention is not restricted by the description on the basis of the exemplary embodiments. Rather, the invention encompasses any new feature and also any combination of features, but in particular comprises any combination of features in the patent claims, even if these features or this combination itself is not explicitly specified in the patent claims or exemplary embodiments.

This patent application claims the priorities of the following German patent application: DE102006046293.9, DE102006060781.3, DE102006046198.3 and DE102006054584.2. The disclosure content of these priority applications is hereby incorporated by reference.

The invention claimed is:

1. An illumination device comprising:
a first light source, which emits light of a first color; and
a second light source, which emits light of a second color, which is different from the first color;
wherein at least one of the two light sources is dimmable;
wherein the first light source is provided by a luminous means comprising:
a substrate having a first main surface, to which a first electrode is applied,
a second electrode, and
an organic layer stack within an active region of the substrate between the first and the second electrode, the organic layer stack comprising at least one organic layer configured to generate light; and
wherein the luminous means and the second light source are arranged with respect to one another such that light from the second light source passes through the luminous means.

2. The illumination device as claimed in claim 1, wherein one of said first and second color lies in a yellow spectral range and the other color lies in a blue spectral range.

3. The illumination device as claimed in claim 1, wherein one of said first and second color lies in a warm white region of a CIE standard chromaticity diagram and the other color lies in a cold white region of the CIE standard chromaticity diagram.

4. The illumination device as claimed in claim 1, wherein the luminous means is dimmable.

5. The illumination device as claimed in claim 1, wherein the second light source is dimmable.

6. The illumination device as claimed in claim 1, wherein the second light source is formed by at least one of the following elements: an incandescent lamp, at least one individual light-emitting diode, a light-emitting diode module, a cold cathode lamp, a fluorescent lamp, a lava lamp and an organic light-emitting diode.

7. The illumination device as claimed in claim 1, wherein the luminous means is flexible and transmissive to visible light.

8. The illumination device as claimed in claim 1, wherein the luminous means comprises a lampshade.

9. The illumination device as claimed in claim 1, wherein mixed-colored light comprising light from the luminous means and light from the second light source is emitted during operation of the illumination device.

10. An illumination device comprising:
a first luminous means and a second luminous means which are electrically and mechanically connected to one another, each of said first and second luminous means comprising:

a substrate having a first main surface, to which a first electrode is applied, a second electrode, and an organic layer stack within an active region of the substrate between the first and the second electrode, the organic layer stack comprising at least one organic layer configured to generate light, wherein the first luminous means includes at least one connection location which comprises a connection pin arranged at a side surface of the substrate of the first luminous means, and wherein the connection pin engages into a connection location of the second luminous means which comprises a cutout in a side surface of the second luminous means.

11. The illumination device as claimed in claim 10, wherein the first and the second luminous means are mechanically connected to one another by a cylindrical interference fit via the connection locations.

12. The illumination device as claimed in claim 10, wherein the first and the second luminous means are mechanically connected to one another by a press fit by means of the connection locations.

13. The illumination device as claimed in claim 10, wherein the first and the second luminous means are mechanically connected to one another by a plug connection by means of the connection locations.

14. The illumination device as claimed in claim 10, comprising:

a carrier by which the first and second luminous means of the illumination device are at least one of mechanically and electrically connected to one another.

15. The illumination device as claimed in claim 14, wherein the carrier comprises one of a carrier plate, a carrier grid, a cable system and a rod system.

* * * * *